United States Patent
Muto et al.

(10) Patent No.: US 9,997,620 B2
(45) Date of Patent: *Jun. 12, 2018

(54) SEMICONDUCTOR DEVICE AND AN ELECTRONIC DEVICE

(71) Applicant: Renesas Electronics Corporation, Koutou-ku, Tokyo (JP)

(72) Inventors: Akira Muto, Kanagawa (JP); Nobuya Koike, Kanagawa (JP); Masaki Kotsuji, Kanagawa (JP); Yukihiro Narita, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/621,651

(22) Filed: Jun. 13, 2017

(65) Prior Publication Data

US 2017/0287818 A1 Oct. 5, 2017

Related U.S. Application Data

(63) Continuation of application No. 14/287,085, filed on May 26, 2014, now Pat. No. 9,704,979.

(30) Foreign Application Priority Data

Jun. 14, 2013 (JP) ................................. 2013-125288

(51) Int. Cl.
*H01L 29/739* (2006.01)
*H01L 29/78* (2006.01)
(Continued)

(52) U.S. Cl.
CPC .... *H01L 29/7393* (2013.01); *H01L 23/49537* (2013.01); *H01L 23/49551* (2013.01);
(Continued)

(58) Field of Classification Search
None
See application file for complete search history.

(56) References Cited

U.S. PATENT DOCUMENTS 8,138,600 B2   3/2012   Muto et al.
8,232,629 B2   7/2012   Koike et al.
(Continued)

FOREIGN PATENT DOCUMENTS

EP   2765600 A1   8/2014
JP   2002-033445 A   1/2002
(Continued)

OTHER PUBLICATIONS

English translation of JP 2009-033445 A, obtained from European Patent Office (EPO) dated Feb. 28, 2017.
(Continued)

*Primary Examiner* — Tom Thomas
*Assistant Examiner* — Nilufa Rahim
(74) *Attorney, Agent, or Firm* — Shapiro, Gabor and Rosenberger, PLLC

(57) ABSTRACT

A semiconductor device and an electronic device are improved in performances by supporting a large current. An emitter terminal protrudes from a first side of a sealing body, and signal terminals protrude from a second sides of the sealing body. Namely, the side of the sealing body from which the emitter terminal protrudes and the side of the sealing body from which the signal terminals protrude are different. More particularly, the signal terminals protrude from the side of the sealing body opposite the side thereof from which the emitter terminal protrudes. Further, a second semiconductor chip including a diode formed therein is mounted over a first surface of a chip mounting portion in
(Continued)

such a manner as to be situated between the emitter terminal and the a first semiconductor chip including an IGBT formed therein in plan view.

16 Claims, 35 Drawing Sheets

(51) Int. Cl.
*H01L 23/495* (2006.01)
*H01L 23/00* (2006.01)
*H01L 23/538* (2006.01)
*H01L 29/66* (2006.01)
*H01L 21/48* (2006.01)
*H01L 23/552* (2006.01)

(52) U.S. Cl.
CPC ...... *H01L 23/49575* (2013.01); *H01L 23/538* (2013.01); *H01L 24/36* (2013.01); *H01L 24/40* (2013.01); *H01L 29/66348* (2013.01); *H01L 29/7397* (2013.01); *H01L 29/7805* (2013.01); *H01L 29/7813* (2013.01); *H01L 21/4842* (2013.01); *H01L 23/49541* (2013.01); *H01L 23/49562* (2013.01); *H01L 23/552* (2013.01); *H01L 2224/32245* (2013.01); *H01L 2224/37011* (2013.01); *H01L 2224/40095* (2013.01); *H01L 2224/40137* (2013.01); *H01L 2224/40139* (2013.01); *H01L 2224/40245* (2013.01); *H01L 2924/12036* (2013.01); *H01L 2924/12041* (2013.01); *H01L 2924/12042* (2013.01); *H01L 2924/1305* (2013.01); *H01L 2924/13055* (2013.01); *H01L 2924/13091* (2013.01); *H01L 2924/181* (2013.01)

(56) References Cited

U.S. PATENT DOCUMENTS

| 8,624,379 B2 | 1/2014 | Nakamura et al. |
| 8,970,020 B2 | 3/2015 | Okumura |
| 2004/0169262 A1 | 9/2004 | Oliver et al. |
| 2007/0215999 A1 | 9/2007 | Kashimoto et al. |
| 2008/0012045 A1* | 1/2008 | Muto ................ H01L 21/565 257/177 |
| 2010/0013085 A1 | 1/2010 | Oi et al. |
| 2011/0089558 A1 | 4/2011 | Muto et al. |
| 2011/0215400 A1* | 9/2011 | Nakamura ........... H01L 29/66 257/334 |
| 2012/0075816 A1 | 3/2012 | Mashimo et al. |

FOREIGN PATENT DOCUMENTS

| JP | 2003-046058 A | 2/2003 |
| JP | 2006-108256 A | 4/2006 |
| JP | 2008-021796 A | 1/2008 |
| JP | 2008-060256 A | 3/2008 |
| JP | 2009-071064 A | 4/2009 |
| JP | 2009-206140 A | 9/2009 |
| JP | 2010-192930 A | 9/2010 |
| JP | 2011-086889 A | 4/2011 |
| JP | 2013-074264 A | 4/2013 |

OTHER PUBLICATIONS

Extended European Search Report, dated Apr. 10, 2015, in European Patent Application No. 14170897.4.
Office Action, dated Dec. 20, 2016, in Japanese Application No. 2013-125288.

* cited by examiner

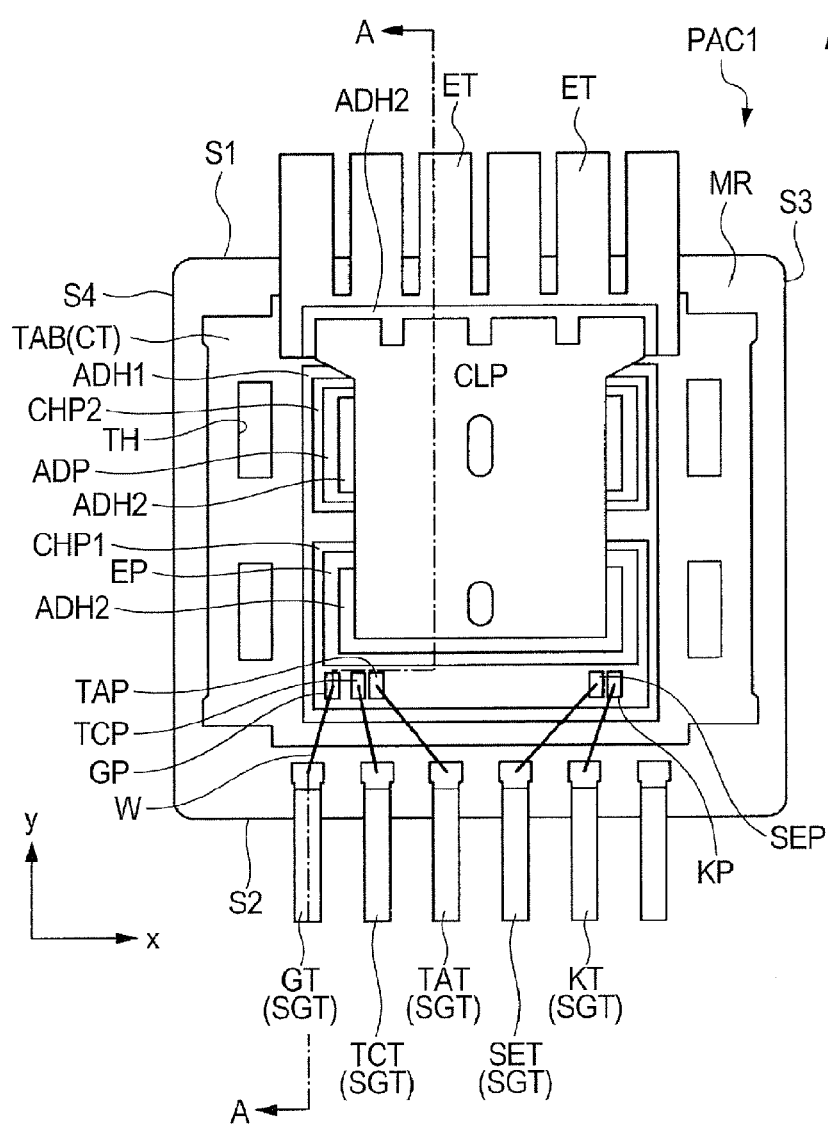
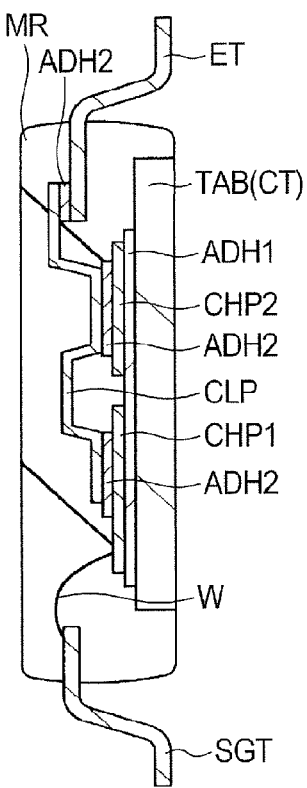
FIG. 13A
FIG. 13B

FIG. 15A
FIG. 15B
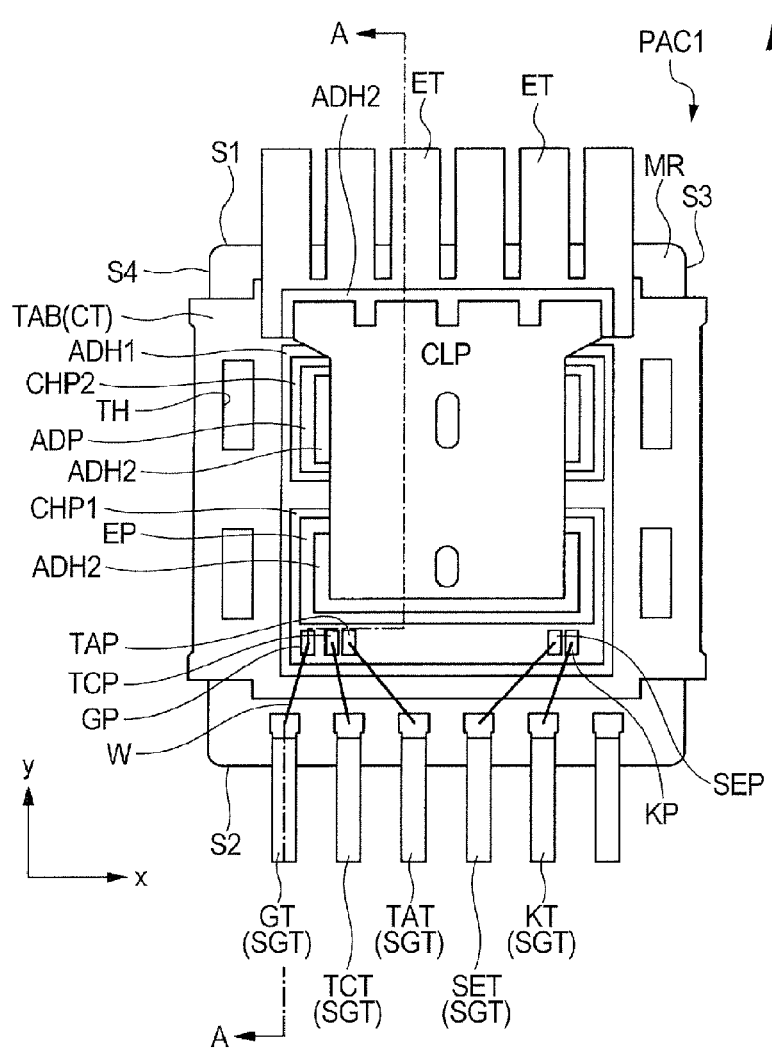
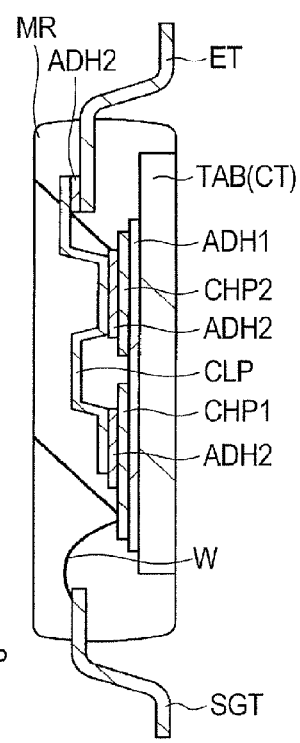

FIG. 20A
FIG. 20B
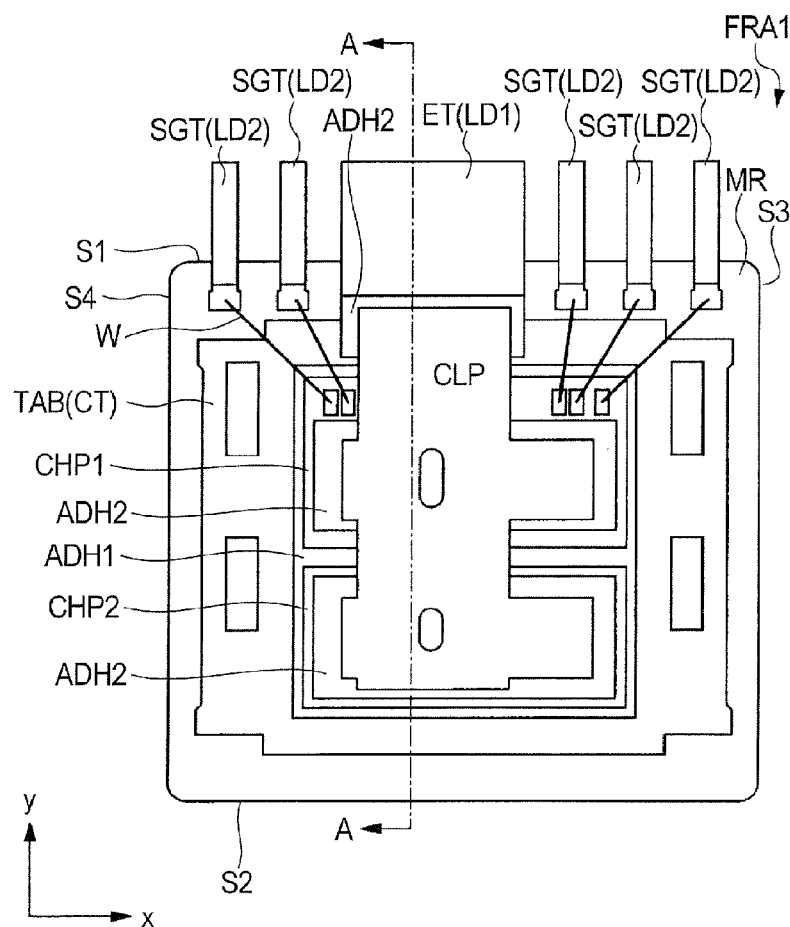
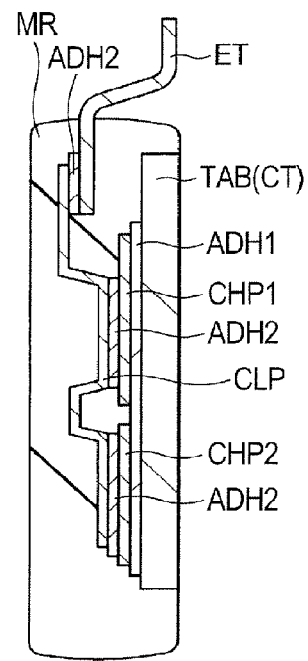

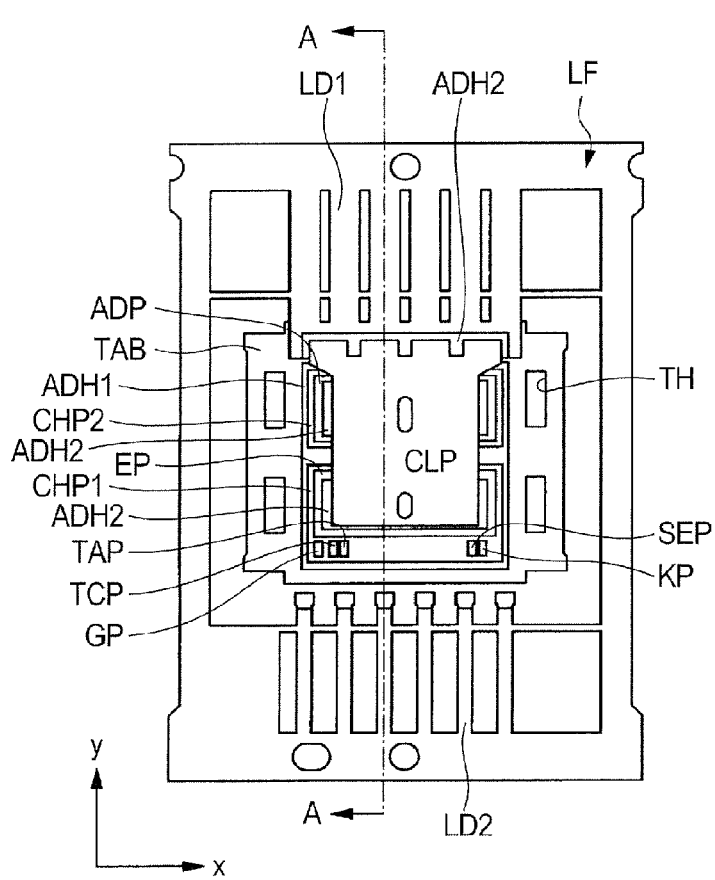
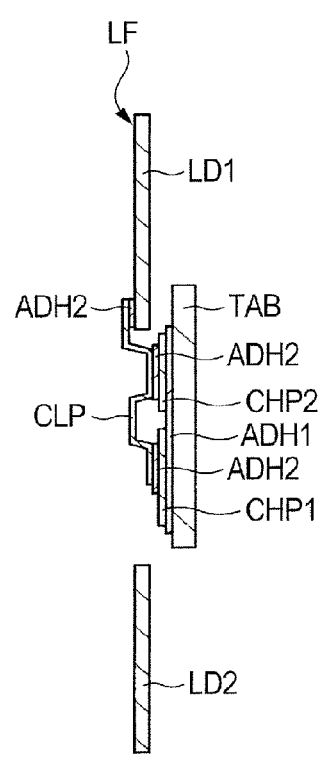
FIG. 25A
FIG. 25B

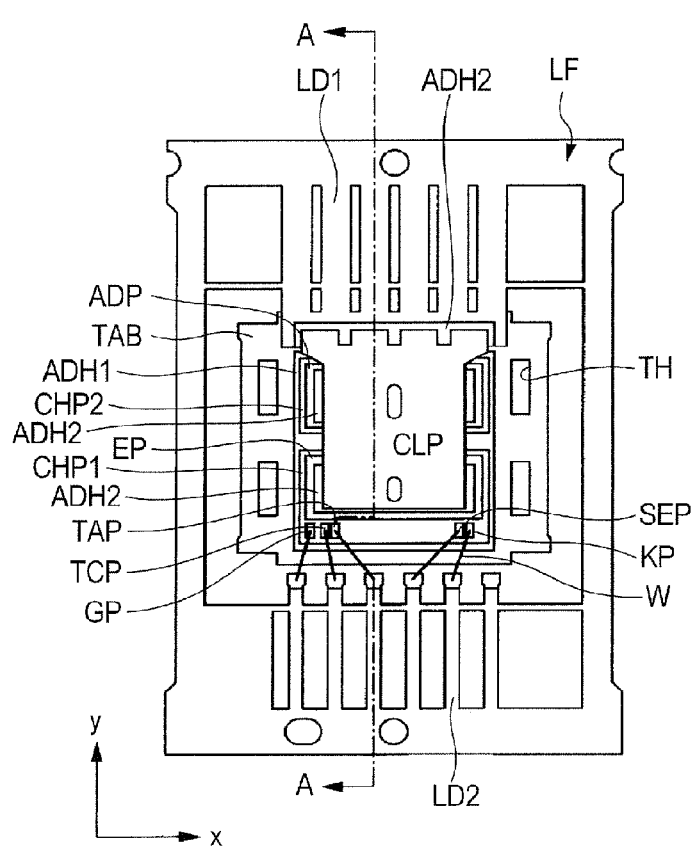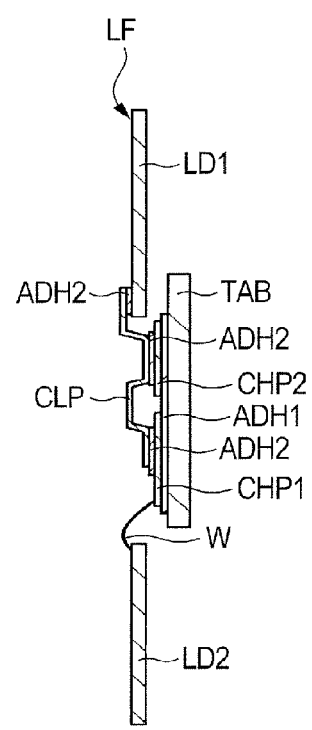

FIG. 27A
FIG. 27B
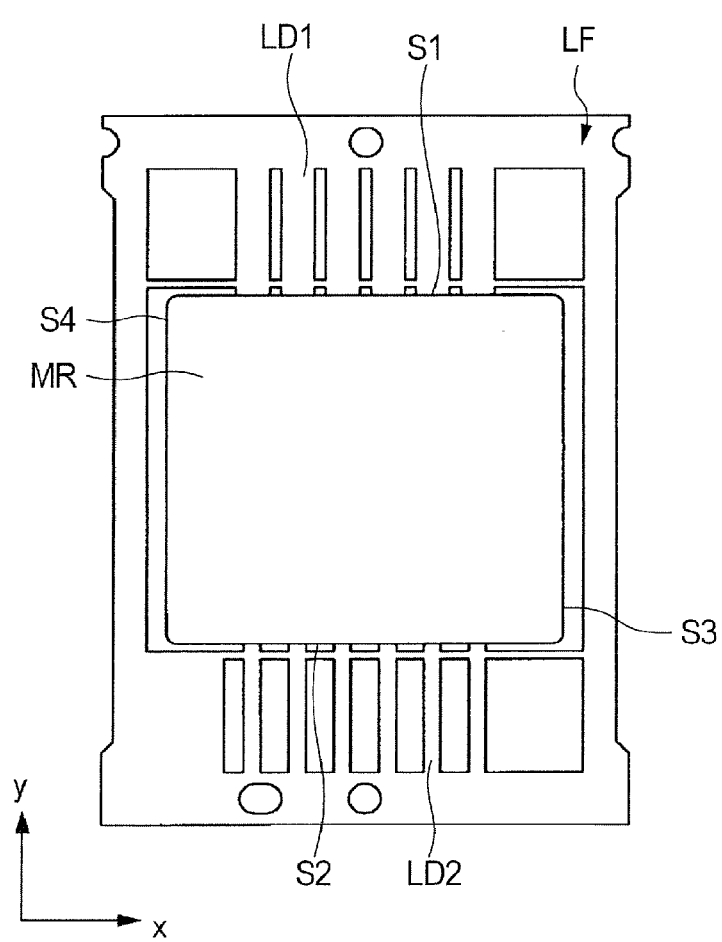
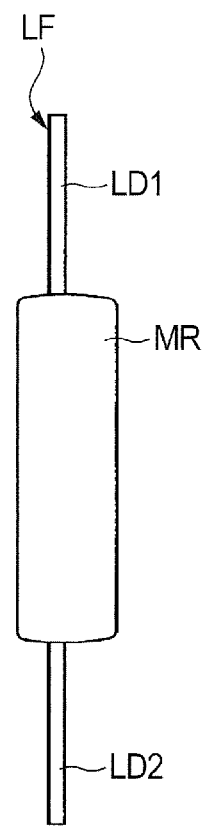

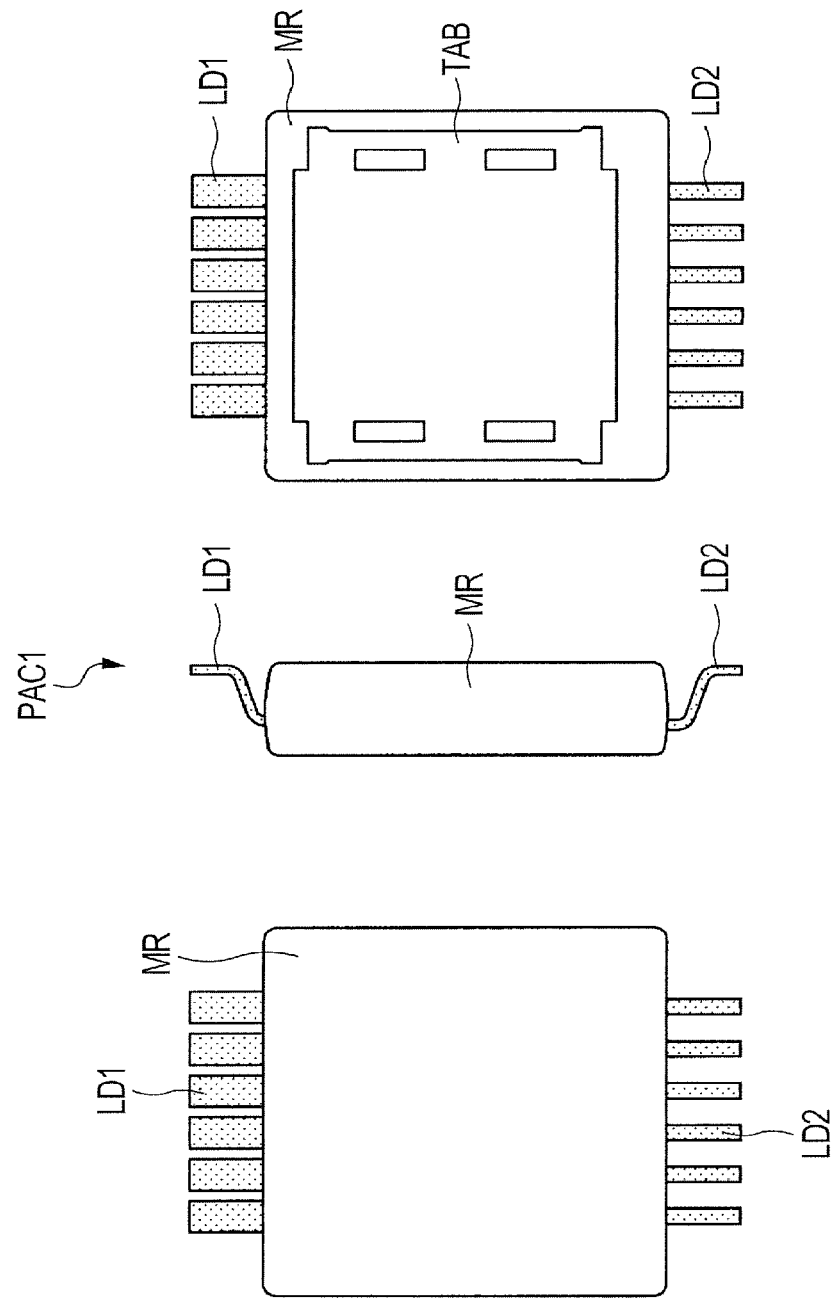

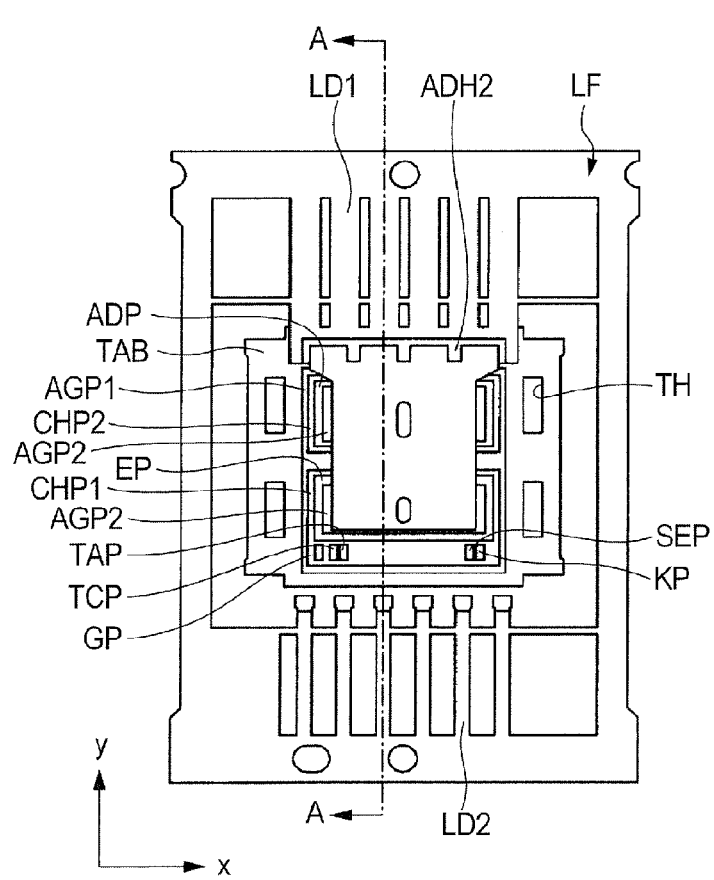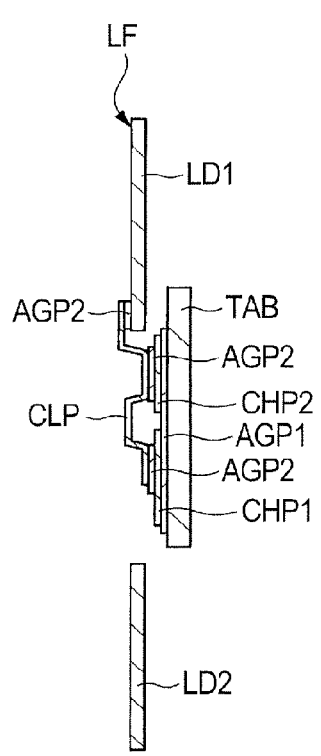
FIG. 31A
FIG. 31B

SEMICONDUCTOR DEVICE AND AN ELECTRONIC DEVICE

CROSS-REFERENCE TO RELATED APPLICATIONS

The disclosure of Japanese Patent Application No. 2013-125288 filed on Jun. 14, 2013 including the specification, drawings and abstract is incorporated herein by reference in its entirety.

BACKGROUND

The present invention relates to a semiconductor device and an electronic device, and relates to, for example, technology effectively applicable to a semiconductor device and an electronic device each functioning as a constituent element of an inverter.

Japanese. Unexamined Patent Publication No. 2008-60256 (Patent Document 1) describes a semiconductor device in which outputting pins protrude from one side of a sealing body, and control pins protrude from a side of the sealing body opposite the one side thereof.

Japanese Unexamined Patent Publication No. 2008-21796 (Patent Document 2) describes a semiconductor device including a first semiconductor chip including an Insulated Gate Bipolar Transistor (which will be hereinafter referred to as an IGBT) formed therein, and a second semiconductor chip including a diode formed therein.

Japanese Unexamined Patent Publication No. 2011-86889 (Patent Document 3) describes a composite package including a plurality of single packages in each of which a first semiconductor chip including an IGBT formed therein and a second semiconductor chip including a diode formed therein are sealed by the same sealing body.

PATENT DOCUMENTS

[Patent Document 1] Japanese Unexamined Patent Publication No. 2008-60256
[Patent Document 2] Japanese Unexamined Patent Publication No. 2008-21796
[Patent Document 3] Japanese Unexamined Patent Publication No. 2011-86889

SUMMARY

A motor is mounted in, for example, an electric car or a hybrid car. As one example of the motor, there is a three-phase induction motor. The three-phase induction motor is controlled by an inverter circuit (electronic device) for converting a DC power into an AC power. In recent years, the inverter circuit has been desired to support a large current, and thereby to be improved in performances. For example, the inverter circuit includes a semiconductor device including an IGBT and a diode as a constituent element. For this reason, the semiconductor device has been also desired to support a large current, and thereby to be improved in performances.

Other objects and novel features will be apparent from the description of this specification and the accompanying drawings.

In a semiconductor device in accordance with one embodiment, a second semiconductor chip including a diode formed therein is arranged in such a manner as to be situated between a first lead and a first semiconductor chip including an IGBT formed therein, and the first semiconductor chip is arranged in such a manner as to be situated between the second semiconductor chip and a plurality of second leads.

Further, an electronic device in one embodiment has the semiconductor device mounted over the main surface of a wiring board. In this case, in a first direction, the first lead protrudes from a first side surface of a sealing body, and is electrically coupled with a first wire of the wiring board. Then, in the first direction, second leads protrude from a second side surface of the sealing body, and are electrically coupled with second wires of the wiring board. Further, the second surface of the chip mounting portion is electrically coupled with a third wire extending in a second direction orthogonal to the first direction of the wiring board.

In accordance with one embodiment, a semiconductor device and an electronic device can be improved in performances by supporting a large current.

BRIEF DESCRIPTION OF THE DRAWINGS

FIGS. 13A and 13B are views each showing the internal structure of a sealing body of the semiconductor device in First Embodiment, wherein FIG. 13A is a plan view, and FIG. 13B is a cross sectional view along line A-A of FIG. 13A;

FIGS. 15A and 15B are views each showing the internal structure of a sealing body of the semiconductor device in Modified Example 1, wherein FIG. 15A is a plan view, and FIG. 15B is a cross sectional view along line A-A;

FIGS. 17A and 17B are views each showing the internal structure of the semiconductor device in Modified Example 2, wherein FIG. 17A is a plan view, and FIG. 17B is a cross sectional view along line A-A of FIG. 17A;

FIGS. 18A and 18B are views each showing the configuration of an electronic device in First Embodiment, wherein FIG. 18A is a plan view showing the configuration of the electronic device, and FIG. 18B is a side view as seen from the bottom side of the paper plane of FIG. 18A;

FIGS. 19A and 19B are views each showing a finished product in which the electronic device is mounted in a resin case, wherein FIG. 19A is a plan view showing the configuration of the finished product, and FIG. 19B is a side view as seen from the bottom side of the paper plane of FIG. 19A;

FIG. 20A is a plan view showing the internal configuration of a sealing body in a semiconductor device in Related Art 1, and FIG. 20B is a cross sectional view cut along line A-A of FIG. 20A;

FIGS. 24A and 24B are views each showing the semiconductor device during a manufacturing step in First Embodiment, wherein FIG. 24A is a plan view, and FIG. 24B is a cross sectional view;

FIGS. 25A and 25B are views each showing the semiconductor device during a manufacturing step following FIGS. 24A and 24B, respectively, wherein FIG. 25A is a plan view, and FIG. 25B is a cross sectional view;

FIGS. 26A and 26B are views each showing the semiconductor device during a manufacturing step following FIGS. 25A and 25B, respectively, wherein FIG. 26A is a plan view, and FIG. 25B is a cross sectional view;

FIGS. 27A and 27B are views each showing the semiconductor device during a manufacturing step following FIGS. 26A and 26B, respectively, wherein FIG. 27A is a plan view, and FIG. 27B is a side view;

FIGS. 28A and 28B are views each showing the semiconductor device during a manufacturing step following FIGS. 27A and 27B, respectively, wherein FIG. 28A is a plan view, and FIG. 28B is a side view;

FIG. 29 is a view showing the outside configuration of the semiconductor device in First Embodiment;

FIGS. 30A and 30B are views each showing a manufacturing step of a semiconductor device in Modified Example, wherein FIG. 30A is a plan view, and FIG. 30B is a cross sectional view;

FIGS. 31A and 31B are views each showing the semiconductor device during a manufacturing step following FIGS. 30A and 30B, respectively, wherein FIG. 31A is a plan view, and FIG. 31B is a cross sectional view;

DETAILED DESCRIPTION

In the following embodiment, the embodiment may be described in a plurality of divided sections or embodiments for convenience, if required. However, unless otherwise specified, these are not independent of each other, but are in a relation such that one is a modified example, details, complementary explanation, or the like of a part or the whole of the other.

Further, in the following embodiments, when a reference is made to the number of elements, and the like (including number, numerical value, quantity, range, or the like), the number of elements is not limited to a specific number, but may be greater than or less than the specific number, unless otherwise specified, and except for the case where the number is apparently limited to the specific number in principle, and other cases.

Further, in the following embodiments, it is needless to say that the constitutional elements (including element steps, or the like) are not always essential, unless otherwise specified, except for the case where they are apparently considered essential in principle, and other cases.

Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and ranges.

Whereas, in all the drawings for describing the embodiments, the same members are given the same reference signs and numerals, and a repeated description thereon is omitted. Incidentally, for ease of understanding of the drawings, hatching may be provided even in a plan view.

First Embodiment

An inverter circuit is a circuit for converting a DC power into an AC power. For example, when the plus and minus of a DC power supply are alternately outputted, the direction of the current is accordingly reversed. In this case, the direction of the current is alternately reversed. For this reason, the output can be considered as an AC power. This is the principle of the inverter circuit. Herein, the AC powers include various forms as represented by a single-phase AC power and a three-phase AC power. Thus, in the present First Embodiment, particularly, a three-phase inverter circuit for converting a DC power into a three-phase AC power will be taken as an example for description. However, the technical idea in the present First Embodiment is also widely applicable to, for example, a single-phase inverter circuit not limited to the case applied to a three-phase inverter circuit.

Configuration of Three-Phase Inverter Circuit

Figure 1:
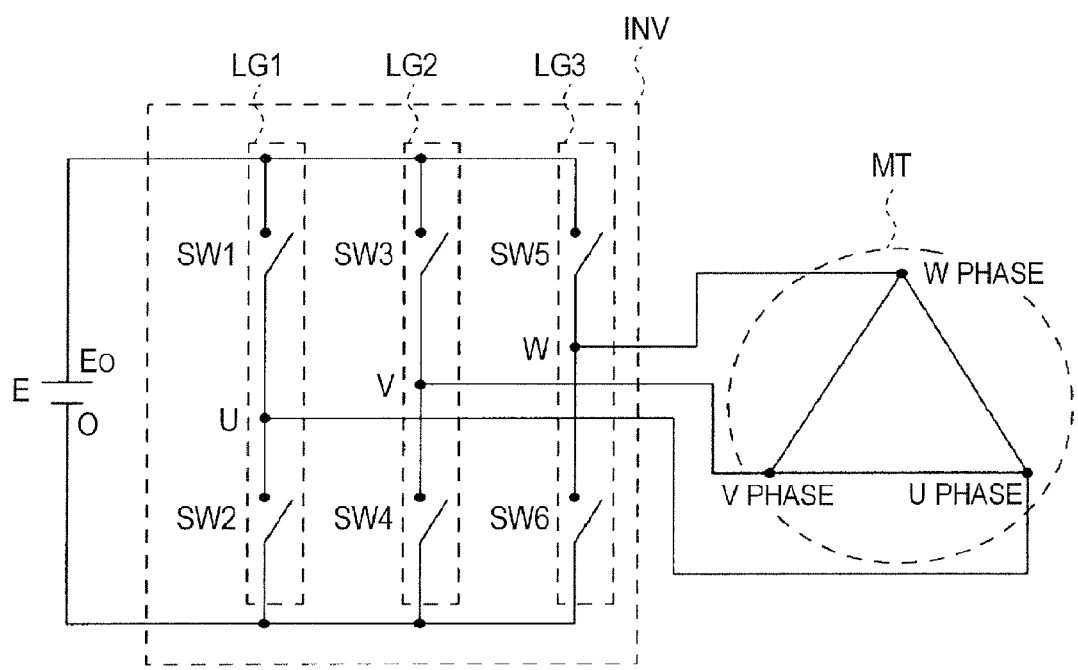
FIG. 1 is a circuit diagram in which a three-phase inverter circuit is arranged between a DC power supply and a three-phase induction motor.

FIG. 1 is a circuit diagram in which a three-phase inverter circuit INV is arranged between a DC power supply E and a three-phase induction motor MT. As shown in FIG. 1, in order to covert a power from a DC power supply E into a three-phase AC power, there is used the three-phase inverter circuit INV formed of 6 switches of switches SW1 to SW6. Specifically, as shown in FIG. 1, the three-phase inverter circuit INV has a first leg LG1 including the switch SW1 and the switch SW2 coupled in series to each other, a second leg LG2 including the switch SW3 and the switch SW4 coupled in series to each other, and a third leg LG3 including the switch SW5 and the switch SW6 coupled in series to each other. The first leg LG1 to the third leg LG3 are coupled in parallel. At this step, the switch SW1, the switch SW3, and the switch SW5 form an upper arm, and the switch SW2, the switch SW4, and the switch SW6 form a lower arm.

Then, the point U between the switch SW1 and the switch SW2 and the U phase of the three-phase induction motor MT are coupled. Similarly, the point V between the switch SW3 and the switch SW4 and the V phase of the three-phase induction motor MT are coupled; and the point W between the switch SW5 and the switch SW6 and the W phase of the three-phase induction motor MT are coupled. In this manner, the three-phase inverter circuit INV is formed.

Operation of Three-Phase Inverter Circuit

Figure 2:
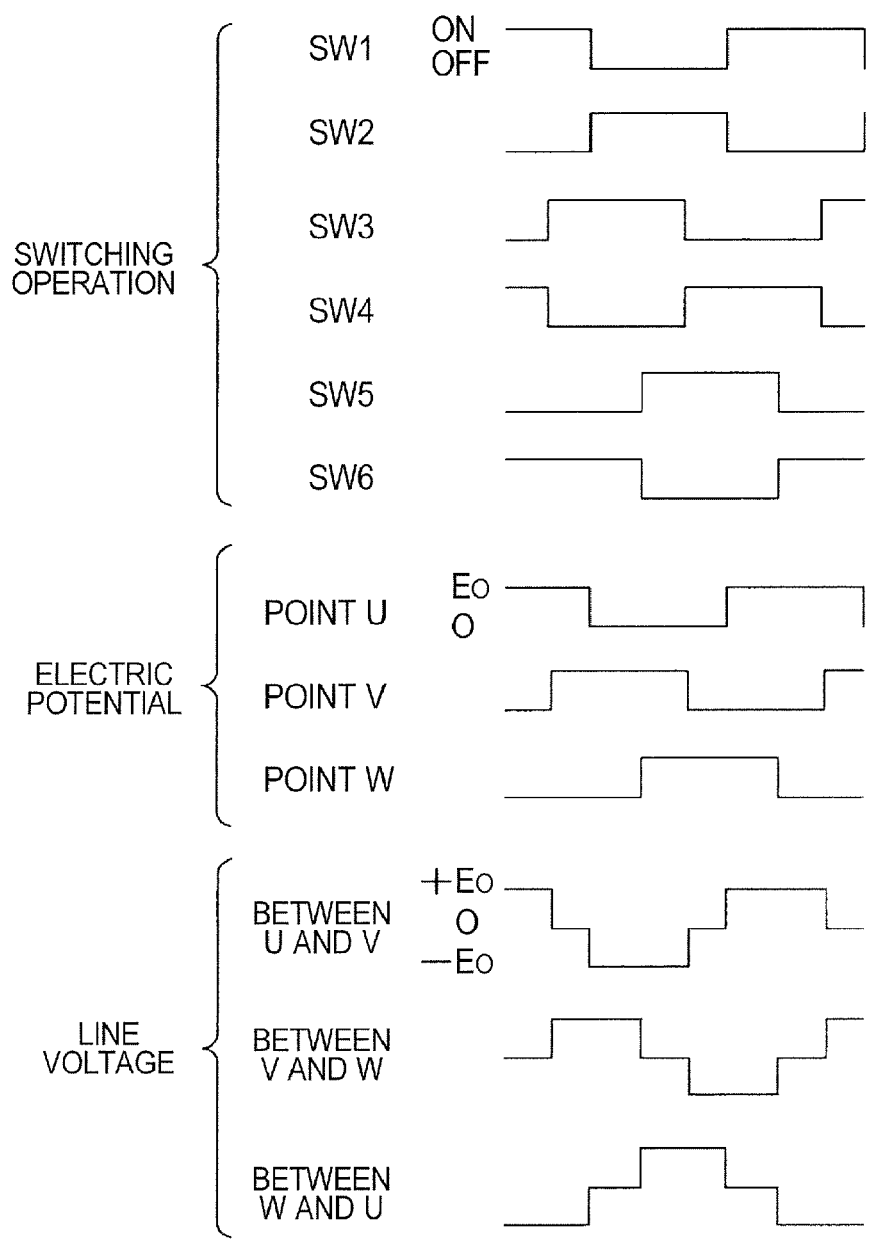
FIG. 2 is a timing chart for illustrating the operation of a three-phase inverter circuit.

Then, a description will be given to the operation of the three-phase inverter circuit INV having the foregoing configuration. FIG. 2 is a timing chart for illustrating the operation of the three-phase inverter circuit INV. In FIG. 2, the switching operations of the switch SW1 and the switch SW2 of the three-phase inverter circuit INV are performed in the following manner: for example, when the switch SW1 is in an ON state, the switch SW2 is in an OFF state; on the other hand, when the switch SW1 is in an OFF state, the switch SW2 is in an ON state. Similarly, the switching operations of the switch SW3 and the switch SW4 of the three-phase inverter circuit INV are performed in the following manner: when the switch SW3 is in an ON state, the switch SW4 is in an OFF state; on the other hand, when the switch SW3 is in an OFF state, the switch SW4 is in an ON state. Furthermore, the switching operations of the switch SW5 and the switch SW6 of the three-phase inverter circuit INV are performed in the following manner: when the switch SW5 is in an ON state, the switch SW6 is in an OFF state; on the other hand, when the switch SW5 is in an OFF state, the switch SW6 is in an ON state.

Then, as shown in FIG. 2, the switching operations of the three units of switch pairs are performed so as to create a phase difference of 120 degrees. At this step, respective electric potentials at the point U, the point V, and the point W change to 0 or $E_0$ according to the switching operations of three units of switch pairs. Then, for example, the line voltage between the U phase and the V phase is obtained by subtracting the electric potential of the V phase from the electric potential of the U phase, and changes to $+E_0$, 0, or $E_0$. On the other hand, the line voltage between the V phase and the W phase has a voltage waveform shifted in phase by 120 degrees with respect to the line voltage between the U phase and the V phase. Further, the line voltage between the W phase and the U has a voltage waveform shifted in phase by 120 degrees with respect to the line voltage between the V phase and the W phase. By thus allowing the switch SW1 to the switch SW6 to perform the switching operation, respective line voltages have stepped alternating voltage waveforms, and the alternating voltage waveforms of the mutual line voltage have a phase difference of 120 degrees. Therefore, with the three-phase inverter circuit INV, the DC power supplied from the DC power supply E can be converted into the three phase AC power.

Configuration Example of Actual Three-Phase Inverter Circuit

Figure 3:
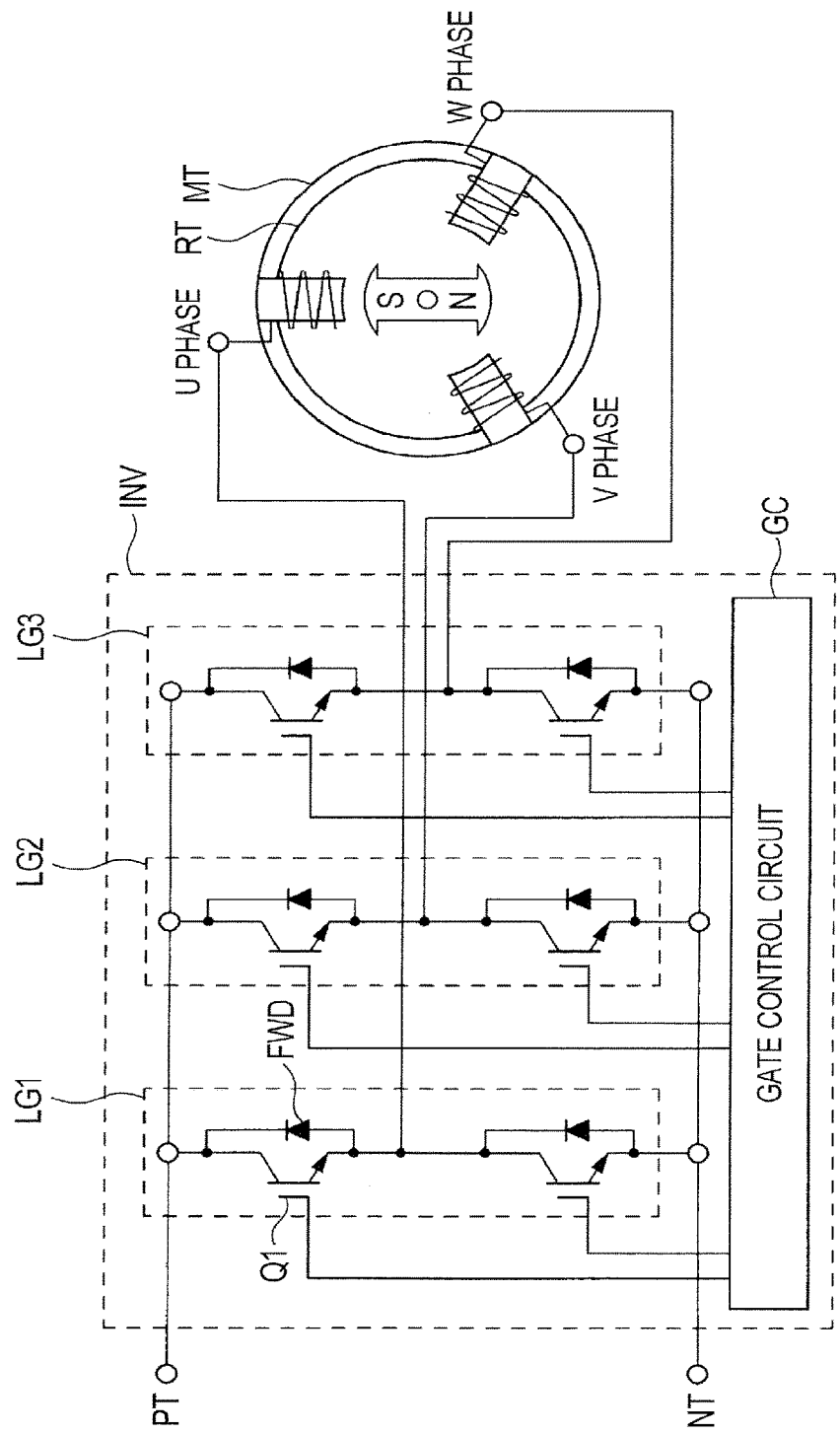
FIG. 3 is a circuit diagram showing a configuration of an inverter circuit and a motor circuit including a three-phase induction motor in First Embodiment.

The semiconductor device in the present First Embodiment is used in the driving circuit of a three-phase induction motor for use in, for example, an electric car or a hybrid car. Specifically, the driving circuit includes an inverter circuit. The inverter circuit has a function of converting a DC power into an AC power. FIG. 3 is a circuit diagram showing the configuration of the inverter circuit and a motor circuit including the three-phase induction motor in the present First Embodiment.

In FIG. 3, the motor circuit has a three-phase induction motor MT and an inverter circuit INV. The three-phase induction motor MT is driven by three phase voltages having different phases. Specifically, with the three-phase induction motor MT, a rotating magnetic field is generated around a rotor RT which is a conductor by using three-phase alternating currents referred to as U phase, V phase, and W phase, shifted in phase by 120 degrees. In this case, the magnetic field rotates around the rotor RT. This means that the magnetic flux crossing the rotor RT which is a conductor changes. As a result, electromagnetic induction is caused in the rotor RT which is a conductor, so that an induced current flows in the rotor RT. Then, the fact that an induced current flows in the rotating magnetic field means as follows: a force is applied to the rotor by the Fleming's left hand rule. The rotor RT is rotated by the force. Thus, it is indicated as follows: with the three-phase induction motor MT, the rotor RT can be rotated by using three-phase alternating currents. In other words, the three-phase induction motor MT requires three-phase alternating currents. Thus, by using the inverter circuit INV forming an alternating current from a direct current, three-phase alternating currents are fed to the three-phase induction motor.

Below, a description will be given to the actual configuration example of the inverter circuit INV. As shown in FIG. 3, for example, in the inverter circuit INV in the present First Embodiment, an IGBT Q1 and a diode FWD are provided corresponding to each of the three phases. Namely, in the actual inverter circuit INV, for example, each of the switch SW1 to the switch SW6 shown in FIG. 1 is formed of a constituent element in which an IGBT Q1 and a diode FWD are coupled in anti-parallel with each other as shown in FIG. 3. Namely, in FIG. 3, each of the upper arm and the lower arm of the first leg LG1, the upper arm and the lower arm of the second leg LG2, and the upper arm and the lower arm of the third leg LG3 is formed of a constituent element in which the IGBT Q1 and the diode FWD are coupled in anti-parallel with each other.

Herein, for example, it can be considered that a power MOSFET (Metal Oxide Semiconductor Field Effect Transistor) is used as the switching element of the inverter circuit INV. The power MOSFET is of a voltage driving type in which the ON/OFF operation is controlled by the voltage applied to the gate electrode, and hence has an advantage in which high-speed switching is possible. On the other hand, the power MOSFET has a property of being increased in ON resistance and being increased in heat value with an increase in breakdown voltage. This is due to the following fact: with the power MOSFET, the thickness of the low density epitaxial layer (drift layer) is increased, thereby to ensure the breakdown voltage; however, an increase in thickness of the low density epitaxial layer results in an increase in resistance as the side effect.

In contrast, as the switching element, there is also a bipolar transistor capable of handling a large electric power. However, the bipolar transistor is of a current-driven type which, controls the ON/OFF operation by the base current, and hence has a property of being generally slower in switching speed than the power MOSFET.

Therefore, the power MOSFET or the bipolar transistor shows less adaptability to uses of the motor of an electric car or a hybrid car, and the like, requiring a large electric power and high-speed switching. Thus, an IGBT is used for the uses requiring a large electric power and high-speed switching. The IGBT is a semiconductor element formed of a combination of a power MOSFET and a bipolar transistor, and having both of a high-speed switching characteristic of the power MOSFET and the high breakdown voltage property of a bipolar transistor. Accordingly, the IGBT enables a large electric power, and high-speed switching, and hence is a semiconductor element adaptable to uses requiring a large current and high-speed switching. From the description up to this point, an IGBT is adopted as a switching element for the inverter circuit INV in the present First Embodiment.

Then, in the inverter circuit INV in the present First Embodiment, IGBTs Q1 and diodes FWD are coupled in anti-parallel between the positive potential terminal PT and respective phases (the U phase, the V phase, and the W phase) of the three-phase induction motor MT. In addition, the IGBTs Q1 and the diodes FWD are coupled in anti-parallel between respective phases of the three-phase induction motor MT and a negative potential terminal NT. Namely, two IGBTs Q1 and two diodes FWD are provided for each phase, so that six IGBTs Q1 and six diodes FWD are provided for three phases. Then, a gate control circuit GC is coupled to the gate electrode of each individual IGBT Q1. Thus, the gate control circuit GC controls the switching operation of the IGBT Q1. In the thus configured inverter circuit INV, the gate control circuit GC controls the switching operation of each IGBT Q1. As a result, a DC power is converted into a three-phase AC power, and the three-phase AC power is fed to the three-phase induction motor MT.

Necessity of Diode

As described above, in the inverter circuit INV in the present First Embodiment, the IGBT Q1 is used as a switching element, and the diode FWD is provided so as to be coupled in anti-parallel with the IGBT Q1. From the viewpoint of simply implementing the switch function by a switching element, the IGBT Q1 is necessary as the switching element. However, it is considered that the diode FWD is not required to be provided. In this regard, when the load to be coupled to the inverter circuit INV includes an inductance, the diode FWD is required to be provided. Below, the reason for this will be described.

The diode FWD is not necessary because there is no energy to be returned when the load is a pure resistance not including an inductance. However, when the load is coupled with a circuit including an inductance such as a motor, there is a mode in which a negative current flows in the opposite direction to that of the switch in the ON state. Namely, when the load includes an inductance, an energy may return from the inductance of the load to the inverter circuit INV (a current may flow back).

At this step, an IGBT Q1 alone does not have a function capable of passing the reflux current therethrough. For this reason, the diode FWD is required to be coupled in anti-parallel with the IGBT Q1. Namely, in the inverter circuit INV, in the case where the load includes an inductance as with motor control, when the IGBT Q1 is turned off, the energy ($1/2LI^2$) accumulated in the inductance must be necessarily released. However, the IGBT Q1 alone cannot pass the reflux current for releasing the energy accumulated in the inductance therethrough. Thus, in order to allow the electric energy accumulated in the inductance to be returned, the diode FWD is coupled in anti-parallel with the IGBT Q1. In other words, the diode FWD has a function of passing therethrough the reflux current for releasing the electric energy accumulated in the inductance. From the description up to this point, it is indicated as follows: in the inverter circuit to be coupled to the load including an inductance, the diode FWD is required to be provided in anti-parallel with the IGBT Q1 which is a switching element. The diode FWD is referred to as a free wheel diode.

Structure of IGBT

Then, the structure of the IGBT Q1 and the diode FWD forming the inverter circuit INV in the present First Embodiment will be described by reference to the accompanying drawings.

Figure 4:
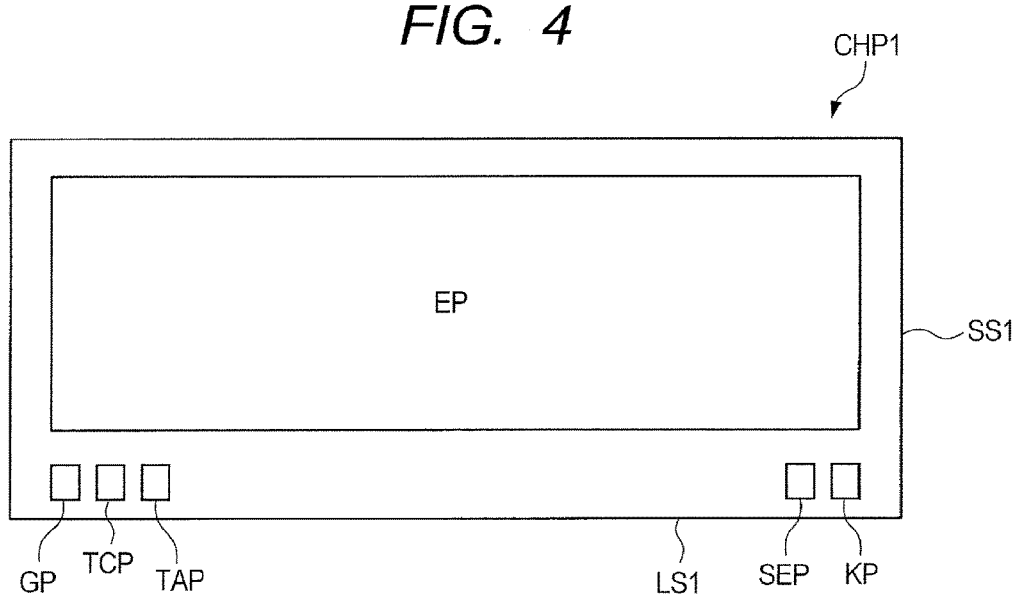
FIG. 4 is a plan view showing an outside shape of a semiconductor chip including an IGBT formed therein.

FIG. 4 is a plan view showing the outside shape of a semiconductor chip CHP1 including the IGBT Q1 formed therein. FIG. 4 shows the main surface (front surface) of the semiconductor chip CHP1. As shown in FIG. 4, the planar shape of the semiconductor chip CHP1 in the present First Embodiment is a rectangular shape having a long side LS1 and a short side SS1. Then, at the front surface of the semiconductor chip CHP1 in a rectangular shape, there is formed an emitter electrode pad EP in a rectangular shape. Then, along the long side direction of the semiconductor chip CHP1, there are formed a plurality of electrode pads. Specifically, as the electrode pads, there are arranged a gate electrode pad GP, a temperature detecting electrode pad TCP, a temperature detecting electrode pad TAP, a current detecting electrode pad SEP, and a Kelvin detecting electrode pad KP from the left-hand side of FIG. 4. Thus, at the front surface of the semiconductor chip CHP1 in a rectangular shape, the emitter electrode pad EP and the electrode pad are arranged along the short side direction, and a plurality of electrode pads are formed along the long side direction. At this step, the size (plane area) of the emitter electrode pad EP is far larger than respective sizes of the plurality of electrode pads.

Figure 5:
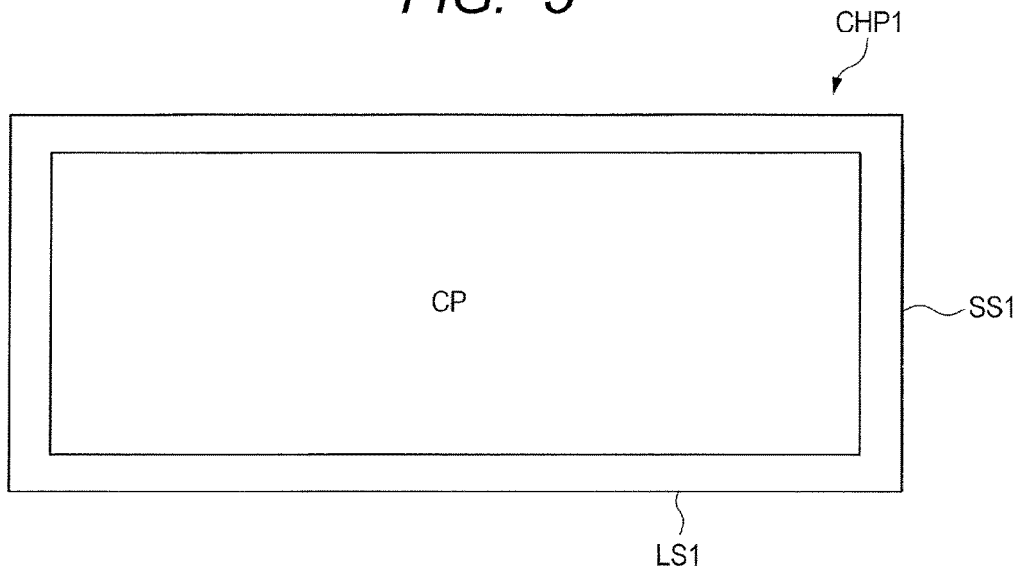
FIG. 5 is a plan view showing the back surface of the semiconductor chip opposite the front surface thereof.

FIG. 5 is a plan view showing the back surface of the semiconductor chip CHP1 opposite the front surface thereof. As shown in FIG. 5, it is indicated that a collector electrode pad CP in a rectangular shape is formed entirely over the back surface of the semiconductor chip CHP1.

Figure 6:
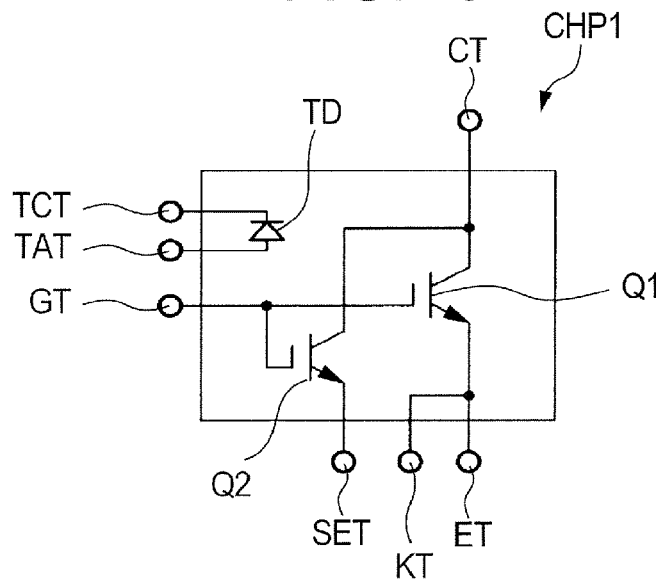
FIG. 6 is a circuit diagram showing one example of a circuit formed in the semiconductor chip.

Subsequently, a description will be given to the configuration of the circuit formed at the semiconductor chip CHP1. FIG. 6 is a circuit diagram showing one example of the circuit formed at the semiconductor chip CHP1. As shown in FIG. 6, at the semiconductor chip CHP1, there are formed an IGBT Q1, a detecting IGBT Q2, and a temperature detecting diode TD. The IGBT Q1 is a main IGBT, and is used for driving control of the three-phase induction motor MT shown in FIG. 3. In the IGBT Q1, there are formed an emitter electrode, a collector electrode and a gate electrode. Then, the emitter electrode of the IGBT Q1 is electrically coupled with an emitter terminal ET via the emitter electrode pad EP shown in FIG. 4. The collector electrode of the IGBT Q1 is electrically coupled with a collector terminal CT via the collector electrode pad CP shown in FIG. 5. Further, the gate electrode of the IGBT Q1 is electrically coupled with a gate terminal GT via the gate electrode pad GP shown in FIG. 4.

The gate electrode of the IGBT Q1 is coupled to the gate control circuit GC shown in FIG. 3. At this step, a signal from the gate control circuit GC is applied to the gate electrode of the IGBT Q1 via the gate terminal GT. As a result, the gate control circuit GC can control the switching operation of the IGBT Q1.

The detecting IGBT Q2 is provided for detecting the excess current flowing between the collector and the emitter of the IGBT Q1. Namely, the detecting IGBT Q2 is provided for detecting the excess current flowing between the collector and the emitter of the IGBT Q1 as the inverter circuit INV, and protecting the IGBT Q1 from crash due to the excess current. In the detecting IGBT Q2, the collector electrode of the detecting IGBT Q2 is electrically coupled with the collector electrode of the IGBT Q1, and the gate electrode of the detecting IGBT Q2 is electrically coupled with the gate electrode of the IGBT Q1. Whereas, the emitter electrode of the detecting IGBT Q2 is electrically coupled with a current detecting terminal SET different from the emitter electrode of the IGBT Q1 via the current detecting electrode pad SEP shown in FIG. 4. The current detecting terminal SET is coupled to an externally provided current detecting circuit. Then, the current detecting circuit detects the current between the collect and the emitter of the IGBT Q1 based on the output from the emitter electrode of the detecting IGBT Q2. Thus, when an excess current flows, the gate signal applied to the gate electrode of the IGBT Q1 is blocked, thereby to protect the IGBT Q1.

Specifically, the detecting IGBT Q2 is used as a current detecting element for preventing an excess current from flowing through the IGBT Q1 due to the load short-circuit or the like. Design is implemented so that, for example, the current ratio of the current flowing through the main IGBT Q1 and the current flowing through the detecting IGBT Q2 becomes IGBT Q1: detecting IGBT Q2=1000:1. In other words, when a current of 200 A is passed through the main IGBT Q1, a current of 200 mA flows through the detecting IGBT Q2.

In an actual application, a sense resistance to be electrically coupled with the emitter electrode of the detecting IGBT Q2 is externally attached. The voltage across the opposite ends of the sense resistance is fed back to the control circuit. Then, the control circuit performs control so that the power supply is blocked when the voltage across the opposite ends of the sense resistance becomes equal to, or larger than the set voltage. In other words, when the current flowing through the main IGBT Q1 becomes an excess current, the current flowing through the detecting IGBT Q2 also increases. As a result, the current flowing through the sense resistance also increases, resulting in an increase in voltage across the opposite ends of the sense resistance. Thus, it is possible to grasp that the current flowing through the main IGBT Q1 is in an excess current state when the voltage becomes equal to, or larger than the set voltage.

The temperature detecting diode TD is provided for detecting the temperature of the IGBT Q1 (broadly, the temperature of the semiconductor chip CHP1). Namely, the voltage of the temperature detecting diode TD varies according to the temperature of the IGBT Q1. As a result, the temperature of the IGBT Q1 is detected. The temperature detecting diode TD includes a pn junction formed therein by doping polysilicon with impurities of different conductivity types, and has a cathode electrode (negative pole) and an anode electrode (positive pole). The cathode electrode is electrically coupled with the temperature detecting terminal TCT shown in FIG. 6 via the temperature detecting electrode pad TCP (see FIG. 4) formed at the top surface of the semiconductor chip CHP1 by an internal wire. Similarly, the anode electrode is electrically coupled with the temperature detecting terminal TAT shown in FIG. 6 via the temperature detecting electrode pad TAP (see FIG. 4) formed at the top surface of the semiconductor chip CHP1 by an internal wire.

The temperature detecting terminal TCT and the temperature detecting terminal TAT are coupled with the externally provided temperature detecting circuit. The temperature detecting circuit indirectly detects the temperature of the IGBT Q1 based on the output between the temperature detecting terminal TCT and the temperature detecting terminal TAT coupled to the cathode electrode and the anode electrode of the temperature detecting diode TD, respectively. When the detected temperature becomes equal to, or larger than a given temperature, the gate signal to be applied to the gate electrode of the IGBT Q1 is blocked. As a result, the IGBT Q1 is protected.

The temperature detecting diode TD formed of the pn junction diode as described above has the following characteristic: when a forward voltage equal to, or larger than a given value is applied, the forward current flowing through the temperature detecting diode TD sharply increases. Then, the voltage value at which the forward current sharply starts to flow varies according to the temperature. When the temperature increases, the voltage value decreases. Thus, in the present First Embodiment, the characteristic of the temperature detecting diode TD is used. In other words, a given current is passed through the temperature detecting diode. Then, the voltage value across the opposite ends of the temperature detecting diode TD is measured. This enables the indirect temperature monitoring. In the actual application, the voltage value (temperature signal) of the temperature detecting diode TD thus measured is fed back to the control circuit. As a result, the element operating temperature is controlled so as not to exceed the guaranteed value (e.g., 150° C. to 175° C.)

Then, in FIG. 6, the emitter electrode pad EP of the IGBT Q1 is electrically coupled with the emitter terminal ET, and is also electrically coupled with a Kelvin terminal KT which is another terminal different from the emitter terminal ET. The emitter electrode pad EP is electrically coupled with the Kelvin detecting electrode pad KP (see FIG. 4) formed at the top surface of the semiconductor chip CHP1 by an internal wire. Therefore, the emitter electrode pad EP of the IGBT Q1 is electrically coupled with the Kelvin terminal KT via the Kelvin detecting electrode pad KP. The Kelvin terminal KT is used as a testing terminal of the main IGBT Q1. Namely, when a voltage sense is taken from the emitter terminal ET of the IGBT Q1 at the time of a test of passing a large current through the main IGBT Q1, a large current flows through the emitter terminal ET. Accordingly, the voltage drop due to the wiring resistance becomes unnegligible, which makes difficult the precise measurement of the ON voltage. Thus, in the present First Embodiment, as a voltage sense terminal which is electrically coupled with the emitter terminal ET of the IGBT Q1, but through which a large current does not flow, the Kelvin terminal KT is provided. Namely, at the time of a test of passing a large current, the voltage of the emitter electrode is measured from the Kelvin terminal. As a result, the ON voltage of the IGBT Q1 can be measured without being affected by a large current. Further, the Kelvin terminal KT is also used as an electrically independent reference pin for gate driving output.

From the description up to this point, the semiconductor chip CHP1 in the present First Embodiment can be coupled with the control circuits including the current detecting circuit, the temperature detecting circuit, and the like. For this reason, it is possible to improve the operation reliability of the IGBT Q1 included in the semiconductor chip CHP1.

Device Structure of IGBT

Figure 7:
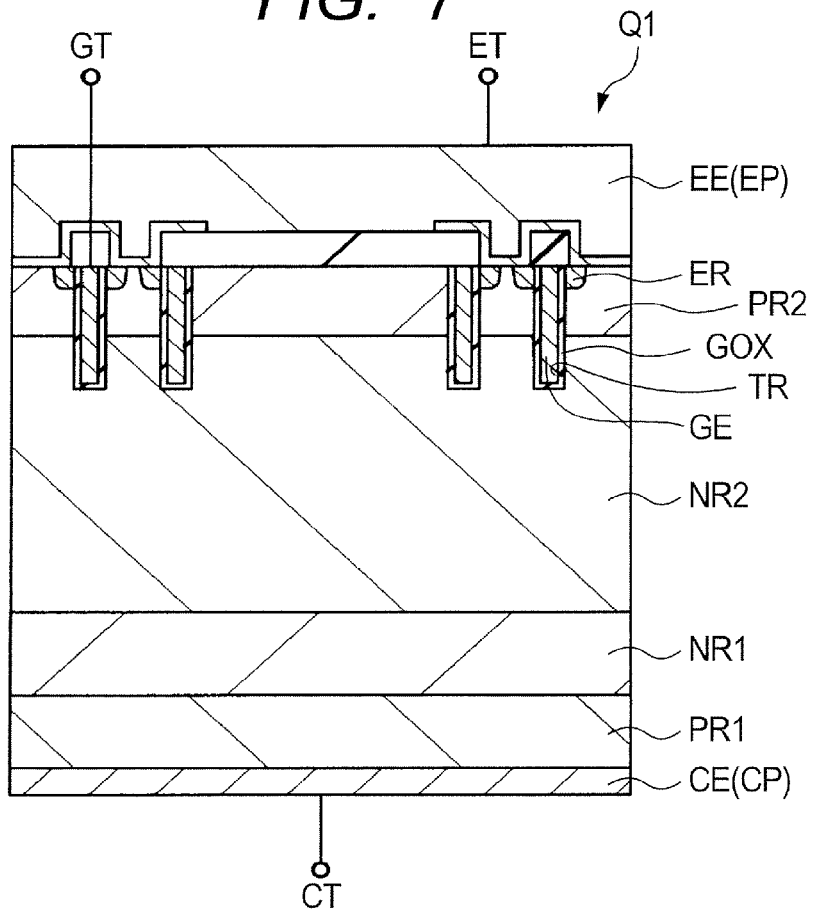
FIG. 7 is a cross sectional view showing a device structure of an IGBT in First Embodiment.

Subsequently, the device structure of the IGBT Q1 will be described. FIG. 7 is a cross sectional view showing the device structure of the IGBT Q1 in the present First Embodiment. In FIG. 7, the IGBT Q1 has a collector electrode CE (collector electrode pad CP) formed at the back surface of the semiconductor chip. Over the collector electrode CE, there is formed a p+ type semiconductor region PR1. Over the p+ type semiconductor region PR1, there is formed an n+ type semiconductor region NR1. Over the n+ type semiconductor region NR1, there is formed an n− type semiconductor region NR2. Then, over the n− type semiconductor region NR2, there is formed a p type semiconductor region PR2, and there is formed a trench TR penetrating through the p type semiconductor region PR2, and reaching the n− type semiconductor region NR2. Further, an n+ type semiconductor region ER to be an emitter region is formed in alignment with the trench TR. In the inside of the trench TR, there is formed a gate insulation film GOX formed of, for example, a silicon oxide film. A gate electrode GE is formed via the gate insulation film GOX. The gate electrode GE is formed of, for example, a polysilicon film, and is formed in such a manner as to fill the trench TR.

In the thus configured IGBT Q1, the gate electrode GE is coupled to the gate terminal GT via the gate electrode pad GP shown in FIG. 4. Similarly, the n+ type semiconductor region ER to be an emitter region is electrically coupled with the emitter terminal ET via the emitter electrode EE (emitter electrode pad EP). The p+ type semiconductor region PR1 to be a collector region is electrically coupled with the collector electrode CE formed at the back surface of the semiconductor chip.

The thus configured IGBT Q1 has both the high-speed switching characteristic and the voltage driven characteristic of the power MOSFET and the low On voltage characteristic of the bipolar transistor.

Incidentally, the n+ type semiconductor region NR1 is referred to as a buffer layer. The n+ type semiconductor region NR1 is provided in order to prevent the following punch-through phenomenon: when the IGBT Q1 is turned off, the depletion layer growing from the p type semiconductor region PR2 into the n− type semiconductor region NR2 comes in contact with the p+ type semiconductor region PR1 formed at a layer underlying the n− type semiconductor region NR2. Further, for the purpose of restricting the hole injection amount from the p+ type semiconductor region PR1 into the n− type semiconductor region NR2, and other purposes, the n+ type semiconductor region NR1 is provided.

Operation of IGBT

Then, a description will be given to the operation of the IGBT Q1 in the present First Embodiment. First, a description will be given to the turn-on operation of the IGBT Q1. In FIG. 7, a sufficient positive voltage is applied between the gate electrode GE and the n+ type semiconductor region ER to be an emitter region. As a result, the MOSFET in a trench gate structure turns on. In this case, a forward bias is caused between the p type semiconductor region PR1 forming the collector region and the n− type semiconductor region NR2. This causes hole injection from the p+ type semiconductor region PR1 into the n− type semiconductor region NR2. Subsequently, electrons as many as the plus charges of the injected holes are collected in the n− type semiconductor region NR2. This results in the reduction of the resistance of the n− type semiconductor region NR2 (electric conductivity modulation), so that the IGBT Q1 is rendered in the ON state.

To the ON voltage, there is added the junction voltage between the p+ type semiconductor region PR1 and the n− type semiconductor region NR2. However, the resistance value of the n− type semiconductor region NR2 is reduced by one figure or larger by the electric conductivity modulation, and hence, for high breakdown voltage such that the resistance value occupies most of the ON resistance, the IGBT Q1 provides a lower ON voltage than a power MOSFET. Therefore, it is indicated that the IGBT Q1 is a device effective for achieving a higher breakdown voltage. Namely, with a power MOSFET, in order to achieve a higher breakdown voltage, it is necessary to increase the thickness of the epitaxial layer to be a drift layer. However, in this case, the ON resistance also increases. In contrast, with the IGBT Q1, even when the thickness of the n− type semiconductor region NR2 is increased in order to achieve a higher breakdown voltage, electric conductivity modulation occurs at the time of the ON operation of the IGBT Q1. For this reason, the ON resistance can be set lower than with the power MOSFET. In other words, as compared with a power MOSFET, the IGBT Q1 can implement a device with a lower ON resistance even when a higher breakdown voltage is achieved.

Subsequently, a description will be given to the turn off operation of the IGBT Q1. When the voltage between the gate electrode GE and the n+ type semiconductor region ER to be an emitter region is reduced, the MOSFET in a trench gate structure turns off. In this case, hole injection from the p+ type semiconductor region PR1 into the n− type semiconductor region NR2 is stopped, and the already injected holes also expire in life, and decrease. The residual holes directly flow out into the p+ type semiconductor region PR1 (tail current). At the time point of completion of flow, the IGBT Q1 is rendered in the OFF state. Thus, the IGBT Q1 can be ON/OFF operated.

Structure of Free Wheel Diode

Figure 8:
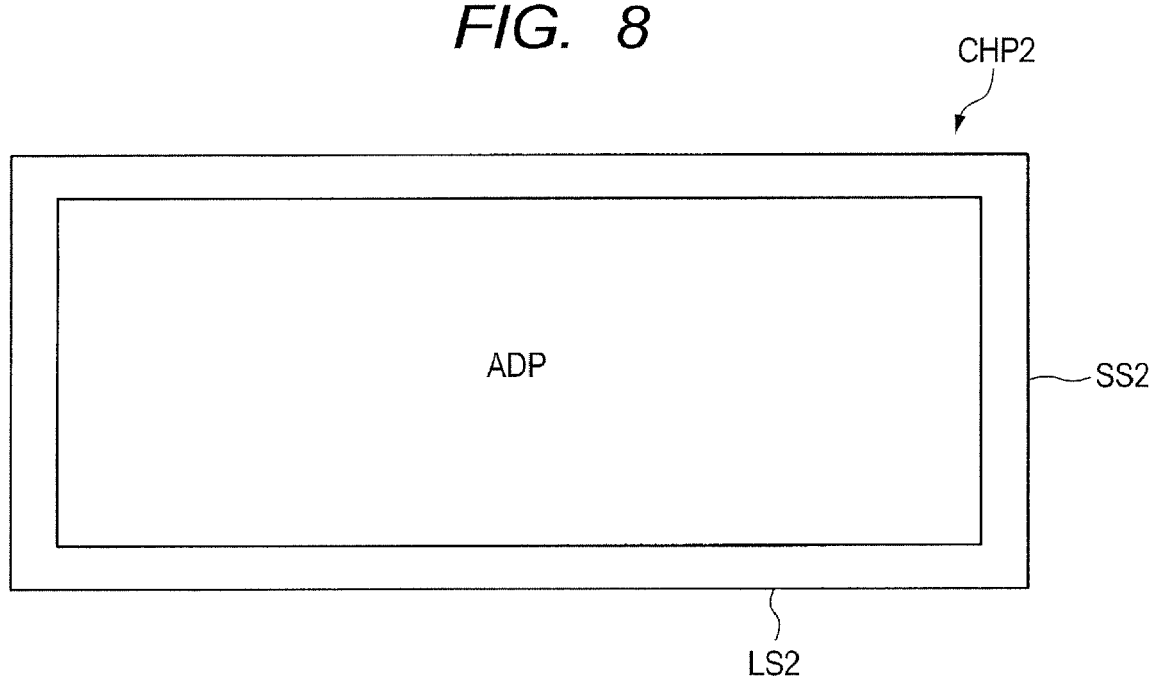
FIG. 8 is a plan view showing an outside shape of a semiconductor chip including a diode formed therein.

Then, FIG. 8 is a plan view showing the outside shape of a semiconductor chip CHP2 including a diode FWD formed therein. FIG. 8 shows the main surface (front surface) of the semiconductor chip CHP2. As shown in FIG. 8, the planar shape of the semiconductor chip CHP2 in the present First Embodiment is a rectangular shape having a long side LS2 and a short side SS2. Then, at the front surface of the semiconductor chip CHP2 in a rectangular shape, there is formed an anode electrode pad ADP in a rectangular shape. On the other hand, although not shown, a cathode electrode pad in a rectangular shape is formed entirely over the back surface of the semiconductor chip CHP2 opposite the front surface thereof.

Figure 9:
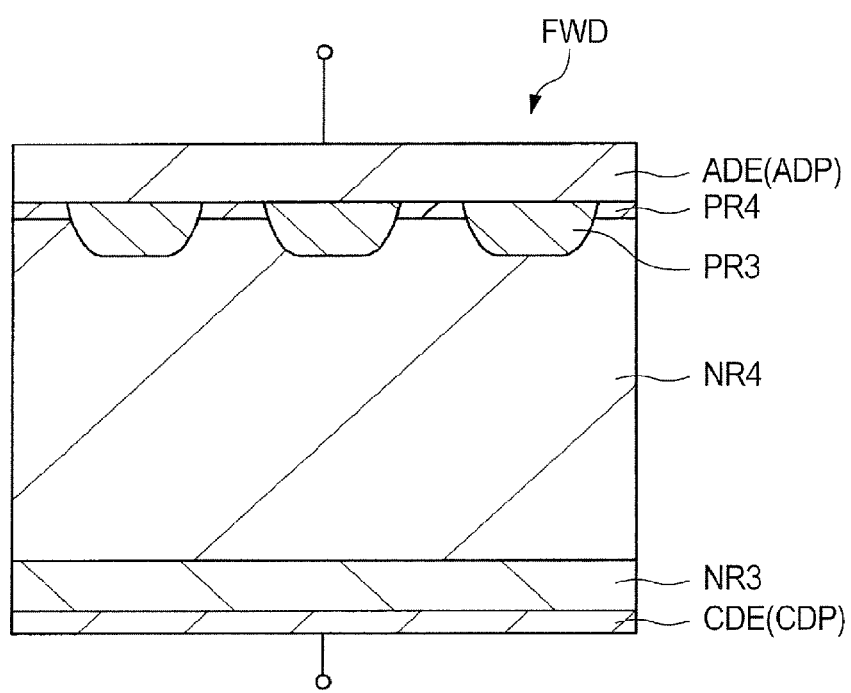
FIG. 9 is a cross sectional view showing a device structure of the diode in First Embodiment.

Subsequently, a description will be given to the device structure of the diode FWD. FIG. 9 is a cross sectional view showing the device structure of the diode FWD. In FIG. 9, at the back surface of the semiconductor chip, there is formed a cathode electrode CDE (cathode electrode pad CDP). Over the cathode electrode CDE, there is formed an n+ type semiconductor region NR3. Then, over the n− type semiconductor region NR3, there is formed an n− type semiconductor region NR4. Over the n− type semiconductor region NR4, there are formed p type semiconductor regions PR3 apart from one another. Between the p type semiconductor regions PR3, there are formed p− type semiconductor regions PR4, respectively. Over the p type semiconductor regions PR3 and the p− type semiconductor regions PR4, there is formed an anode electrode ADE (anode electrode pad ADP). The anode electrode ADE is formed of, for example, aluminum—silicon.

Operation of Diode

With the thus configured diode FWD, when the anode electrode ADE is applied with a positive voltage, and the cathode electrode CDE is applied with a negative voltage, the pn junction between the n⁻ type semiconductor region NR4 and the p type semiconductor region PR3 is forward biased, so that a current flows therethrough. On the other hand, when the anode electrode ADE is applied with a negative voltage, and the cathode electrode CDE is applied with a positive voltage, the pn junction between the n⁻ type semiconductor region NR4 and the p type semiconductor region PR3 is reverse biased, so that a current does not flow therethrough. In this manner, the diode FWD having a rectifying function can be operated.

Reason Why IGBT and Diode are Formed at Separate Chips

As described above, in the present First Embodiment, the IGBT Q1 is formed at the semiconductor chip CHP1, and the diode FWD is formed at the semiconductor chip CHP2. In other words, in the present First Embodiment, the IGBT Q1 and the diode FWD are formed at separate chips. The reason for this will be described in comparison with a power MOSFET.

Figure 10:
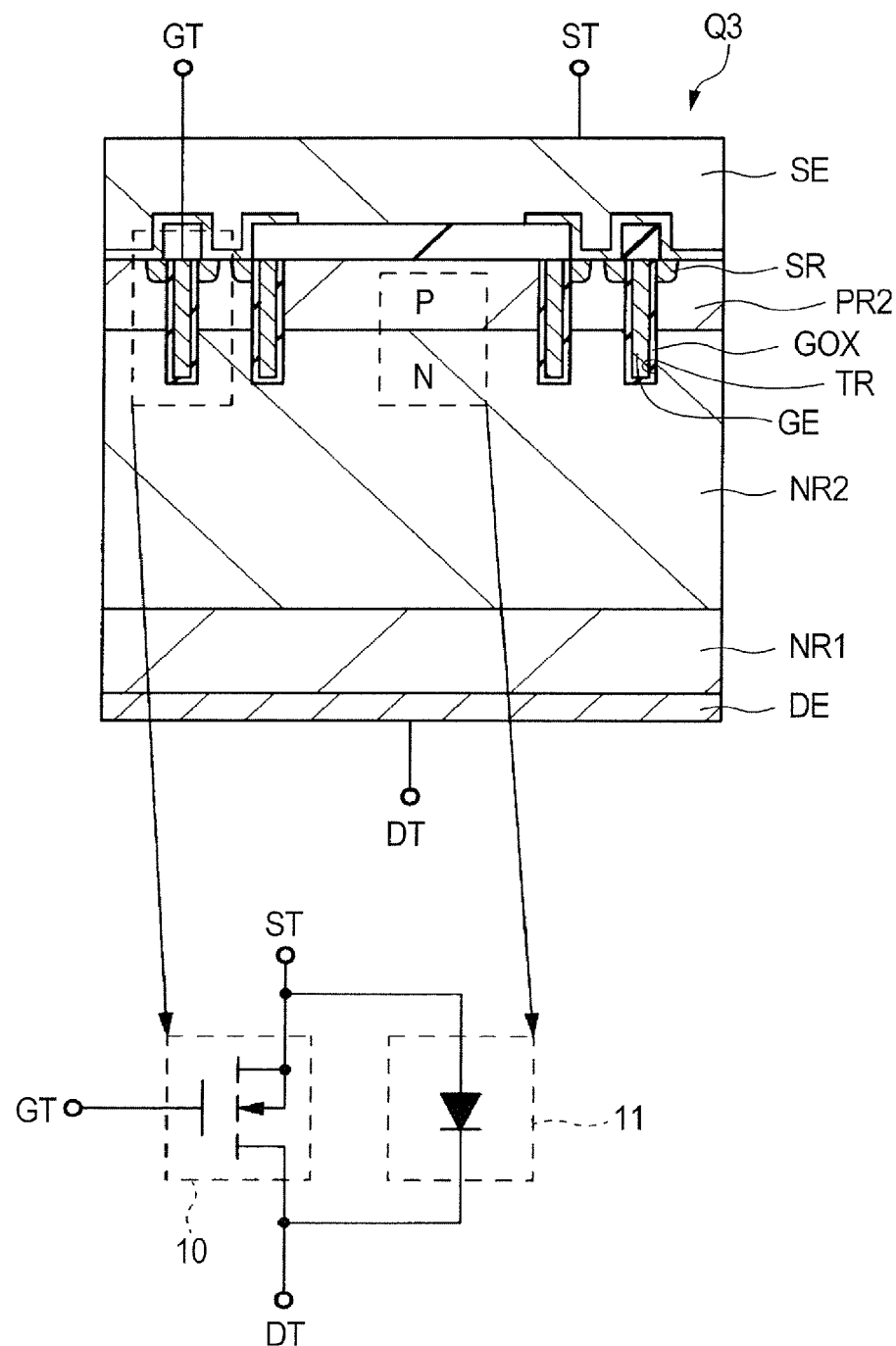
FIG. 10 is a cross sectional view showing the correlation between the device structure of a power MOSFET and circuit elements.

FIG. 10 is a cross sectional view showing the correlation between the device structure of a power MOSFET and circuit elements. The device structure of the power MOSFET shown in FIG. 10 has almost the same configuration as that of the IGBT Q1 shown in FIG. 7. Removal of the p⁺ type semiconductor region PR1 which is the constituent element of the IGBT Q1 results in the device structure of a power MOSFET Q3 shown in FIG. 10. In the power MOSFET Q3, the collector electrode CE of the IGBT Q1 corresponds to the drain electrode DE, and the drain electrode DE is electrically coupled with the drain terminal DT. Further, in the power MOSFET Q3, an n⁺ type semiconductor region ER which is the emitter region of the IGBT Q1 corresponds to the n⁺ type semiconductor region SR which is the source region. An emitter electrode EE of the IGBT Q1 corresponds to a source electrode SE. Then, the n⁺ type semiconductor region SR which is the emitter region of the power MOSFET Q3 is electrically coupled with the source electrode SE. The source electrode SE is electrically coupled with the source terminal ST. Further, the gate electrode GE of the power MOSFET Q3 is electrically coupled with the gate terminal GT.

As shown in FIG. 10, the thus configured power MOSFET Q3 includes a MOSFET 10 formed of a trench gate structure, and includes a pn junction diode formed by the p type semiconductor region PR2 and the n⁻ type semiconductor region NR2. Namely, in the power MOSFET Q3, the pn junction diode is also formed parasitically with a MOSFET in terms of the device structure. The pn junction diode is formed integrally with the power MOSFET, and hence is referred to as a body diode 11. In other words, in the power MOSFET Q3, the formation of the MOSFET 10 also necessarily results in the formation of the body diode 11. As a result, when a power MOSFET is used for the inverter circuit, the body diode 11 is formed internally of the power MOSFET. The body diode 11 functions as a free wheel diode. Therefore, when a power MOSFET is used for the inverter circuit, it is not necessary to form a diode at another chip.

Figure 11:
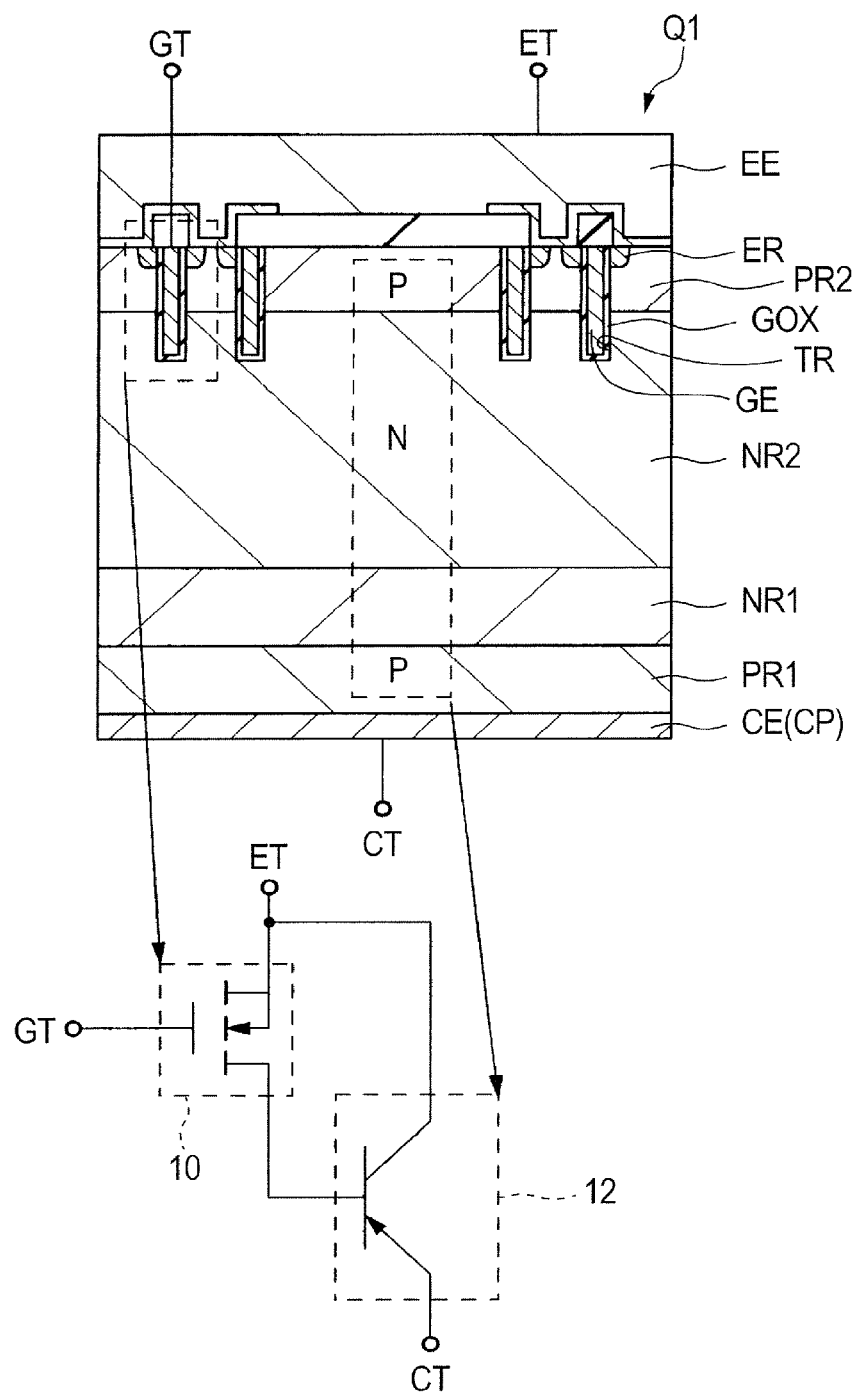
FIG. 11 is a view showing the correlation between the device structure of an IGBT and circuit elements.

On the other hand, FIG. 11 is a view showing the correlation between the device structure of the IGBT Q1 and the circuit elements. In FIG. 11, the IGBT Q1 includes the MOSFET 10 of a trench gate structure, and includes a PNP bipolar transistor 12 formed of the p type semiconductor region PR2, the n⁻ type semiconductor region NR2, and the p⁺ type semiconductor region PR1. Namely, in the IGBT Q1, the PNP bipolar transistor 12 is formed in place of the body diode 11. This is due to the following: in the power MOSFET Q3 shown in FIG. 10, the p type semiconductor region PR2 and the n⁻ type semiconductor region NR2 necessarily form the body diode 11; however, in the case of the IGBT Q1, to the device structure of the power MOSFET Q3, there is added the p⁺ type semiconductor region PR1; accordingly, not the body diode 11 but the PNP bipolar transistor 12 is formed. Therefore, in the IGBT Q1, the body diode 11 is not necessarily formed in terms of the device structure. This creates the necessity of newly providing a free wheel diode.

Herein, it can be considered that a diode FWD functioning as a free wheel diode is formed at the same semiconductor chip as that for the IGBT Q1. However, for the following reason, the IGBT Q1 and the diode FWD are not formed at the same semiconductor chip, but the IGBT Q1 and the diode FWD are formed at different semiconductor chips.

With the diode FWD, in order to improve the switching characteristic, under present circumstances, an electron beam is applied, thereby to control the lifetime of carriers. In other words, application of an electron beam results in the formation of a crystal defect. The crystal defect accelerates the elimination of carriers. For this reason, the switching characteristic of the diode FWD is improved. Similarly, also for the IGBT Q1, an electron beam is applied in order to improve the characteristic. However, the conditions for the electron beam application to the diode FWD and the conditions for the electron beam application to the IGBT Q1 are different.

At this step, for example, in the case where the IGBT Q1 and the diode FWD are formed at the same semiconductor chip, when an electron beam is applied in order to improve the switching characteristic of the diode FWD, an electron beam is also applied to the IGBT Q1 under the same conditions. As a result, it becomes difficult to achieve the consistency between the characteristic improvement of the diode FWD and the characteristic improvement of the IGBT Q1. On the contrary, even if the characteristic of the diode FWD can be improved, the characteristic of the IGBT Q1 may be deteriorated. This is because the conditions for the electron beam application for characteristic improvement of the IGBT Q1 and the conditions for the electron beam application for characteristic improvement of the diode FWD are different.

In this regard, when the IGBT Q1 and the diode FWD are formed at separate semiconductor chips, the conditions for electron beam application to the IGBT Q1 and the conditions for electron beam application to the diode FWD can be set differently. In other words, when the IGBT Q1 and the diode FWD are formed at separate semiconductor chips, it is possible to perform electron beam application under the optimum conditions from the viewpoint of improving the characteristic of the IGBT Q1, and it is possible to perform electron beam application under the optimum conditions from the viewpoint of improving the characteristic of the diode FWD. In other words, in the present First Embodiment, from the viewpoint of achieving the compatibility between the characteristic improvement of the IGBT Q1 and the characteristic improvement of the diode FWD, the IGBT Q1 and the diode FWD are formed at separate semiconductor chips.

For the IGBT Q1, originally, a body diode is not parasitisically formed in terms of the device structure. This less creates the incentive that the IGBT Q1 and the diode FWD are formed together at the same semiconductor chip. Further, attention is paid to the viewpoint of achieving the compatibility between the characteristic improvement of the IGBT Q1 and the characteristic improvement of the diode FWD. This indicates that the IGBT Q1 and the diode FWD are more desirably formed at separate semiconductor chips than at the same semiconductor chip. For the foregoing reason, in the present First Embodiment, the IGBT Q1 and the diode FWD are formed at separate semiconductor chips.

Mounting Configuration of Semiconductor Device in First Embodiment

Then, a description will be given to the mounting configuration of the semiconductor device in the present First Embodiment. The semiconductor device in the present First Embodiment relates to the inverter circuit INV shown in FIG. 3, and includes one IGBT Q1 and one diode FWD serving as the constituent elements of the inverter circuit INV formed in one package. Namely, six semiconductor devices in the present First Embodiment are used, thereby to form an electronic device (power module) serving as a three-phase inverter circuit INV for driving a three-phase motor.

Figure 12:
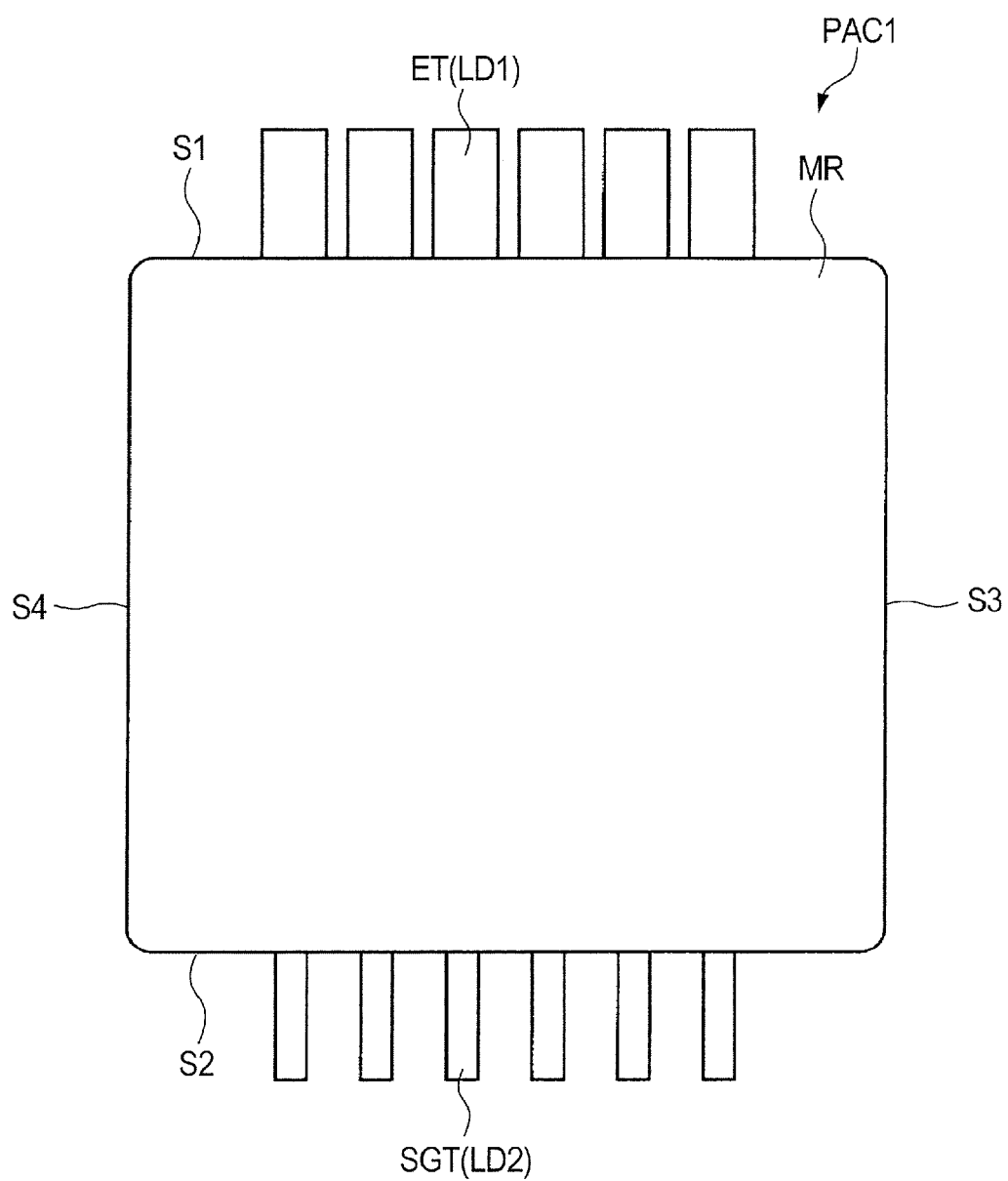
FIG. 12 is a plan view showing the outside configuration of the semiconductor device in First Embodiment.

FIG. 12 is a plan view showing the outside configuration of a semiconductor device PAC1 in the present First Embodiment. As shown in FIG. 12, the semiconductor device PAC1 in the present First Embodiment has a sealing body MR formed in a rectangular shape, and made of a resin. The sealing body MR has a top surface shown in FIG. 12, a bottom surface opposite the top surface, a first side surface situated between the top surface and the bottom surface in the thickness direction, and a second side surface opposite the first side surface. In FIG. 12, there is shown a side S1 forming the first side surface, and there is shown a side S2 forming the second side surface. Further, the sealing body MR has a third side surface crossing with the first side surface and the second side surface, and a fourth side surface crossing with the first side surface and the second side surface, and opposite the third side surface. In FIG. 12, there is shown a side S3 forming the third side surface, and there is shown a side S4 forming the fourth side surface.

Herein, in the semiconductor device PAC1 in the present First Embodiment, as shown in FIG. 12, respective one portions of a plurality of leads LD1 protrude from the first side surface, and respective one portions of a plurality of leads LD2 protrude from the second side surface. In this case, the lead LD1 forms the emitter terminal ET, and the lead LD2 forms the signal terminal SGT. Then, each width of the plurality of leads LD1 forming the emitter terminals ET is larger than each width of the plurality of leads LD2 forming the signal terminals SGT. In other words, in the present First Embodiment, the plurality of leads LD1 are collectively referred to as a first lead (first lead group), and the plurality of leads LD2 are collectively referred to as a second lead (second lead group). In this case, the portion of the first lead exposed from the sealing body MR is formed of a plurality of portions (a plurality of leads LD1) and the portion of the second lead exposed from the sealing body MR is formed of a plurality of portions (a plurality of leads LD2). In this case, in plan view, it can also be said that each width of the plurality of portions of the first lead is larger than each width of the plurality of leads LD2. This is implemented in consideration of the following: a large current flows through the emitter terminal ET, and hence the resistance is required to be minimized; in contrast, only a minute current flows through the signal terminal SGT.

Subsequently, a description will be given to the internal structure of the sealing body MR forming the semiconductor device PAC1 in the present First Embodiment. FIGS. 13A and 13B are views each showing the internal structure of the sealing body MR forming the semiconductor device PAC1 in the present First Embodiment, wherein FIG. 13A corresponds to a plan view, and FIG. 13B corresponds to a cross sectional view along line A-A of FIG. 13A.

First, in FIG. 13A, in the inside of the sealing body MR, there is arranged a chip mounting portion TAB in a rectangular shape. The chip mounting portion TAB also functions as a heat spreader for increasing the heat radiation efficiency, and is formed of, for example, a material including copper having a high heat conductivity as a main component. Herein, the term "main component" denotes the material component included in the largest amount of the constituent materials forming the member. For example, the term "material including copper as a main component" means that the material for the member includes copper in the largest amount. The term "main component" used in the present specification is intended to express not to exclude, for example, the case where the member is basically formed of copper, and additionally contains impurities.

Over the chip mounting portion TAB, a semiconductor chip CHP1 including an IGBT formed therein, and a semiconductor chip CHP2 including a diode formed therein are mounted via a conductive adhesive ADH1 formed of, for example, high melting point solder. At this step, the surface including the semiconductor chip CHP1 and the semiconductor chip CHP2 mounted thereover is defined as a first surface of the chip mounting portion TAB, and the surface opposite the first surface is defined as a second surface. In this case, the semiconductor chip CHP1 and the semiconductor chip CHP2 are mounted over the first surface of the chip mounting portion TAB. Particularly, the semiconductor chip CHP2 including a diode formed therein is arranged so that the cathode electrode pad formed at the back surface of the semiconductor chip CHP2 is in contact with the first surface of the chip mounting portion TAB via the conductive adhesive ADH1. In this case, the anode electrode pad ADP formed at the front surface of the semiconductor chip CHP2 points upward. On the other hand, the semiconductor chip CHP1 including an IGBT formed therein is arranged so that the collector electrode CE (collector electrode pad CP) (see FIG. 5) formed at the back surface of the semiconductor chip CHP1 is in contact with the first surface of the chip mounting portion TAB via the conductive adhesive ADH1. In this case, the emitter electrode pad EP and a plurality of electrode pads formed at the front surface of the semiconductor chip CHP1 point upward. Therefore, the collector electrode pad CP of the semiconductor chip CHP1 and the cathode electrode pad of the semiconductor chip CHP2 are electrically coupled with each other via the chip mounting portion TAB.

Further, in FIG. 13A, the plane area of the chip mounting portion TAB is larger than the total plane area of the semiconductor chip CHP1 and the semiconductor chip CHP2. Then, in plan view, in the portion of the chip mounting portion TAB at which the semiconductor chip CHP1 and the semiconductor chip CHP2 do not overlap each other, there are formed through holes TH penetrating from the first surface to the second surface of the chip mounting portion TAB. In the through hole TH, a part of the sealing body MR is filled.

Subsequently, as shown in FIG. 13A, over the emitter electrode pad EP of the semiconductor chip CHP1, and the anode electrode pad ADP of the semiconductor chip CHP2, a clip CLP which is a conductive member is arranged via a conductive adhesive ADH2 formed of, for example, high melting point solder. Then, the clip CLP is coupled with the emitter terminal ET via the conductive adhesive ADH2. Therefore, the emitter electrode pad EP of the semiconductor chip CHP1 and the anode electrode pad ADP of the semiconductor chip CHP2 are electrically coupled with the emitter terminal ET via the clip CLP. The clip CLP is formed of a plate-like member including, for example, copper as a main component. In other words, in the present First Embodiment, a large current flows from the emitter electrode pad EP to the emitter terminal ET of the semiconductor chip CHP1. For this reason, the clip CLP capable of ensuring a large area is used so as to be capable of passing a large current therethrough.

Further, as shown in FIG. 13A, at the front surface of the semiconductor chip CHP1, there are formed a plurality of electrode pads. The plurality of electrode pads are electrically coupled with the signal terminals SGT by wires W which are conductive members, respectively. Specifically, the plurality of electrode pads include a gate electrode pad GP, a temperature detecting electrode pad TCP, a temperature detecting electrode pad TAP, a current detecting electrode pad SEP, and a Kelvin detecting electrode pad KP. Then, the gate electrode pad GP is electrically coupled with the gate terminal GT which is one of the signal terminals SGT via the wire W. Similarly, the temperature detecting electrode pad TCP is electrically coupled with the temperature detecting terminal TCT which is one of the signal terminals SGT via the wire W. The temperature detecting electrode pad TAP is electrically coupled with the temperature detecting terminal TAT which is one of the signal terminals SGT via the wire W. Whereas, the current detecting electrode pad SEP is electrically coupled with the current detecting terminal SET which is one of the signal terminals SGT via the wire W. The Kelvin detecting electrode pad KP is electrically coupled with the Kelvin terminal KT via the wire W. In this case, the wire W is formed of a conductive member including, for example, gold, copper, or aluminum as a main component.

Herein, as shown in FIG. 13A, in plan view, the semiconductor chip CHP2 is mounted over the first surface of the chip mounting portion TAB in such a manner as to be situated between the emitter terminals ET and the semiconductor chip CHP1, and the semiconductor chip CHP1 is mounted over the first surface of the chip mounting portion TAB in such a manner as to be situated between the semiconductor chip CHP2 and the signal terminals SGT.

In other words, the emitter terminals ET, the semiconductor chip CHP2, the semiconductor chip CHP1, and the signal terminals SGT are arranged along the y direction which is a first direction. Specifically, in plan view, the semiconductor chip CHP2 is mounted over the first surface of the chip mounting portion TAB in such a manner as to be closer to the emitter terminals ET than the semiconductor chip CHP1, and the semiconductor chip CHP1 is mounted over the first surface of the chip mounting portion TAB in such a manner as to be closer to the signal terminals SGT than the semiconductor chip. CHP2.

Then, in plan view, the semiconductor chip CHP1 is mounted over the first surface of the chip mounting portion TAB so that the gate electrode pad GP is closer to the signal terminals SGT than to the emitter electrode pad EP. More particularly, in plan view, the semiconductor chip CHP1 is mounted over the first surface of the chip mounting portion TAB so that a plurality of electrode pads including the gate electrode pad GP, the temperature detecting electrode pad TCP, the temperature detecting electrode pad TAP, the current detecting electrode pad SEP, and the Kelvin detecting electrode pad KP are closer to the signal terminals SGT than to the emitter electrode pads EP. In other words, it can also be said that a plurality of electrode pads of the semiconductor chip CHP1 are arranged along the side closest to the signal terminals SGT of the sides of the semiconductor chip CHP1 in plan view. At this step, as shown in FIG. 13A, in plan view, the clip CLP is arranged so as not to overlap any of the plurality of electrode pads including the gate electrode pad GP and the plurality of wires W.

In the semiconductor device PAC1 thus internally configured, the semiconductor chip CHP1, the semiconductor chip CHP2, a part of the chip mounting portion TAB, a part of the emitter terminal ET, respective parts of the plurality of signal terminals SGT, the clip CLP, and the wires W are sealed by, for example, a resin, thereby to form a sealing body MR.

Subsequently, in FIG. 13B, over the first surface of the chip mounting portion TAB, the semiconductor chip CHP1 including an IGBT formed therein and the semiconductor chip CHP2 including a diode formed therein are mounted via the conductive adhesive ADH1. Then, across over the front surface of the semiconductor chip CHP1 to over the front surface of the semiconductor chip CHP2, the clip CLP is arranged via the conductive adhesive ADH2. The clip CLP is further coupled with the emitter terminal ET via the conductive adhesive ADH2, and a part of the emitter terminal ET is exposed from the sealing body MR. Further, the semiconductor chip CHP1 is coupled with the signal terminals SGT arranged on the opposite side thereof from the emitter terminal ET via the wires W. A part of each signal terminal SGT is also exposed from the sealing body MR.

Herein, as shown in FIG. 13B, the second surface of the chip mounting portion TAB is exposed from the bottom surface of the sealing body MR. The exposed second surface of the chip mounting portion TAB serves as a collector terminal CT. Then, the second surface of the chip mounting portion TAB becomes a surface capable of being soldered with wires formed over a wiring board when the semiconductor device PAC1 is mounted on the wiring board.

Over the first surface of the chip mounting portion TAB, there are mounted the semiconductor chip CHP1 and the semiconductor chip CHP2. The collector electrode pad of the semiconductor chip CHP1 and the cathode electrode pad of the semiconductor chip CHP2 are in contact with the chip mounting portion TAB via the conductive adhesive ADH1. As a result, the collector electrode pad and the cathode electrode pad are electrically coupled with each other via the chip mounting portion TAB, and finally electrically coupled with the collector terminal CT. Further, as shown in FIG. 13B, the thickness of the chip mounting portion TAB is larger than the thicknesses of the emitter terminal ET and the signal terminal SGT.

In the manner described up to this point, the semiconductor device PAC1 in the present First Embodiment is mounted and configured. Herein, a description will be given to another expression on the mounting configuration of the semiconductor device PAC1 in the present First Embodiment.

For example, the semiconductor device PAC1 in the present First Embodiment has a first external electrode, a second external electrode, and a third external electrode, and has the semiconductor chip CHP1 arranged in such a manner as to be interposed between the first external electrode and the second external electrode, and the semiconductor chip CHP2 arranged in such a manner as to be interposed between the first external electrode and the second external electrode. Then, the semiconductor chip CHP1 including an IGBT formed therein and the semiconductor chip CHP2 including a diode formed therein, a part of the first external electrode, a part of the second external electrode, and a part of the third external electrode are sealed by the sealing body MR.

In this case, the emitter electrode pad EP of the semiconductor chip CHP1 and the anode electrode pad ADP of the semiconductor chip CHP2 are electrically coupled with each other via a first portion of the first external electrode; the gate electrode pad GP of the semiconductor chip CHP1 is electrically coupled with the second external electrode. Whereas, the collector electrode pad of the semiconductor chip CHP1 and the cathode electrode pad of the semiconductor chip CHP2 are electrically coupled with each other via the third external electrode.

Further, the second portion of the first external electrode and the second external electrode are exposed from the sealing body MR. In plan view, the semiconductor chip CHP2 is situated between the semiconductor chip CHP1 and the second portion of the first external electrode, and the semiconductor chip CHP1 is situated between the semiconductor chip CHP2 and the second external electrode.

When the mounting configuration of the semiconductor device PAC1 in the present First Embodiment is described by such an expression, in FIGS. 13A and 13B, the first external electrode corresponds to a constituent element of a combination of the emitter terminal ET and the clip CLP, and the second external electrode, corresponds to a constituent element of a combination of the signal terminal SGT and the wire W. Further, the third external electrode corresponds to the chip mounting portion TAB to be the collector terminal CT. Then, the first portion of the first external electrode corresponds to the clip CLP, and the second portion of the first external electrode corresponds to the emitter terminal ET. Therefore, in the semiconductor device PAC1 in the present First Embodiment, the first portion (clip CLP) and the second portion (emitter terminal ET) of the first external electrode are separate structures. In addition, the first portion and the second portion of the first external electrode are electrically coupled with each other via the conductive adhesive ADH2.

Incidentally, for the semiconductor device PAC1 in the present First Embodiment, from the viewpoint of reducing the ON resistance, for the conductive adhesive ADH1 for use in coupling between the chip mounting portion TAB and the semiconductor chip CHP1 or the semiconductor chip CHP2 mounted over the chip mounting portion TAB, or the conductive adhesive ADH2 for use in coupling between the semiconductor chip CHP1 or the semiconductor chip CHP2 and the clip CLP, there is used a solder. In other words, for the semiconductor device PAC1 for use in the inverter circuit required to be reduced in ON resistance, there is used a solder having a large electric conductivity. As a result, the ON resistance is reduced.

However, after the semiconductor device PAC1 in the present First Embodiment is finished as a product, the semiconductor device PAC1 is mounted on a circuit board (mounting substrate). In this case, for the coupling between the semiconductor device PAC1 and the mounting substrate, there is used a solder. In the case of coupling by a solder, a heat treatment (reflow) is necessary in order to melt the solder for coupling.

Herein, when the solder for use in coupling between the semiconductor device PAC1 and the mounting substrate, and the solder for use in the inside of the semiconductor device PAC1 are the same materials, the heat treatment (reflow) applied for coupling between the semiconductor device PAC1 and the mounting substrate also results in melting of the solder used in the inside of the semiconductor device PAC1. In this case, the following defective conditions occur: volume expansion due to melting of the solder causes cracks in the resin sealing the semiconductor device PAC1, and the molten solder leaks to the outside.

For this reason, a high melting point solder is used in the inside of the semiconductor device PAC1. In this case, the heat treatment (reflow) applied for the coupling between the semiconductor device PAC1 and the mounting substrate does not cause melting of the high melting point solder used in the inside of the semiconductor device PAC1. Therefore, it is possible to prevent the following defective conditions: volume expansion due to melting of the high melting point solder causes cracks in the resin sealing the semiconductor device PAC1, and the molten solder leaks to the outside.

Herein, for the solders for use in the coupling between the semiconductor device PAC1 and the mounting substrate, there are used solders having a melting point of about 220° C. represented by, for example, Sn (tin)—silver (Ag)—copper (Cu). At the time of reflow, the semiconductor device PAC1 is heated up to about 260° C. This indicates that, for example, the term "high melting point solder" used in the present specification is intended to mean a solder which is not molten even when heated to about 260° C. Representative examples thereof may include solders having a melting point of 300° C. or more, and a reflow temperature of about 350° C., and including Pb (lead) in an amount of 90 wt % or more.

Basically, for the semiconductor device PAC1 in the present First Embodiment, it is assumed that the high melting point solder for use in the conductive adhesive ADH1 and the high melting point solder for use in the conductive adhesive ADH2 are formed of the same material component. However, not limited to this, for example, the high melting point solder forming the conductive adhesive ADH1 and the high melting point solder forming the conductive adhesive ADH2 can be formed of different material components.

Features of Semiconductor Device in First Embodiment

Subsequently, a description will be given to the features of the semiconductor device PAC1 in the present First Embodiment. In FIG. 13A, the first feature in the present First Embodiment resides in the following point: the emitter terminals ET protrude from the side S1 of the sealing body MR, and the signal terminals SGT protrude from the side S2 of the sealing body MR. Namely, the first feature in the present First Embodiment resides in that the side of the sealing body MR from which the emitter terminals ET protrude and the side of the sealing body MR from which the signal terminals SGT protrude are different. More particularly, the signal terminals SGT protrude from the side of the sealing body MR opposite the side thereof from which the emitter terminals ET protrude. In this case, for example, the following advantages can be obtained.

The first advantage resides in that, as shown in FIG. 13A, the emitter terminals ET can be arranged along the side S1 of the sealing body MR. In other words, the semiconductor device PAC1 in the present First Embodiment is assumed to be applied to an inverter circuit for passing a large current of, for example, several hundreds amperes therethrough. For this reason, it is necessary to sufficiently ensure the current path at the emitter terminals ET through which a large current flows. In this regard, in the present First Embodiment, the emitter terminals ET can be arranged along the side S1 which is one side of the sealing body MR. This means that the current path at the emitter terminals ET can be sufficiently ensured. As a result, in accordance with the present First Embodiment, it is possible to sufficiently ensure the emitter terminals ET serving as a current path. Accordingly, it becomes possible for the semiconductor device PAC1 to be applied to an inverter circuit for passing a large current of several hundreds amperes therethrough. In addition, it is possible to reduce the resistance at the emitter terminals ET. As a result, in accordance with the present First Embodiment, it is also possible to improve the conversion efficiency from a DC power into an AC power at the inverter circuit. Namely, in the present First Embodiment, the side of the sealing body MR from which the emitter terminals ET protrude and the side of the sealing body MR from which the signal terminals SGT protrude are different. For this reason, the width of the emitter terminal ET can be increased without giving a consideration to the occupying space of the signal terminal SGT. Accordingly, in accordance with the present First Embodiment, due to the fact that the occupying area of the emitter terminal ET can be sufficiently ensured, it is possible to provide a high-performance semiconductor device PAC1 capable of supporting a large current, and also contributing to the reduction of the power consumption due to the resistance reduction.

Then, the second advantage resides in the following point: as shown in FIG. 13A, the emitter terminals ET and the signal terminals SGT are arranged at the sides opposite each other; accordingly, the wires W can be arranged without being restricted by the layout position of the clip CLP. For example, in FIG. 13A, the anode electrode pad ADP at the front surface of the semiconductor chip CHP2 including a diode formed therein, and the emitter electrode pad EP at the front surface of the semiconductor chip CHP1 including an IGBT formed therein are electrically coupled with the emitter terminals ET arranged on the side S1 side of the sealing body MR via the clip CLP. On the other hand, a plurality of electrode pads formed at the front surface of the semiconductor chip CHP1 are electrically coupled with the signal terminals SGT arranged on the side S2 side of the sealing body MR via the wires W, respectively. Therefore, the emitter terminals ET are arranged on the side S1 side, and the signal terminals SGT are arranged on the side S2 side. Accordingly, the clip CLP to be coupled with the emitter terminals ET and the wires W to be coupled with the signal terminals SGT, respectively, can be arranged without mutual restriction.

Particularly, at the semiconductor chip CHP1, the emitter electrode pad EP is arranged on the side S1 side, and a plurality of electrode pads are arranged on the side S2 side. By the synergistic effect with such a layout configuration of the emitter electrode pad EP and a plurality of electrode pads, it is possible to arrange the clip CLP and the wires W without mutual restriction as shown in FIG. 13A. This means that the length of each wire W can be shortened by, for example, reducing the distance between the signal terminals SGT and the plurality of electrode pads. As a result, the parasitic inductance present in the wire W can be reduced, which can improve the stability of the circuit operation.

Further, a third advantage resides in the following point: as shown in FIG. 13B, the leads (the emitter terminal ET and the signal terminal SGT) protrude from the opposite sides of the sealing body MR; this results in the improvement of the mounting stability when the semiconductor device PAC1 is mounted on a wiring board. Particularly, for the semiconductor device PAC1 in the present First Embodiment, each lead protruding from the sealing body MR is processed into a gull-wing shape, and an electric coupling with the terminal of the wiring board is established by the processed lead. Therefore, in the case of the structure in which the leads protrude from the opposite sides of the sealing body MR, the balance is good, which improves the mounting stability of the semiconductor device PAC1 onto a wiring board. As a result, it is possible to improve the positional precision for mounting of the semiconductor device PAC1 and to improve the solder coupling reliability.

Subsequently, a fourth advantage becomes noticeable particularly for uses of a large current of several hundreds amperes. For example, in FIGS. 13A and 13B, in the semiconductor device PAC1 in the present First Embodiment, a large current flows through a current path of from the collector terminal CT which is the second surface of the chip mounting portion TAB through the IGBT formed in the inside of the semiconductor chip CHP1, the emitter electrode pad EP formed at the front surface of the semiconductor chip CHP1, and the clip CLP to the emitter terminals ET. Herein, by the Ampere's law, when a current flows, a magnetic field is necessarily generated around the current. The intensity of the magnetic field increases with an increase in magnitude of the current. Therefore, the larger the magnitude of the current to be passed is, the larger the resulting magnetic field becomes. At this step, when the signal terminals SGT are present in the vicinity of the emitter terminal ET through which a large current flows, the signal terminals SGT are affected by the magnetic field. Specifically, the electromagnetic induction noise caused by the generated magnetic field is applied to the signal terminals SGT. In this case, particularly, when the gate terminal GT of the signal terminals SGT is applied with the electromagnetic induction noise, for example, a voltage equal to, or larger than a set value is applied to the gate electrode of the IGBT. As a result, the IGBT may be crashed. Further, at other signal terminals SGT than the gate terminal GT, superimposition of noises may cause malfunctions of the current detecting circuit, the temperature detecting circuit, and the like. In other words, when the signal terminals SGT are arranged in the vicinity of the emitter terminal ET through which a large current flows, the electromagnetic induction noise is also increased by the large magnetic field caused by the large current. This adversely affects the signal terminals SGT. In other words, the signal terminal SGT is the path for transmitting a weak current signal or voltage signal therethrough. For this reason, it is necessary to minimize the effect of the electromagnetic induction noise due to the intense magnetic field with a large current.

In this regard, for the semiconductor device PAC1 in the present First Embodiment, according to the foregoing first feature, the emitter terminal ET through which a large current flows and the signal terminals SGT through which weak signals are transmitted are arranged at the sides opposite each other, and are arranged so as to be farthest apart from each other. Therefore, in accordance with the present First Embodiment, it is possible to prevent the occurrence of the following: a large current flows through the emitter terminal ET, and the electromagnetic induction noise caused by the large current adversely affects the signal terminals SGT. This means that, in accordance with the present First Embodiment, the semiconductor device PAC1 can be improved in reliability even in the case of supporting a large current. This point is the fourth advantage resulting from the first feature.

Further, a fifth advantage resides in that the signal terminals SGT can also be arranged along the side S2 of the sealing body MR. For example, in the semiconductor device PAC1 in the present First Embodiment, as the signal terminals SGT, there are used the gate terminal GT, the temperature detecting terminal TCT, the temperature detecting terminal TAT, the current detecting terminal SET, and the Kelvin terminal KT; and addition of still other signal terminals SGT also becomes easy. In other words, in accordance with the first feature of the present First Embodiment, from the viewpoint of further enhancing the performances and the reliability, it also becomes easy to achieve multi-functional capability by addition of signal terminals SGT.

Then, the second feature in the present First Embodiment resides in the following point: for example, as shown in FIG. 13A, in plan view, the semiconductor chip CHP2 including a diode formed therein is mounted over the first surface of the chip mounting portion TAB in such a manner as to be situated between emitter terminals ET and the semiconductor chip CHP1 including an IGBT formed therein. In other words, the second feature in the present First Embodiment resides in that the semiconductor chip CHP2 including a diode formed therein is arranged in such a manner as to be closer to the emitter terminals ET than the semiconductor chip CHP1 including an IGBT formed therein.

As a result, the following advantages can be obtained. Namely, in the present First Embodiment, the diode has a function of passing therethrough a reflux current for releasing the electric energy accumulated in the inductance included in the load. At this step, the reflux current from the load flows into the diode formed at the semiconductor chip CHP2 via the emitter terminal ET. In this case, for example, when the distance between the emitter terminal ET and the semiconductor chip CHP2 including a diode formed therein increases, the parasitic inductance of the wire coupling the emitter terminal ET and the diode increases. As a result, the parasitic inductance of the wire inhibits the flow of the reflux current from the emitter terminal ET into the diode. In other words, the parasitic inductance has a function of minimizing the possibility of occurrence of a change in current. Accordingly, for example, the parasitic inductance inhibits the reflux current from starting to flow from the emitter terminal ET to the diode. Therefore, an increase in parasitic inductance of the wire coupling the emitter terminal ET and the diode makes it difficult for the reflux current to flow to the diode.

This indicates as follows: even when a diode is provided in order to pass a reflux current therethrough, an increase in parasitic inductance of the wire coupling the emitter terminal ET and the diode inhibits the sufficient exertion of the function as a free wheel diode. For this reason, desirably, the length of the wire coupling the emitter terminal ET and the diode is minimized, thereby to reduce the parasitic inductance of the wire.

In this regard, in the present First Embodiment, the semiconductor chip CHP2 including a diode formed therein is arranged in such a manner as to be closer to the emitter terminal ET. Accordingly, the length of the wire coupling the emitter terminal ET and the diode is shortened. As a result, it is possible to reduce the parasitic inductance of the wire. Resultantly, in accordance with the present First Embodiment, a reflux current becomes more likely to flow from the emitter terminal ET to the diode, which enables the sufficient exertion of the function as a free wheel diode. In consequence, in accordance with the present First Embodiment, it becomes easy for the reflux current to flow to the diode formed at the semiconductor chip CHP2. For this reason, the IGBT can be protected effectively.

Subsequently, the third feature in the present First Embodiment resides in the following point: for example, as shown in FIG. 13A, the semiconductor chip CHP1 including an IGBT formed therein, and the semiconductor chip CHP2 including a diode formed therein are each in a rectangular shape; and the semiconductor chip CHP1 and the semiconductor chip CHP2 are arranged so that the long sides of the rectangular shape extend in parallel with the side S1 and the side S2 of the sealing body MR extending in the x direction. As a result, the width of the clip CLP in the x direction can be increased, which allows a large current to be supported. Further, an increase in width of the clip CLP in the x direction can reduce the resistance of the clip CLP. As a result, it is also possible to reduce the coupling resistance between the emitter terminals ET and the semiconductor chip CHP1, and the semiconductor chip CHP2.

In other words, in the present First Embodiment, the planar shapes of the semiconductor chip CHP1 and the semiconductor chip CHP2 are each formed in a rectangular shape. As a result, the semiconductor chip CHP1 and the semiconductor chip CHP2 each have large-length long sides. Then, in the present First Embodiment, the semiconductor chip CHP1 and the semiconductor chip CHP2 are arranged so that the large-length long sides cross with the protrusion direction (y direction) of the emitter terminals ET. As a result, when the clip CLP is arranged so as to be along the protrusion direction (y direction) of the emitter terminals ET, the width of the clip CLP in the x direction can be increased by the length equivalent to the length of the large-length long side. This means that, in accordance with the present First Embodiment, the width in the x direction of not only the emitter terminals ET arranged along the side S1 of the sealing body MR, but also the clip CLP can be increased. As a result, in accordance with the present First Embodiment, it is possible to ensure the wide current path extending from the clip CLP to the emitter terminal ET. This allows the semiconductor device PAC1 in the present First Embodiment to support a large current, and can reduce the ON resistance.

Further, in the present First Embodiment, in connection with the third feature, the semiconductor chip CHP1 and the semiconductor chip CHP2 are arranged so that the short sides of the semiconductor chip CHP1 and the semiconductor chip CHP2 each in a rectangular shape are in parallel with the protrusion direction (y direction) of the emitter terminal ET. As a result, in accordance with the present First Embodiment, it is possible to shorten the distance in the y direction between the semiconductor chip CHP1 including an IGBT formed therein and the emitter terminal ET. In other words, it is possible to shorten the length in the y direction of the clip CLP coupling the semiconductor chip CHP1 including an IGBT formed therein and the emitter terminal ET. This indicates as follows: in accordance with the present First Embodiment, it is possible to reduce the distance between the semiconductor chip CHP1 including an IGBT formed therein and the emitter terminal ET. For this reason, it is possible to reduce the ON resistance of the semiconductor device PAC1.

From the description up to this point, in accordance with the third feature in the present First Embodiment, it is assumed that the planar shapes of the semiconductor chip CHP1 and the semiconductor chip CHP2 are each formed in a rectangular shape. Then, the rectangular long sides are arranged along the x direction orthogonal to the y direction which is the direction of flow of the current. As a result, it is possible to increase the width in the x direction (direction orthogonal to the direction of flow of the current) of the clip CLP. On the other hand, the rectangular short sides are arranged along the y direction which is the direction of flow of the current. Accordingly, it is possible to shorten the length in the y direction (the length in the direction of flow of the current) of the clip CLP. Namely, in accordance with the third feature of the present First Embodiment, it is possible to increase the width in the x direction orthogonal to the direction of flow of the current of the clip CLP. In addition, it is possible to shorten the length in the y direction which is the direction of flow of the current. Accordingly, it is possible to sufficiently reduce the ON resistance of the semiconductor device PAC1.

Then, the fourth feature in the present First Embodiment resides in the following point: for example, as shown in FIG. 13A, there are formed through holes TH penetrating from the first surface to the second surface of the chip mounting portion TAB; and a part of the sealing body MR is filled in each through hole TH. In other words, in the present First Embodiment, the plane area of the chip mounting portion TAB is larger than the total plane area of the semiconductor chip CHP1 and the semiconductor chip CHP2. Then, in plan view, in the portion of the chip mounting portion TAB at which the semiconductor chip CHP1 and the semiconductor chip CHP2 do not overlap each other, there are formed through holes TH. A part of the sealing body MR is filled in each of the through holes TH.

As a result, in accordance with the present First Embodiment, the adhesion strength between the sealing body MR and the chip mounting portion TAB can be improved by the anchor effect resulting from a part of the sealing body MR filled in each through hole TH. In other words, while the sealing body MR is formed of a resin, the chip mounting portion TAB is formed of a metal material, and the sealing body MR and the chip mounting portion TAB are formed of different materials. This may cause peeling between the sealing body MR and the chip mounting portion TAB. In this regard, in accordance with the fourth feature of the present First Embodiment, through holes TH are formed in the chip mounting portion TAB. A resin forming the sealing body MR is filled in the insides of the through holes TH. In this case, the anchor effect resulting from the resin filled in the through holes TH improves the adhesion strength between the chip mounting portion TAB and the sealing body MR. For this reason, it is possible to inhibit peeling between the chip mounting portion TAB and the sealing body MR in the present First Embodiment. As a result, it is possible to effectively prevent the penetration of foreign matters or moisture into the inside of the semiconductor device PAC1 due to peeling between the chip mounting portion TAB and the sealing body MR. From the description up to this point, in accordance with fourth feature in the present First Embodiment, it is possible to improve the reliability of the semiconductor device PAC1.

Subsequently, a fifth feature in the present First Embodiment resides in the following point: for example, as shown in FIG. 13B, the thickness of the chip mounting portion TAB is larger than the thickness of the lead forming the emitter terminal ET or the signal terminal SGT, and the second surface (bottom surface) of the chip mounting portion TAB is exposed from the sealing body MR. As a result, first, the second surface of the chip mounting portion TAB is exposed from the sealing body MR. Accordingly, it is possible to improve the heat radiation efficiency of the semiconductor device PAC1. Further, in accordance with the present First Embodiment, the thickness of the chip mounting portion TAB is large. Accordingly, also from this point, it is possible to improve the heat radiation efficiency of the semiconductor device PAC1. Further, the thickness of the chip mounting portion TAB being large means that the volume of the chip mounting portion TAB is large. This means that the heat capacity of the chip mounting portion TAB is increased thereby. As a result, it is possible to suppress the temperature rise of the semiconductor device PAC1. Namely, with the semiconductor device PAC1 in the present First Embodiment, by the synergistic effect of the point that the chip mounting portion TAB is exposed from the sealing body MR, and the point that the thickness of the chip mounting portion TAB is large, it is possible to improve the heat radiation efficiency and to increase the heat capacity. Therefore, in accordance with the semiconductor device PAC1 in the present First Embodiment, the improvement of the heat radiation efficiency and the increase in heat capacity can inhibit the temperature rise caused by heat generation. As a result, in accordance with the semiconductor device PAC1 in the present First Embodiment, it is possible to suppress crash of the element due to the increase in internal temperature. Accordingly, it is possible to improve the reliability of the semiconductor device PAC1.

Incidentally, in the semiconductor device PAC1 in the present First Embodiment, the second surface of the chip mounting portion TAB is exposed from the sealing body MR, and the exposed surface also functions as a collector terminal CT. Thus, in the present First Embodiment, the chip mounting portion TAB has not only the function of mounting the semiconductor chip CHP1 and the semiconductor chip CHP2 thereover, but also additionally, a function as a heat spreader for improving the heat radiation efficiency, and a function as the collector terminal CT.

Modified Example 1

Figure 14:
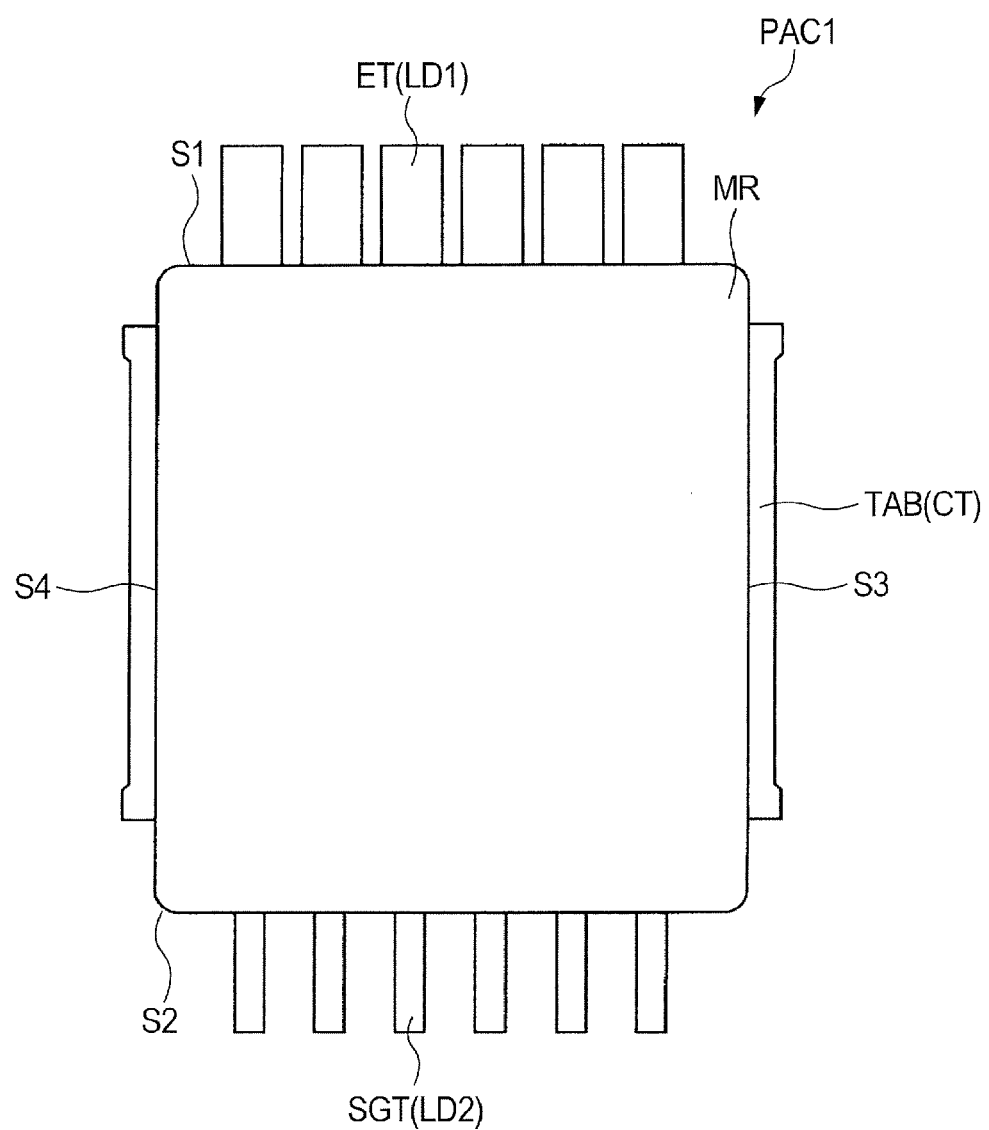
FIG. 14 is a plan view showing the outside configuration of a semiconductor device in Modified Example 1.

Then, a description will be given to Modified Example 1 of the semiconductor device PAC1 in the present First Embodiment. FIG. 14 is a plan view showing the outside configuration of the semiconductor device PAC1 in the present Modified Example 1. Whereas, FIGS. 15A and 15B are each a view showing the internal structure of the sealing body MR of the semiconductor device PAC1 in the present Modified Example 1, wherein FIG. 15A corresponds to a plan view, and FIG. 15B corresponds to the cross sectional view along line A-A of FIG. 15A.

In FIGS. 14 and 15A, the sealing body MR has a top surface, a bottom surface opposite the top surface, a first side surface situated between the top surface and the bottom surface in the thickness direction, and a second side surface opposite the first side surface. In FIGS. 14 and 15A, there is shown a side S1 forming the first side surface, and there is shown a side S2 forming the second side surface. Further, the sealing body MR has a third side surface crossing with the first side surface and the second side surface, and a fourth side surface crossing with the first side surface and the second side surface, and opposite the third side surface. In FIG. 14 and FIG. 15A, there is shown a side S3 forming the third side surface, and there is shown a side S4 forming the fourth side surface.

Herein, the feature of the semiconductor device PAC1 of the present Modified Example 1 resides in that portions of the chip mounting portion TAB protrude from the side surfaces of the sealing body MR. In other words, the feature of the present Modified Example 1 resides in that portions of the chip mounting portion TAB protrude from the third side surface and the fourth side surface of the sealing body MR.

As a result, in accordance with the present Modified Example 1, it is possible to obtain the following advantage. For example, in a test step of measuring a large current, or the like, a test terminal can be brought in contact with a part of the chip mounting portion TAB1 protruding from the side surface of the sealing body MR. Accordingly, it is possible to improve the contactability in the test step.

Further, for the semiconductor device PAC1 in the present Modified Example 1, portions of the chip mounting portion TAB protrude from the sealing body MR, resulting in the reduction of the size of the sealing body MR itself. This means that the package size (size of the sealing body MR) of the semiconductor device PAC1 in the present Modified Example 1 is reduced. As a result, it is possible to reduce the mounting area of the semiconductor device PAC1.

Further, in the present Modified Example 1, portions of the chip mounting portion TAB protrude and are exposed from the side surfaces of the sealing body MR. Accordingly, solder fillets can be formed at the portions. In other words, in accordance with the semiconductor device PAC1 in the present Modified Example 1, not only the emitter terminals ET and the signal terminals SGT, but also the protruding portions of the chip mounting portion TAB can be coupled with a wiring board by solder. For this reason, it is possible to improve the mounting reliability of the semiconductor device PAC1 to the wiring board. In this regard, further, it is also possible to improve the outside visibility of soldering in mounting of the semiconductor device PAC1.

Modified Example 2

Figure 16:
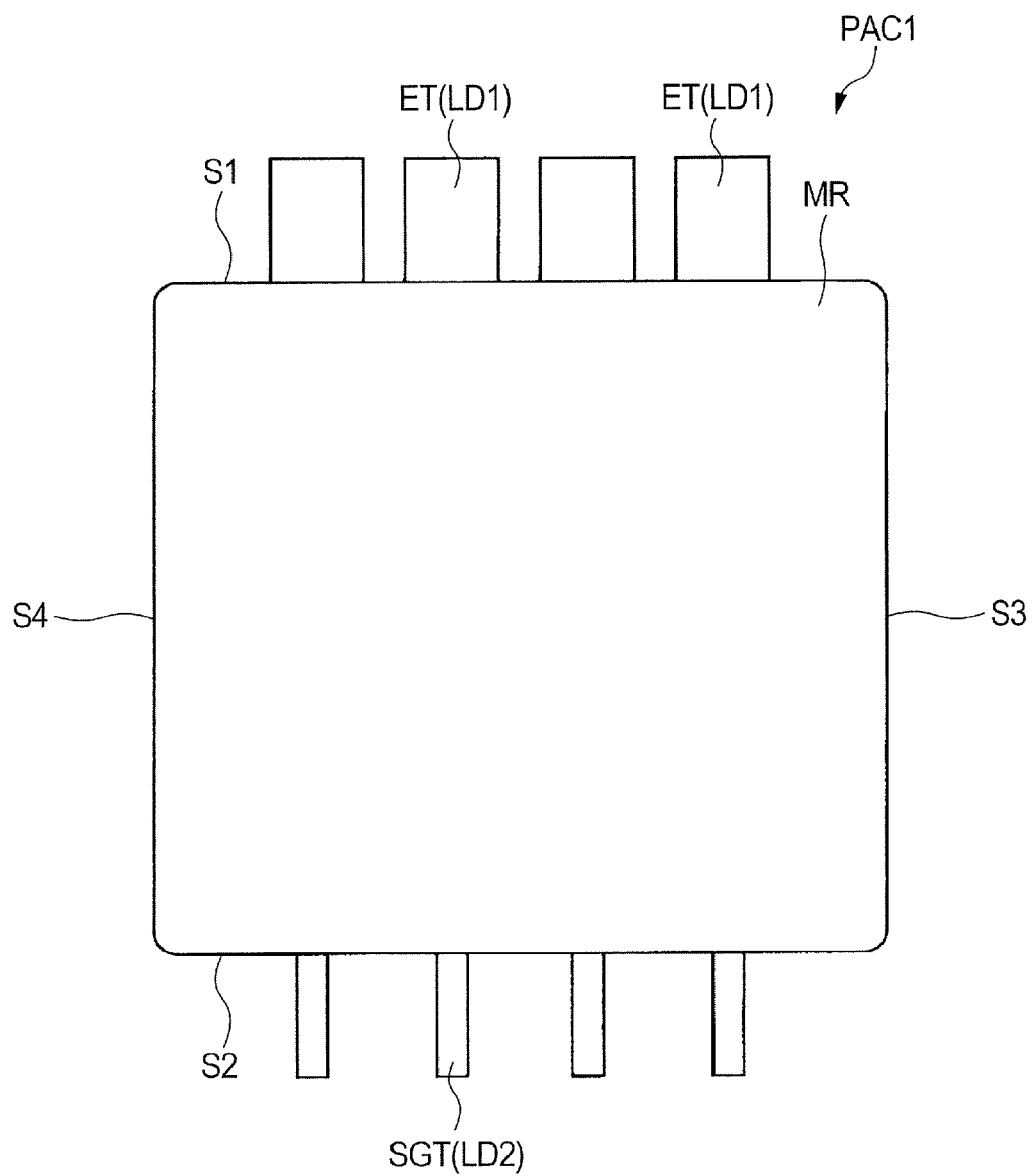
FIG. 16 is a plan view showing the outside configuration of a semiconductor device in Modified Example 2.

Subsequently, a description will be given to Modified Example 2 of the semiconductor device PAC1 in the present First Embodiment. FIG. 16 is a plan view showing the outside configuration of the semiconductor device PAC1 in the present Modified Example 2. Further, FIGS. 17A and 17B are views each showing the internal structure of the sealing body MR of the semiconductor device PAC1 in the present Modified Example 2, wherein FIG. 17A corresponds to a plan view, and FIG. 17B corresponds to a cross sectional view along line A-A of FIG. 17A.

Figures 17A, 17B:
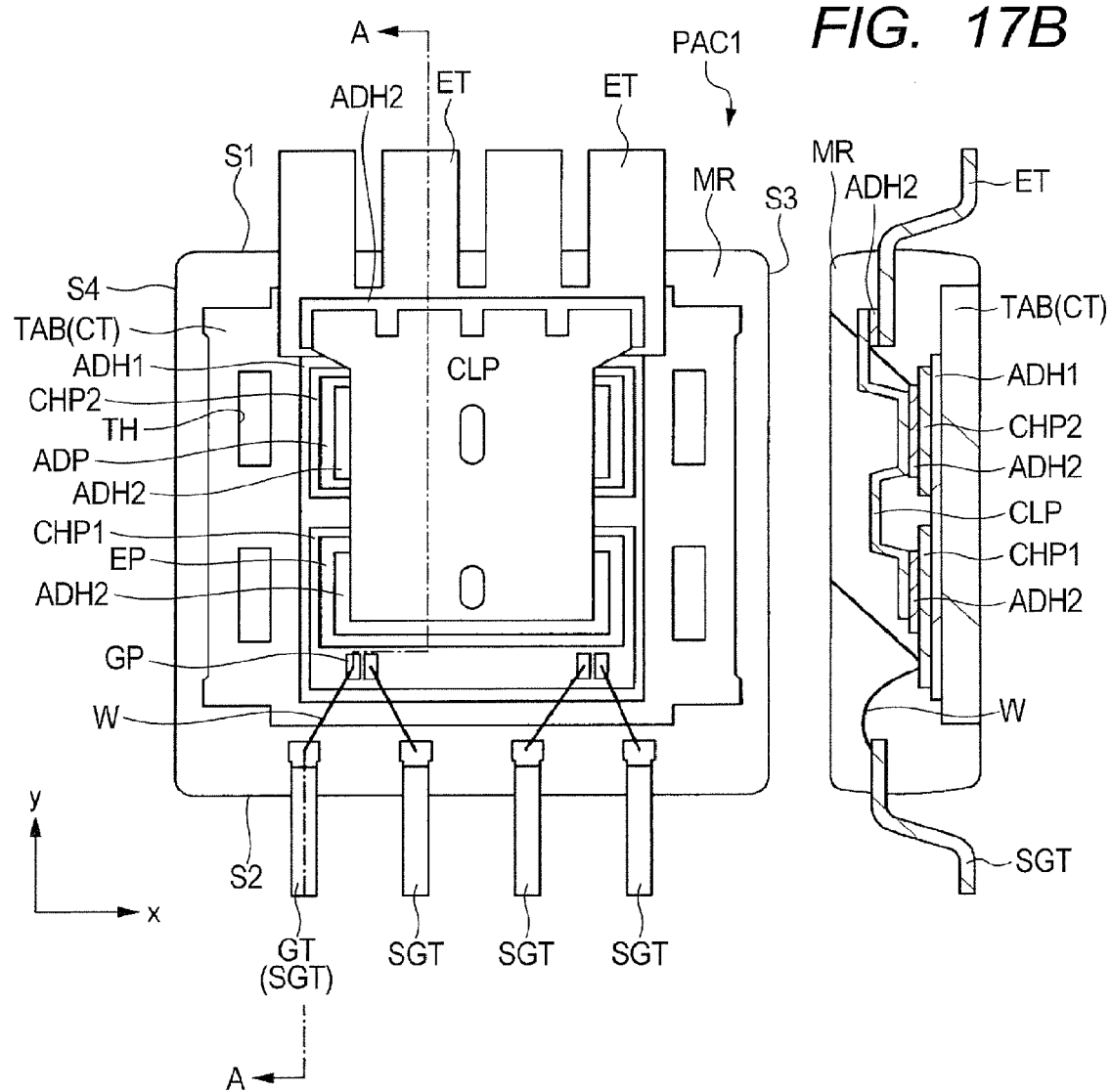

Herein, the feature of the semiconductor device PAC1 in the present Modified Example 2 resides in that, as shown in FIGS. 16 and 17A, respective numbers of the emitter terminals ET and the signal terminals SGT are reduced. As a result, the configuration of the semiconductor device PAC1 can be simplified, and the manufacturing cost can also be reduced. In other words, for the semiconductor chip CHP1 including an IGBT formed therein, when the functions may be reduced, the number of the signal terminals SGT can be reduced. Further, in the present Modified Example 2, the number of the emitter terminals ET is reduced. However, an increase in respective widths of the emitter terminals ET allows a large current to be supported.

Incidentally, in the semiconductor device PAC1 in First Embodiment shown in FIG. 12 and FIGS. 13A and 13B, the semiconductor device PAC1 in Modified Example 1 shown in FIG. 14 and FIGS. 15A and 15B, and the semiconductor device PAC1 in Modified Example 2 shown in FIG. 16 and FIGS. 17A and 17B, the number of the emitter terminals ET is equal to the number of the signal terminals SGT. However, not limited to this, the number of the emitter terminals ET may be larger than, or smaller than the number of the signal terminals SGT. Further, the width of the emitter terminal ET can be appropriately set according to the magnitude of the current to be passed through the semiconductor device PAC1.

Configuration of Electronic Device in First Embodiment

The semiconductor device in the present First Embodiment is obtained by integrating one IGBT Q1 and one diode FWD to be constituent elements of the inverter circuit INV shown in FIG. 3 into one package. This indicates that six semiconductor devices in the present First Embodiment are used to form an electronic device (power module) to be a three-phase inverter circuit INV. Below, the configuration of the electronic device will be described by reference to the accompanying drawings.

Figure 18A:
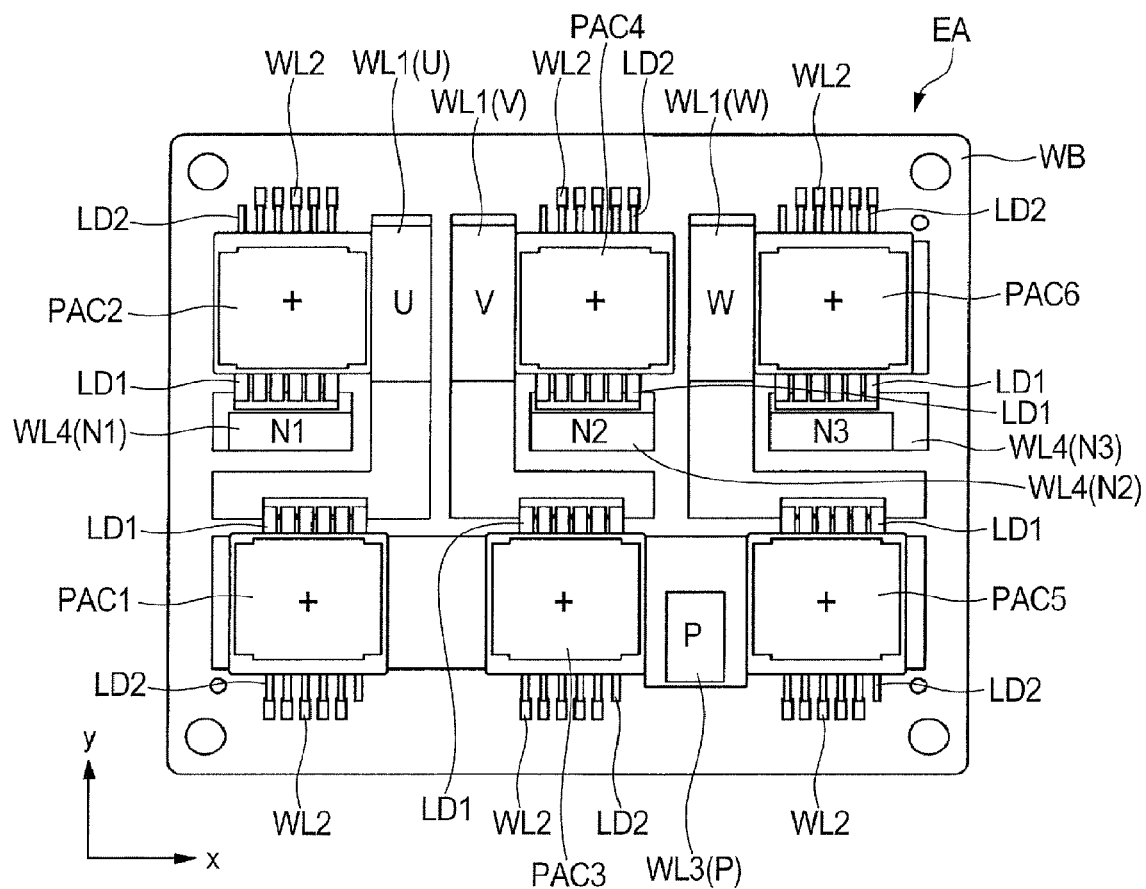
Figure 18B:
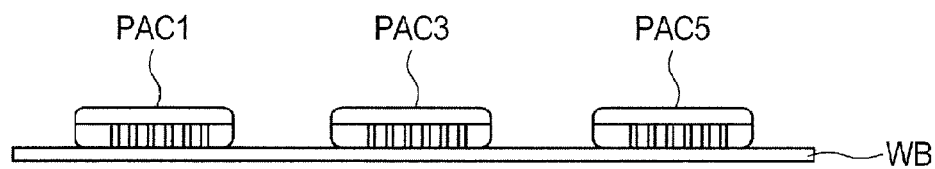

FIGS. 18A and 18B are views each showing the configuration of an electronic device EA in the present First Embodiment. Particularly, FIG. 18A is a plan view showing the configuration of the electronic device EA in the present First Embodiment, and FIG. 18B is a side view as seen from the bottom side of the paper plane of FIG. 18A.

As shown in FIG. 18A, the electronic device EA in the present First Embodiment includes a wiring board WB. Over the wiring board WB, there are mounted six semiconductor devices PAC1 to PAC6.

The wiring board WB is formed of, for example, an IMS: Insulated Metal Substrate. The insulated metal substrate includes a resin insulation layer formed over an Al base formed of, for example aluminum, and has copper foil forming wiring over the resin insulation layer. Then, the six semiconductor devices PAC1 to PAC6 are coupled by wiring formed of copper foil formed at the surface of the insulated metal substrate and solder. In the present First Embodiment, by using an insulated metal substrate as the wiring board WB, the heat resistance can be reduced. This is due to the following fact; in accordance with the insulated metal substrate, the resin insulation layer is thin, and the Al base having a high heat conductivity is thick, and hence it is possible to improve the heat radiation efficiency. As a result, it is possible to suppress the temperature rise of the electronic device EA in the present First Embodiment. This enables the improvement of the reliability of the electronic device EA.

In the electronic device EA in the present First Embodiment, for example, as shown in FIG. 18A, the semiconductor device PAC1 and the semiconductor device PAC2 are arranged in such a manner as to be arrayed in the y direction; the semiconductor device PAC3 and the semiconductor device PAC4 are arranged in such a manner as to be arrayed in the y direction; and the semiconductor device PAC5 and the semiconductor device PAC6 are arranged in such a manner as to be arrayed in the y direction.

In this case, the semiconductor device PAC1 forms the upper arm of the first leg LG1 shown in FIG. 3, and the semiconductor device PAC2 forms the lower arm of the first leg LG1 shown in FIG. 3. Similarly, the semiconductor device PAC3 forms the upper arm of the second leg LG2 shown in FIG. 3, and the semiconductor device PAC4 forms the lower arm of the second leg LG2 shown in FIG. 3. Further, the semiconductor device PAC5 forms the upper arm of the third leg LG3 shown in FIG. 3, and the semiconductor device PAC6 forms the lower arm of the third leg LG3 shown in FIG. 3.

Then, for example, as shown in FIG. 18A or FIG. 18B, the semiconductor device PAC1, the semiconductor device PAC3, and the semiconductor device PAC5 are arranged in such a manner as to be arrayed in the x direction. The semiconductor device PAC2, the semiconductor device PAC4, and the semiconductor device PAC6 are arranged in such a manner as to be arrayed in the x direction. Therefore, in the electronic device EA in the present First Embodiment, the three semiconductor devices PAC1, PAC3, and PAC5 arranged side by side along the x direction on the bottom side of the wiring board WB become the constituent elements of respective upper arms of the first leg LG1 to the third leg LG3, respectively. On the other hand, the three semiconductor devices PAC2, PAC4, and PAC6 arranged side by side along the x direction on the top side of the wiring board WB become the constituent elements of respective lower arms of the first leg LG1 to the third leg LG3, respectively.

In this case, for example, attention is given to the semiconductor device PAC1 and the semiconductor device PAC2. Then, in plan view, the semiconductor device PAC1 and the semiconductor device PAC2 are arranged along the y direction so that respective leads LD1 are opposite each other. Similarly, the semiconductor device PAC3 and the semiconductor device PAC4 are arranged along the y direction so that respective leads LD1 are opposite each other. In addition, the semiconductor device PAC5 and the semiconductor device PAC6 are also arranged along the y direction so that respective leads LD1 are opposite each other.

On the other hand, for example, attention is given to the semiconductor device PAC1, the semiconductor device PAC3, and the semiconductor device PAC5 arrayed in the x direction. Then, in plan view, the semiconductor device PAC1, the semiconductor device PAC3, and the semiconductor device PAC5 are arranged along the x direction so that respective leads LD1 point in the same direction (+y direction). Similarly, in plan view, the semiconductor device PAC2, the semiconductor device PAC4, and the semiconductor device PAC6 are arranged along the x direction so that respective leads LD1 point in the same direction (−y direction).

Herein, for example, as shown in FIG. 18A, the leads LD1 (emitter terminals) of the semiconductor device PAC1 protruding in the +y direction in the y direction which is a first direction are electrically coupled with a wire WL1 (U) of the wiring board WB. On the other hand, the leads LD2 (signal terminals) of the semiconductor device PAC1 protruding in the −y direction are electrically coupled with a wire WL2 of the wiring board WB. Then, the bottom surface (collector terminal) of the semiconductor device PAC1 is electrically coupled with a wire WL3 (P) extending in the x direction orthogonal to the y direction of the wiring board WB.

Whereas, in FIG. 18A, the wire WL1 (U) formed at the wiring board WB is electrically coupled with the bottom surface (collector terminal) of the semiconductor device PAC2. Then, the leads LD2 (signal terminals) of the semiconductor device PAC2 protrude in the +y direction, and are electrically coupled with the wire WL2 of the wiring board WB. Further, the leads LD1 (emitter terminals) of the semiconductor device PAC2 protrude in the −y direction, and are electrically coupled with the wire WL4 (N1) of the wiring board WB.

Further, in FIG. 18A, the wire WL3 (P) of the wiring board WB is electrically coupled with the bottom surface (collector terminal) of the semiconductor device PAC3. Then, the leads LD1 (emitter terminals) of the semiconductor device PAC3 protrude in the +y direction, and are electrically coupled with the wire WL1 (V) of the wiring board WB. Further, the leads LD2 (signal terminals) of the semiconductor device PAC3 protrude in the −y direction, and are electrically coupled with the wire WL2 of the wiring board WB.

Further, in FIG. 18A, the wire WL1 (V) formed at the wiring board WB is electrically coupled with the bottom surface (collector terminal) of the semiconductor device PAC4. Then, the leads LD2 (signal terminals) of the semiconductor device PAC4 protrude in the +y direction, and are electrically coupled with the wire WL2 of the wiring board WB. Further, the leads LD1 (emitter terminals) of the semiconductor device PAC4 protrude in the −y direction, and are electrically coupled with the wire WL4 (N2) of the wiring board WB.

Further, in FIG. 18A, the wire WL3 (P) of the wiring board WB is electrically coupled with the bottom surface (collector terminal) of the semiconductor device PAC5. Then, the leads LD1 (emitter terminals) of the semiconductor device PAC5 protrude in the +y direction, and are electrically coupled with the wire WL1 (W) of the wiring board WB. Whereas, the leads LD2 (signal terminals) of the semiconductor device PAC5 protrude in the −y direction, and are electrically coupled with the wire WL2 of the wiring board WB.

Further, in FIG. 18A, the wire WL1 (W) formed at the wiring board WB is electrically coupled with the bottom surface (collector terminal) of the semiconductor device PAC6. Then, the leads LD2 (signal terminals) of the semiconductor device PAC6 protrude in the +y direction, and are electrically coupled with the wire WL2 of the wiring board WB. Whereas, the leads LD1 (emitter terminals) of the semiconductor device PAC6 protrude in the −y direction, and are electrically coupled with the wire WL4 (N3) of the wiring board WB.

Incidentally, the wire WL1 (U) shown in FIG. 18A is electrically coupled with the U phase of the three-phase induction motor MT shown in FIG. 3. The wire WL1 (V) shown in FIG. 18A is electrically coupled with the V phase of the three-phase induction motor MT shown in FIG. 3. Whereas, the wire WL1 (W) shown in FIG. 18A is electrically coupled with the W phase of the three-phase induction motor MT shown in FIG. 3. The wire WL2 shown in FIG. 18A is electrically coupled with the control circuits including the gate control circuit GC shown in FIG. 3, and a current detecting circuit and a temperature detecting circuit not shown, and the like. Further, the wire WL3 (P) shown in FIG. 18A is electrically coupled with the positive potential terminal PT shown in FIG. 3. The wire WL4 (N1), the wire WL4 (N2), and the wire WL4 (N3) shown in FIG. 18A are electrically coupled with the negative potential terminal NT shown in FIG. 3. This indicates that the electronic device EA (power module) in the present First Embodiment has a mounting configuration so as to thus form the three-phase inverter circuit INV.

Figure 19A:
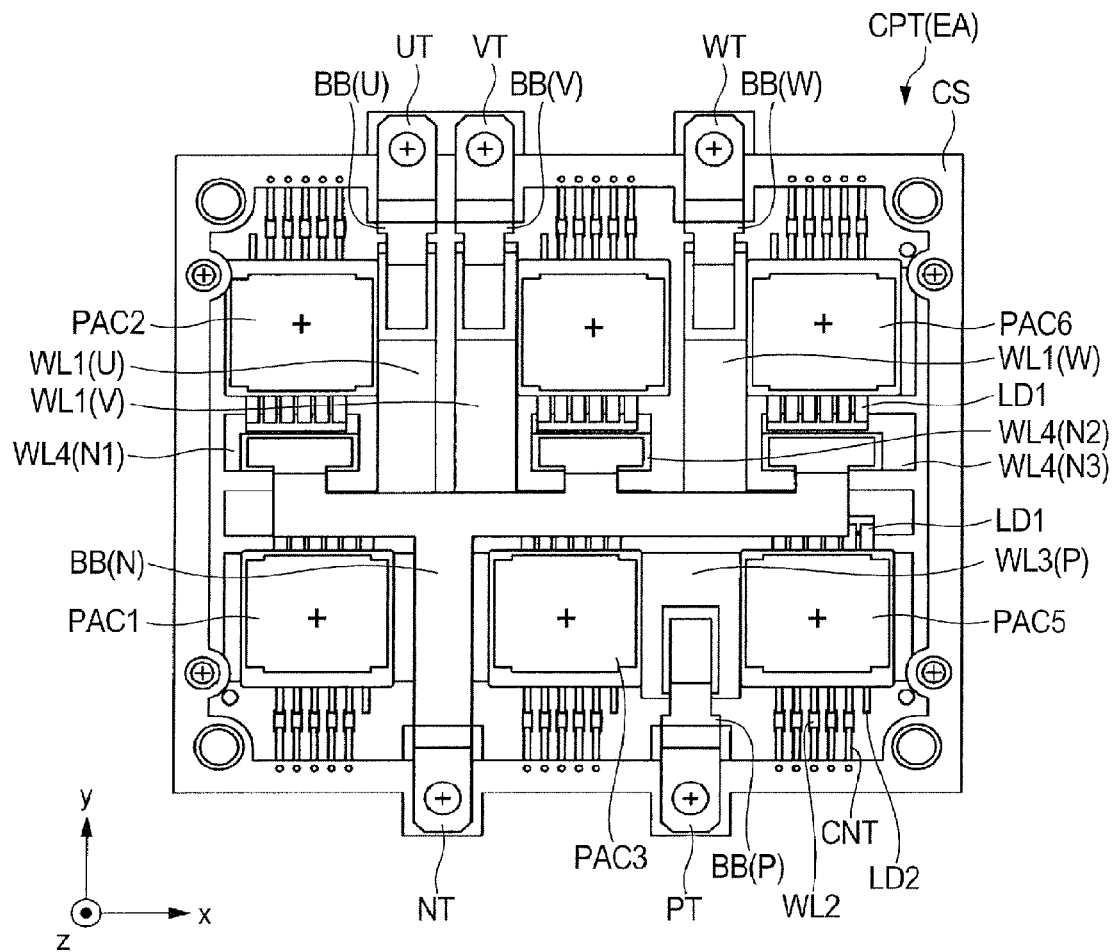
Figure 19B:
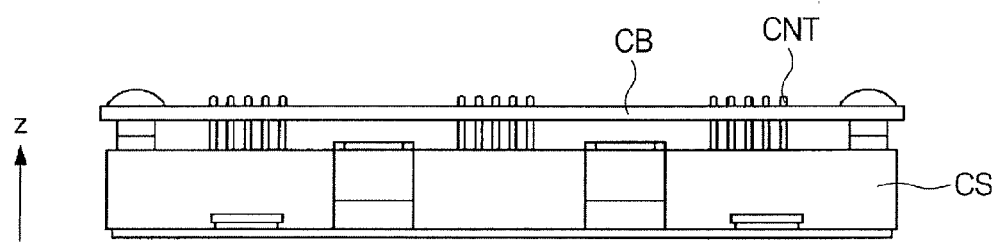

Then, FIGS. 19A and 19B are views each showing a finished product CPT in which the electronic device EA shown in FIG. 18 is mounted in a resin case CS. Particularly, FIG. 19A is a plan view showing the configuration of the finished product CPT, and FIG. 19B is a side view as seen from the bottom side of the paper plane of FIG. 19A.

As shown in FIGS. 19A and 19B, the finished product CPT has a configuration in which the electronic device EA is mounted in the resin case CS. Then, in FIG. 19A, the wire WL1 (U) is coupled with the terminal UT via a bus bar BB (U), and the wire WL1 (V) is coupled with the terminal VT via a bus bar BB (V). Whereas, the wire WL1 (W) is coupled with the terminal WT via a bus bar BB (W). In this case, the terminal UT is electrically coupled with the U phase of the three-phase induction motor, the terminal VT is electrically coupled with the V phase of the three-phase induction motor, and the terminal WT is electrically coupled with the W phase of the three-phase induction motor.

Further, the wire WL3 (P) is electrically coupled with the positive potential terminal PT via a bus bar BB (P). Whereas, the wire WL4 (N1), the wire WL4 (N2), and the wire WL4 (N3) are coupled with the negative potential terminal NT via a bus bar BB (N).

Further, the wire WL2 is coupled with a coupling terminal CNT, and the coupling terminal CNT is bent in the z direction. As a result, for example, as shown in FIG. 19B, the coupling terminal CNT bent in the z direction penetrates through the control board CB arranged above the resin case CS, and is coupled with the control board CB. As a result, for example, respective leads LD2 (signal terminals) of the semiconductor devices PAC1 to PAC6 shown in FIG. 19A are each coupled, via the wire WL2, and the perpendicularly bent coupling terminal, with the control board CB, and finally, are each electrically coupled with the control circuit including a semiconductor chip mounted over the control board CB. As a result, it is indicated that the semiconductor devices PAC1 to PAC6 is controlled by the control circuit mounted over the control board CB. Incidentally, the control board CB shown in FIG. 19B is omitted because the underlying constituent elements become invisible in FIG. 19A.

In the manner described up to this point, the electronic device EA (finished product CPT) in the present First Embodiment has achieved the mounting configuration.

Superiority to Related Art 1

Subsequently, the superiority of the semiconductor device PAC1 and the electronic device EA in the present First Embodiment will be described in comparison with Related Art 1. FIGS. 20A and 20B are views each showing the internal configuration of the sealing body MR in a semiconductor device FRA1 in Related Art 1. Particularly, FIG. 20A is a plan view showing the internal configuration of the sealing body MR in the semiconductor device FRA1 in Related Art 1, and FIG. 20B is a cross sectional view cut along line A-A of FIG. 20A.

As shown in FIG. 20A, in the semiconductor device FRA1 in Related Art 1, in plan view, the semiconductor chip CHP1 including an IGBT formed therein is mounted over the first surface of the chip mounting portion TAB in such a manner as to be situated between the emitter terminal ET and the semiconductor chip CHP2 including a diode formed therein. In other words, in the semiconductor device FRA1 in Related Art 1, the semiconductor chip CHP1 including an IGBT formed therein is arranged in such a manner as to be closer to the emitter terminal ET than the semiconductor chip CHP2 including a diode formed therein.

Then, for the semiconductor device FRA1 in Related Art 1 thus configured, as shown in FIG. 20A, along the side S1 of the sealing body MR, there are arranged the emitter terminal ET and the signal terminals SGT. Namely, in Related Art 1, the emitter terminal ET and the signal terminals SGT protrude from the same side S1.

(1) In this case, in accordance with Related Art 1, the emitter terminal ET and the signal terminals SGT are arranged along the same side. For this reason, the occupying space of the signal terminals SGT must be ensured. As a result, the width of the emitter terminal ET cannot be ensured sufficiently. Further, it is necessary to ensure the wire bonding region for coupling with the signal terminals SGT. Accordingly, it is also impossible to sufficiently ensure the width of the clip CLP to be electrically coupled with the emitter terminal ET. Thus, in Related Art 1, the width of the emitter terminal ET and the width of the clip CLP cannot be set sufficiently large, resulting in a narrow current path. As a result, with the semiconductor device FRA1 in Related Art 1, supporting of a large current of several hundreds amperes becomes difficult, and the ON resistance also increases, resulting in a difficulty in improving the performances.

In contrast, in accordance with the semiconductor device PAC1 in the present First Embodiment, as shown in FIG. 13A, the emitter terminals ET and the signal terminals SGT protrude from different sides. For this reason, in accordance with the present First Embodiment, for example, the emitter terminals ET can be arranged along the side S1 of FIG. 13A. In addition, also for the clip CLP, a consideration is not required to be given to the interference with the wire bonding region, so that the width of the clip CLP can also be increased. In other words, for the semiconductor device PAC1 in the present First Embodiment, the width of each emitter terminal ET and the width of the clip CLP can be sufficiently ensured. This enables supporting of a large current of several hundreds amperes, and can reduce the ON resistance. Accordingly, it is possible to improve the performances while supporting a large current (first superiority).

(2) Then, in Related Art 1, as shown in FIG. 20A, a plurality of electrode pads of the semiconductor chip CHP1 including an IGBT formed therein and the signal terminals SGT are electrically coupled with each other via wires W, respectively. In this case, in Related Art 1, the emitter terminal ET and the signal terminals SGT are arranged along the same side. For this reason, a plurality of electrode pads and wires W are required to be arranged so as to avoid the clip CLP to be coupled with the emitter terminal ET. Namely, in Related Art 1, the layout arrangement of a plurality of electrode pads and the arrangement of the wires W are required to be considered so as not to interfere with the clip CLP. As a result, the layout arrangement of a plurality of electrode pads and the arrangement of the wires W are restricted. Accordingly, the optimum arrangement cannot be implemented in terms of the electric characteristics and structure.

In contrast, in accordance with the semiconductor device PAC1 in the present First Embodiment, as shown in FIG. 13A, the emitter terminals ET and the signal terminals SGT protrude from different sides. For this reason, in accordance with the present First Embodiment, it is possible to freely implement the layout arrangement of a plurality of electrode pads and the arrangement of the wires W without being restricted by the arrangement of the clip CLP to be coupled with the emitter terminal ET. As a result, in accordance with the present First Embodiment, it becomes possible to arrange a plurality of electrode pads and the wires W so as to minimize the length of each wire W. This can provide an effect of implementing the optimum arrangement capable of improving the electric characteristics typified by the reduction of the parasitic inductance (second superiority).

(3) Subsequently, in Related Art 1, as shown in FIGS. 20A and 20B, the emitter terminal ET and the signal terminals SGT protrude from the same side, and leads do not protrude from the opposite side. As a result, in accordance with Related Art 1, only by the leads (emitter terminal ET and signal terminals SGT) protruding from one side of the sealing body MR, the semiconductor device FRA1 is mounted on a wiring board. This also indicates that, in the mounting state in Related Art 1, the portion on the side of the sealing body MR from which the leads do not protrude may float, resulting in a fear of the reduction of the mounting reliability. In other words, the mounting form of only one side in Related Art 1 is disadvantageous from the viewpoint of substrate mounting. From the viewpoints of the positional precision in mounting and the solder coupling reliability, there is room for improvement.

In contrast, in the semiconductor device PAC1 in the present First Embodiment, for example, as shown in FIGS. 13A and 13B, the leads (emitter terminals ET and signal terminals SGT) protrude from the opposite sides of the sealing body MR. This results in an improvement of the mounting stability in mounting of the semiconductor device PAC1 on a wiring board. In other words, in the case of the structure in which the leads protrude from the opposite sides of the sealing body MR as shown in the semiconductor device PAC1 in the present First Embodiment, the balance is good, resulting in an improvement of the mounting stability of the semiconductor device PAC1 on a wiring board. As a result, in accordance with the present First Embodiment, it is possible to improve the positional precision in mounting of the semiconductor device PAC1, and to improve the solder coupling reliability. This results in an improvement of the mounting reliability of the semiconductor device PAC1 in the present First Embodiment (third superiority).

Figure 21:
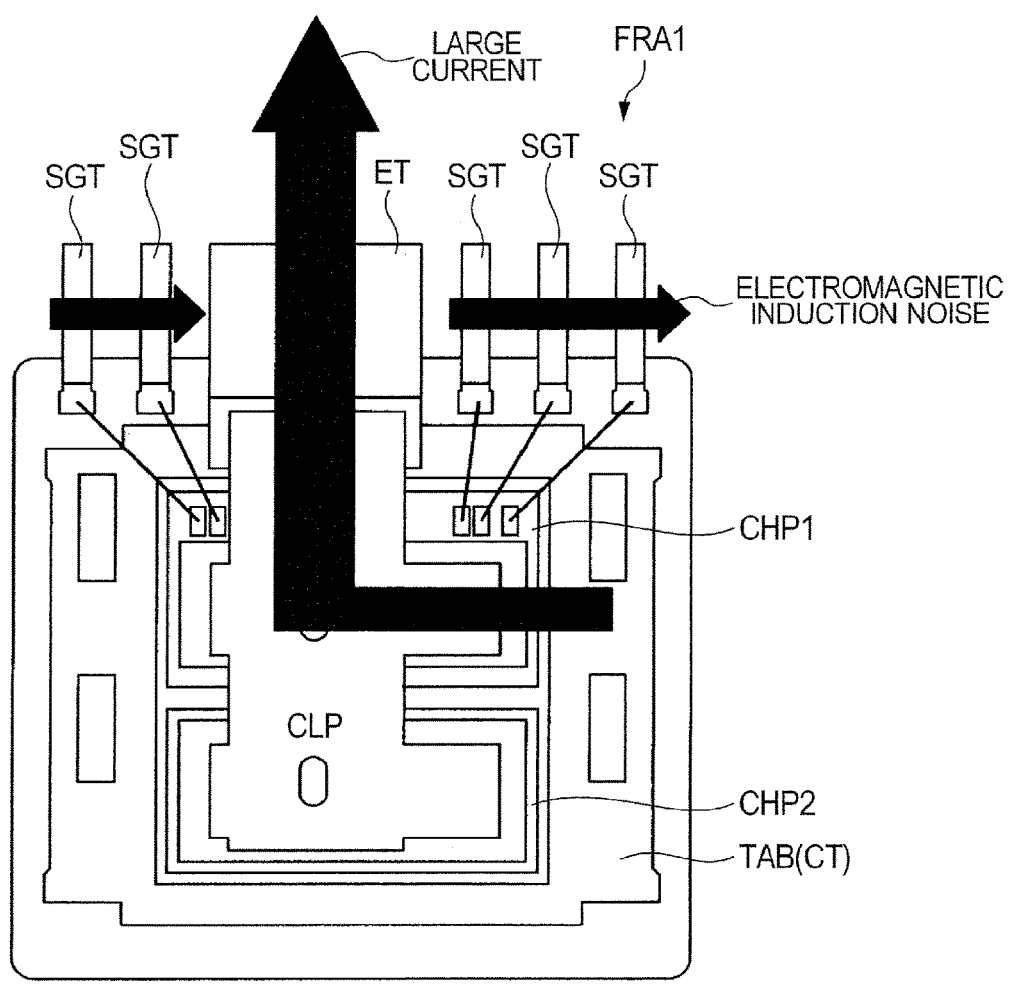
FIG. 21 is a view for illustrating the effect of the electromagnetic induction noise generated when a large current is passed in the semiconductor device of Related Art 1.

(4) Then, FIG. 21 is a view for illustrating the effect of the electromagnetic induction noise caused when a large current is passed in the semiconductor device FRA1 in Related Art 1. In FIG. 21, in the semiconductor device FRA1 in Related Art 1, a large current flows through a current path of from the collector terminal CT which is the second surface of the chip mounting portion TAB through the IGBT formed in the inside of the semiconductor chip CHP1, the emitter electrode pad EP formed at the front surface of the semiconductor chip CHP1, and the clip CLP to the emitter terminals ET. Herein, the flow of a current necessarily generates a magnetic field around the current. The intensity of the magnetic field increases with an increase in magnitude of the current. Therefore, the larger the magnitude of the current to be passed is, the larger the resulting magnetic field becomes. At this step, in Related Art 1, the emitter terminal ET and the signal terminals SGT are arranged along the same side. Accordingly, the signal terminals SGT are arranged in the vicinity of the emitter terminal ET through which a large current flows. In this case, the signal terminals SGT are affected by the magnetic field.

Specifically, as shown in FIG. 21, in Related Art 1, the signal terminals SGT are arranged in the vicinity of the emitter terminal ET. Accordingly, the electromagnetic induction noise caused by the magnetic field generated by the flow of a large current through the emitter terminal ET is applied to the signal terminals SGT. In this case, particularly, when the gate terminal GT of the signal terminals SGT is applied with the electromagnetic induction noise, for example, a voltage equal to, or larger than a set value is applied to the gate electrode of the IGBT. As a result, the IGBT may be crashed. Further, at other signal terminals SGT than the gate terminal GT, superimposition of noises may cause malfunctions of the current detecting circuit, the temperature detecting circuit, and the like. In other words, with the configuration of Related Art 1 in which the signal terminals SGT are arranged in the vicinity of the emitter terminal ET through which a large current flows, the electromagnetic induction noise is also increased by the large magnetic field caused by the large current. This adversely affects the signal terminals SGT.

In contrast, with the semiconductor device PAC1 in the present First Embodiment, for example, as shown in FIG. 13A, the emitter terminals ET through which a large current flows and the signal terminals SGT through which weak signals are transmitted are arranged at the sides opposite each other, and are arranged so as to be farthest apart from each other. Therefore, in accordance with the present First Embodiment, even when a large current flows through the emitter terminals ET, and the electromagnetic induction noise caused by a large magnetic field generated by the large current occurs, the electromagnetic induction noise can be prevented from adversely affecting the signal terminals SGT. In other words, with the semiconductor device PAC1 in the present First Embodiment, the emitter terminal ET and the signal terminals SGT are arranged at different sides opposite each other. For this reason, even when a large current is supported, it is possible to reduce the effect of the electromagnetic induction noise caused by the magnetic field generated by the large current. As a result, it is possible to improve the reliability of the semiconductor device PAC1 in the present First Embodiment (fourth superiority).

(5) Subsequently, as shown in FIG. 20A, in Related Art 1, in plan view, the semiconductor chip CHP1 including an IGBT formed therein is mounted over the first surface of the chip mounting portion TAB in such a manner as to be situated between the emitter terminal ET and the semiconductor chip CHP2 including a diode formed therein. In other words, in Related Art 1, the semiconductor chip CHP2 including a diode formed therein is arranged so as to be farther apart from the emitter terminal ET than the semiconductor chip CHP1 including an IGBT formed therein. This means that the distance between the emitter terminal ET and the semiconductor chip CHP2 including a diode formed therein becomes larger. Further, in Related Art 1, the width of the clip CLP for coupling the semiconductor chip CHP2 including a diode formed therein and the emitter terminal ET is also narrower.

In this case, the parasitic inductance of the wire for coupling the emitter terminal ET and the diode increases. As a result, the parasitic inductance of the wire may inhibit the flow of a reflux current from the emitter terminal ET to the diode. Namely, an increase in parasitic inductance of the wire for coupling the emitter terminal ET and the diode makes it difficult for a reflux current to flow to the diode.

This indicates as follows: in Related Art 1, even when a diode is provided in order to pass a reflux current therethrough, the parasitic inductance of the wire coupling the emitter terminal E and the diode increases. This may prevent the function as a free wheel diode from being sufficiently exerted.

In contrast, in the semiconductor device PAC1 in the present First Embodiment, as shown in FIG. 13A, the semiconductor chip CHP2 including a diode formed therein is arranged in such a manner as to be close to the emitter terminal ET. For this reason, the length of the wire coupling the emitter terminal ET and the diode becomes shorter. This can reduce the parasitic inductance of the wire. Further, in accordance with semiconductor device PAC1 in the present First Embodiment, the width of the clip CLP can also be set larger than that in the semiconductor device FRA1 in Related Art 1. Also from the viewpoint, it is possible to reduce the parasitic inductance of the wire coupling the emitter terminal ET and the diode.

As a result, in accordance with the semiconductor device PAC1 in the present First Embodiment, a reflux current becomes more likely to flow from the emitter terminal ET to the diode. This can allow the function as a free wheel diode to be sufficiently exerted. In other words, in accordance with the semiconductor device PAC1 in the present First Embodiment, a reflux current becomes more likely to flow to the diode formed at the semiconductor chip CHP2. For this reason, the IGBT can be effectively protected (fifth superiority).

(6) Then, as shown in FIG. 20A, in Related Art 1, the arrangement is achieved so that the semiconductor chip CHP1 including an IGBT formed therein is closer to the emitter terminal ET than the semiconductor chip CHP2 including a diode formed therein. In this case, a large current flows from the semiconductor chip CHP1 including an IGBT formed therein to the emitter terminal ET. This indicates as follows: the semiconductor chip CHP1 including an IGBT formed therein is arranged in such a manner as to be closer to the emitter terminal ET; seemingly, this can reduce the ON resistance of the current path. However, in Related Art 1, the emitter terminal ET and the signal terminals SGT are arranged at the same side (side S1), resulting in the reduction of the width of the emitter terminal ET and the width of the clip CLP. This means that the ON resistance of the path for a current to flow to the emitter terminal ET via the clip CLP increases. Namely, in Related Art 1, seemingly, the ON resistance of the current path seems to be able to be reduced. However, in actuality, it can be considered that the effect of reducing the ON resistance does not become noticeable so much.

In this regard, in the semiconductor device PAC1 in the present First Embodiment, as shown in FIG. 13A, the arrangement is achieved so that the semiconductor chip CHP1 including an IGBT formed therein is farther apart from the emitter terminal ET than the semiconductor chip CHP2 including a diode formed therein. Therefore, in accordance with the semiconductor device PAC1 in the present First Embodiment, seemingly, the ON resistance of the current path seems to increase. However, in the present First Embodiment, as shown in FIG. 13A, the emitter terminals ET and the signal terminals SGT are arranged at the sides opposite each other. The emitter terminals ET can be arranged along the side S1, and the width of the clip CLP can also be set larger than that in Related Art 1. Further, the arrangement is achieved so that the semiconductor chip CHP1 including an IGBT formed therein is farther apart from the emitter terminals ET than the semiconductor chip CHP2 including a diode formed therein. Nevertheless, the semiconductor chip CHP1 and the semiconductor chip CHP2 are each in a rectangular shape, and the direction in which the emitter terminals ET, the semiconductor chip CHP2, and the semiconductor chip CHP1 are arrayed is the short side direction. This indicates as follows: although the semiconductor chip CHP2 including a diode formed therein is arranged between the emitter terminals ET and the semiconductor chip CHP1 including an IGBT formed therein, the distance between the emitter terminals ET and the semiconductor chip CHP1 including an IGBT formed therein does not increase so much.

From the description up to this point, by comprehensively considering the point that the emitter terminals ET can be formed large along the side S1, the point that the width of the clip CLP can also be formed large, and the point that the semiconductor chip CHP1 and the semiconductor chip CHP2 are each formed in a rectangular shape, and are arrayed in the short side direction, with the semiconductor device PAC1 in the present First Embodiment, the ON resistance of the current path can be reduced (sixth superiority).

Figure 22:
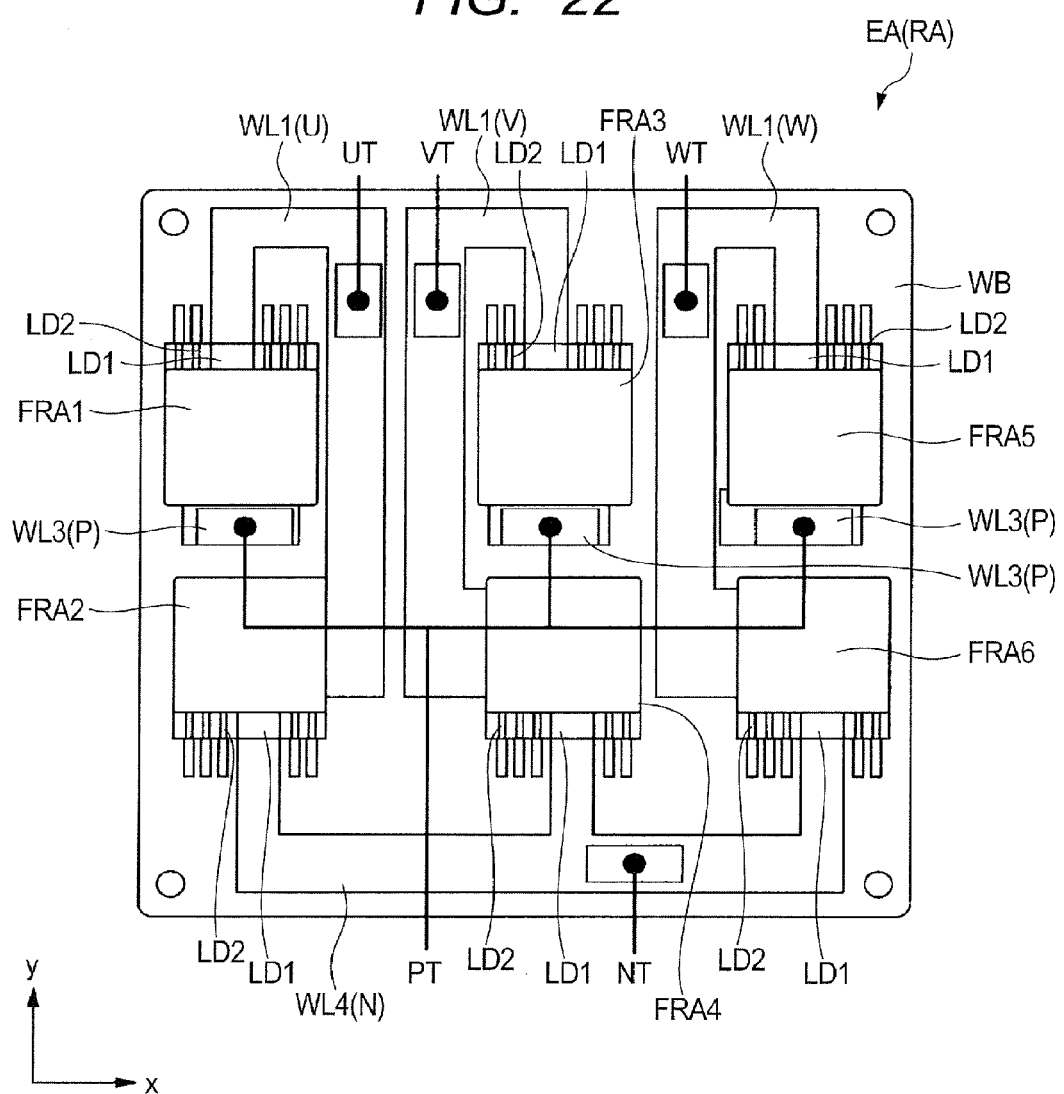
FIG. 22 is a plan view showing the configuration of an electronic device in Related Art 1.

(7) Subsequently, a description will be given to the superiority of the electronic device EA in the present First Embodiment. FIG. 22 is a plan view showing the configuration of the electronic device EA (RA) in Related Art 1. In FIG. 22, the electronic device EA (RA) in Related Art 1 has six semiconductor devices FRA1 to FRA6 over the wiring board WB. As shown in FIG. 22, the semiconductor devices FRA1, FRA3, and FRA5 are arranged in such a manner as to be arrayed in the x direction on the upper side of the y direction of the wiring board WB. The semiconductor devices FRA2, FRA4, and FRA6 are arranged in such a manner as to be arrayed in the x direction on the lower side of the y direction of the wiring board WB.

In this case, in the semiconductor devices FRA1 to FRA6 in Related Art 1, as shown in FIG. 22, the leads LD1 (emitter terminals) and the leads LD2 (signal terminals) protrude from the same side. Accordingly, in Related Art 1, the width of each lead LD1 (width in the x direction) is narrower. As a result, in Related Art 1, each width of a wire WL1 (U), a wire WL1 (V), a wire WL1 (W), and a wire WL4 (N) to be coupled with the leads LD1 is also narrower. Further, in the semiconductor devices FRA1 to FRA6 in Related Art 1, the leads LD1 (emitter terminals) and the leads LD2 (signal terminals) protrude from the same side. This also causes complication of routing of the wire WL1 (U), the wire WL1 (V), the wire WL1 (W), and the wire WL4 (N), resulting an increase in wire length.

As a result, also when the ON resistance is considered as the whole electronic device EA (RA) in Related Art 1, it can be considered that the ON resistance is increased by the points that the wire WL1 (U), the wire WL1 (V), the wire WL1 (W), and the wire WL4 (N) are reduced in width, and are increased in length.

In contrast, in the electronic device EA in the present First Embodiment, as shown in FIG. 18A, the emitter terminals ET and the signal terminals SGT are arranged at the sides opposite each other. For this reason, for example, as shown in FIG. 18A, the semiconductor devices PAC1 to PAC6 are arranged so that respective leads LD1 are opposite each other. As a result, routing of the wire WL1 (U), the wire WL1 (V), and the wire WL1 (W) is simplified, resulting in the reduction of the wire length. Further, in the present First Embodiment, the emitter terminals ET and the signal terminals SGT are arranged at the sides opposite each other. The emitter terminals ET can be arranged along the side S1. For this reason, it is also possible to increase each width of the wire WL1 (U), the wire WL1 (V), and the wire WL1 (W) to be coupled with the emitter terminals ET, respectively. As a result, in the present First Embodiment, each ON resistance of the semiconductor devices PAC1 to PAC6 themselves can also be reduced. Further, also when the ON resistance is considered as the whole electronic device EA, the routing configuration of the wire WL1 (U), the wire WL1 (V), and the wire WL1 (W) is simplified, resulting in a shorter length. In addition, each width of the wire WL1 (U), the wire WL1 (V), and the wire WL1 (W) increases. By the synergetic effect thereof, the ON resistance can be reduced. Namely, in accordance with the electronic device EA in the present First Embodiment, it is possible to improve not only the electric characteristics of individual semiconductor devices PAC1 to PAC6, but also the electric characteristics as the whole electronic device EA (seventh superiority).

(8) Then, in the electronic device EA (RA) in Related Art 1, as shown in FIG. 22, each width of the leads LD1 (emitter terminals) becomes narrow, resulting in the reduction of each width of the wire WL1 (U), the wire WL1 (V), the wire WL1 (W), and the wire WL4 (N). Accordingly, it becomes impossible to sufficiently ensure the wire width. In this case, when a large current flows through the wires, the temperature rise becomes remarkable in the narrow wire-width region. In other words, conceivably, in the narrow wire-width region, the heat generation from the semiconductor devices FRA1 to FRA6 and the heat generation from the wires themselves (copper foil) occur together, so that the temperature becomes highest. Therefore, desirably, the wire width is maximized.

In this regard, in the electronic device EA in the present First Embodiment, as shown in FIG. 18A, as compared with Related Art 1, it is possible to set larger each width of the wire WL1 (U), the wire WL1 (V), and the wire WL1 (W) to be coupled with the emitter terminal ET. This means that, even when a large current flows through the wires, the temperature rise can be relatively suppressed. As a result, in accordance with the present First Embodiment, it is possible to suppress a local temperature rise of the electronic device EA (eighth superiority).

(9) Further, as shown in FIG. 22, in the semiconductor devices FRA1 to FRA6 in Related Art 1, the leads LD1 (emitter terminals) and the leads LD2 (signal terminals) protrude from the same side. This causes the complication of routing of the wire WL1 (U), the wire WL1 (V), the wire WL1 (W), and the wire WL4 (N), resulting in an increase in wire length. For this reason, in the electronic device EA (RA) in Related Art 1, the size of the wiring board WB becomes larger.

In contrast, as shown in FIG. 18A, in the electronic device EA in the present First Embodiment, the leads LD1 (emitter terminals) and the leads LD2 (signal terminals) are arranged along the sides opposite each other. For this reason, for example, as shown in FIG. 18A, the semiconductor devices PAC1 to PAC6 are arranged so that respective leads LD1 are opposite each other. As a result, routing of the wire WL1 (U), the wire WL1 (V), and the wire WL1 (W) is simplified, resulting in the reduction of the wire length.

Further, as shown in FIG. 19A, the semiconductor devices PAC1 to PAC6 are arranged so that respective leads LD1 are opposite each other. This results in the mounting structure in which the leads LD2 are not routed over the wiring board WB, but are raised in the vertical direction (z direction) from the outer edge of the wiring board WB by coupling terminals CNT. Therefore, in the electronic device EA in the present First Embodiment, there are no complication of the wires WL2 to be signal wires, and no crossing with the wire WL1 (U), the wire WL1 (V), and the wire WL1 (W) to be power wires, and the like. From the description up to this point, in accordance with electronic device EA in the present First Embodiment, routing of the wire WL1 (U), the wire WL1 (V), and the wire WL1 (W) is simplified, resulting in the reduction of the wire length. In addition, it is not necessary to consider the complication of the wire WL2 to be a signal wire, and crossing with the wire WL1 (U), the wire WL1 (V), and the wire WL1 (W) to be power wires, and the like. Accordingly, the wire layout configuration can be simplified. In other words, in accordance with the electronic device EA in the present First Embodiment, the wire layout configuration can be simplified. As a result, the electronic device EA can be reduced in size (ninth superiority).

Superiority to Related Art 2

Figure 23:
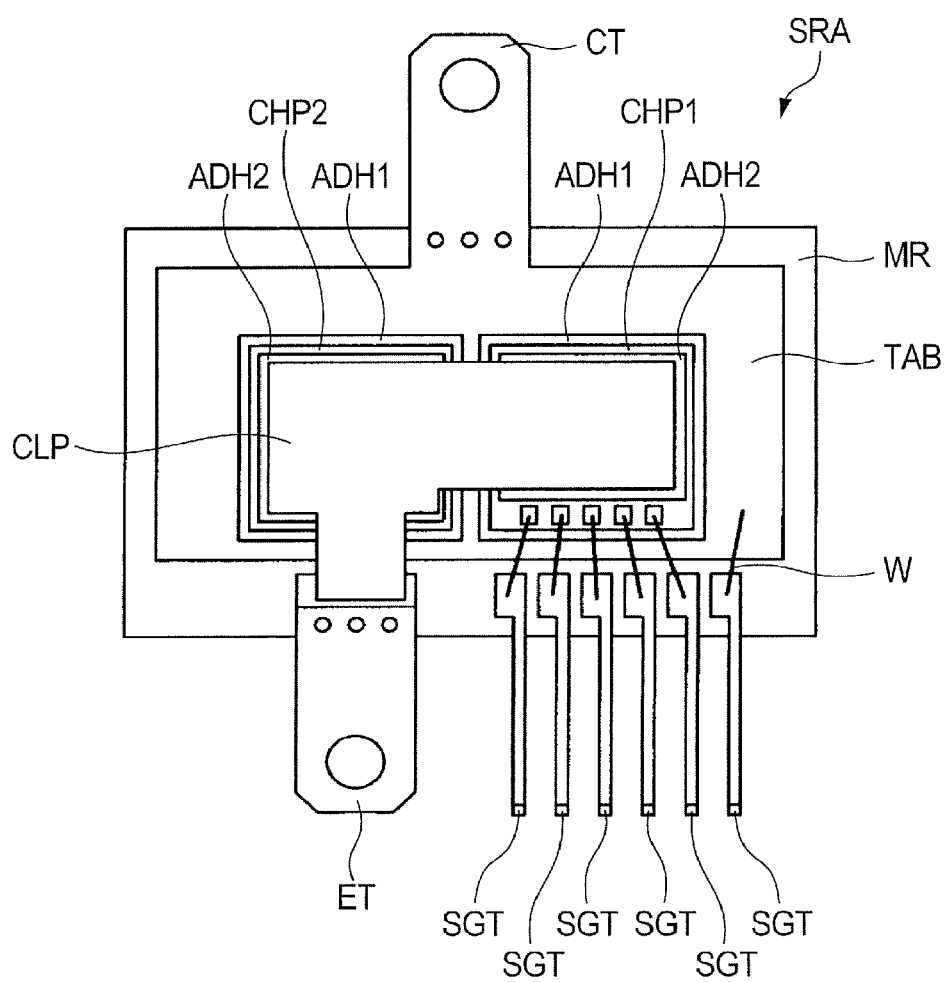
FIG. 23 is a view showing the internal configuration of a sealing body in a semiconductor device in Related Art 2.

(10) Subsequently, the superiority of the semiconductor device PAC1 in the present First Embodiment will be described in comparison with Related Art 2. FIG. 23 is a view showing the internal configuration of the sealing body MR in a semiconductor device SRA in Related Art 2.

In FIG. 23, the semiconductor device SRA in Related Art 2 has the semiconductor chip CHP1 including an IGBT formed therein and the semiconductor chip CHP2 including a diode formed therein. The semiconductor chip CHP2 including a diode formed therein is arranged in such a manner as to be closer to the emitter terminal ET. Therefore, in accordance with the Related Art 2, conceivably, the diode and the emitter terminal ET is closer to each other, and hence, the parasitic inductance of the wire coupling the emitter terminal ET and the diode can be reduced. However, as shown in FIG. 23, in Related Art 2, the emitter terminal ET and the signal terminals SGT are arranged at the same side of the sealing body MR. Thus, the width of the emitter terminal ET and the width of the clip CLP are restricted because of the necessity of ensuring the arrangement space for the signal terminals SGT. Namely, in Related Art 2, the width of the emitter terminal ET and the width of the clip CLP cannot be ensured sufficiently.

This indicates as follows: in Related Art 2, even when the diode and the emitter terminal ET are arranged in such a manner as to be closer to each other, the width of the emitter terminal ET itself is reduced; accordingly, it is not possible to effectively reduce the parasitic inductance of the wire coupling the emitter terminal ET and the diode. In other words, in order to effectively reduce the parasitic inductance of the wire coupling the emitter terminal ET and the diode, it is necessary to consider not only the arrangement relation between the emitter terminal ET and the diode but also the widths of the emitter terminal ET and the clip CLP itself. Therefore, the configuration of Related Art 2 cannot be said to be sufficient from the viewpoint of effectively reducing the parasitic inductance of the wire coupling the emitter terminal ET and the diode.

In this regard, in the semiconductor device PAC1 in the present First Embodiment, as shown in FIG. 13A, the semiconductor chip CHP2 including a diode formed therein is, arranged in such a manner as to be closer to the emitter terminals. ET. This results in the reduction of the length of the wire coupling the emitter terminal ET and the diode. As a result, it is possible to reduce the parasitic inductance of the wire. Further, in accordance with the semiconductor device PAC1 in the present First Embodiment, the width of the clip CLP can also be set larger than that of the semiconductor device FRA1 in Related Art 1. Also from this viewpoint, it is possible to reduce the parasitic inductance of the wire coupling the emitter terminal ET and the diode. Further, in accordance with the semiconductor device PAC1 in the present First. Embodiment, the emitter terminals ET and the signal terminals SGT are formed at separate sides opposite each other. The widths of the emitter terminals ET can be set larger along the side S1, and the width of the clip CLP to be electrically coupled with the emitter terminals ET can also be set larger. Namely, in the present First Embodiment, the semiconductor chip CHP2 including a diode formed therein can be arranged in such a manner as to be closer to the emitter terminals ET, and the widths of the emitter terminals ET and the clip CLP itself can also be set larger as compared with Related Art 2. Thus, in the present First Embodiment, a consideration is given not only to the arrangement relation between the emitter terminals ET and the diode, but also to the widths of the emitter terminals ET and the clip CLP itself. For this reason, it is possible to effectively reduce the parasitic inductance of the wire coupling the emitter terminal ET and the diode.

As a result, in accordance with the semiconductor device PAC1 in the present First Embodiment, a reflux current becomes more likely to flow from the emitter terminals ET to the diode. This enables the sufficient exertion of the function as the free wheel diode. In other words, in accordance with the semiconductor device PAC1 in the present First Embodiment, as compared with Related Art 2, a reflux current becomes more likely to flow to the diode formed at the semiconductor chip CHP2. For this reason, the IGBT can be effectively protected (tenth superiority).

Method for Manufacturing a Semiconductor Device in First Embodiment

Then, a method for manufacturing a semiconductor device in the present First Embodiment will be described by reference to the accompanying drawings.

1. Base Material (Lead Frame) Provision Step

Figure 24A:
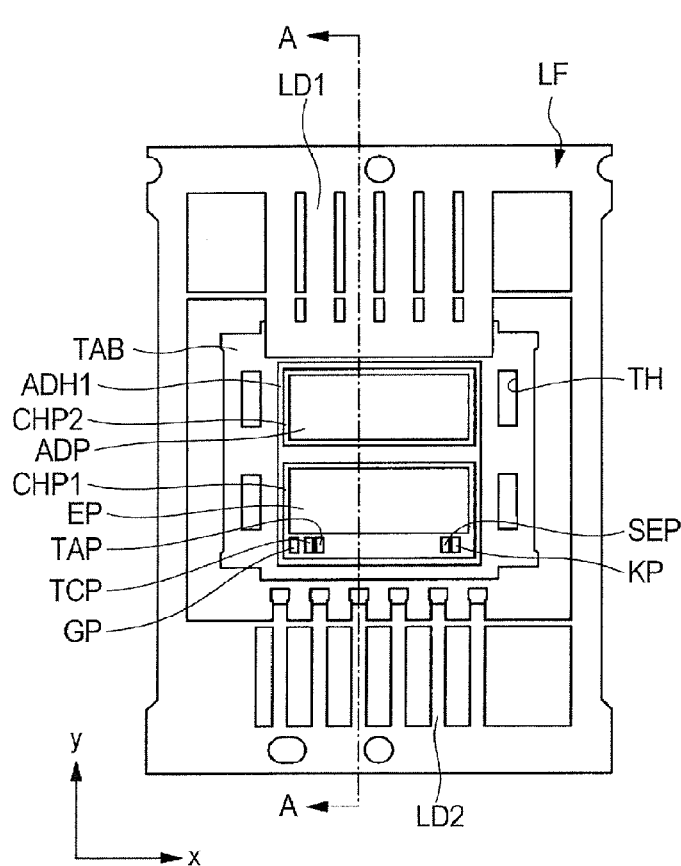
Figure 24B:
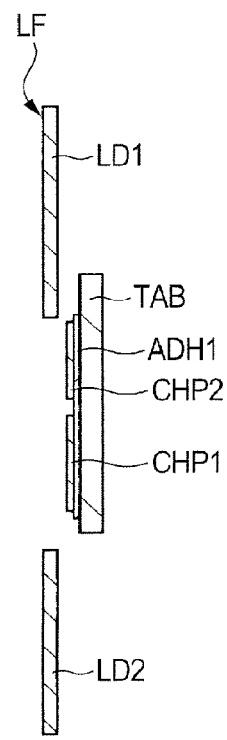

First, as shown in FIGS. 24A and 24B, a lead frame LF and a chip mounting portion TAB are provided. In the present First Embodiment, the lead frame LF and the chip mounting portion TAB are formed as separate bodies. For the lead frame LF and the chip mounting portion TAB, using, for example, a positioning jig, the positional relationship between the lead frame LF and the chip mounting portion TAB is adjusted. Herein, as shown in FIG. 24B, the thickness of the chip mounting portion TAB is larger than the thickness of the lead frame LF.

Incidentally, at the lead frame LF, there are formed a plurality of leads LD1 and a plurality of leads LD2. Further, in the chip mounting portion TAB, through holes TH are provided so as to penetrate from the second surface (back surface) to the first surface (front surface) of the chip mounting portion TAB.

2. Chip Mounting Step

Then, as shown in FIGS. 24A and 24B, over the chip mounting portion TAB, there is formed a conductive adhesive ADH1 formed of for example, a high melting point solder. Specifically, using, for example, a solder printing method, the conductive adhesive ADH1 formed of a high melting point solder is printed on the chip mounting portion TAB.

The term "high melting point solder" herein used is intended to mean a solder which is not molten even when heated to about 260° C. For example, mention may be made of Pb-rich high melting point solder including Pb (lead) having a melting point of 300° C. or more, and a reflow temperature of about 350° C. in a large amount.

Subsequently, over the chip mounting portion TAB, there are mounted the semiconductor chip CHP1 including an IGBT formed therein and the semiconductor chip CHP2 including a diode formed therein. At this step, the semiconductor chip CHP1 including an IGBT formed therein is arranged at such a position as to be closer to the leads LD2. The semiconductor chip CHP2 including a diode formed therein is arranged at such a position as to be closer to the leads LD1. In other words, in plan view, the semiconductor chip CHP2 is mounted in such a manner as to be interposed between the leads LD1 and the semiconductor chip CHP1, and the semiconductor chip CHP1 is arranged in such a manner as to be interposed between the leads LD2 and the semiconductor chip CHP2.

Herein, the semiconductor chip CHP2 including a diode formed therein is arranged so that a cathode electrode pad formed at the back surface of the semiconductor chip CHP2 is in contact with the chip mounting portion TAB via the conductive adhesive ADH1. As a result, an anode electrode pad ADP formed at the front surface of the semiconductor chip CHP2 points upward.

On the other hand, the semiconductor chip CHP1 including an IGBT formed therein is arranged so that a collector electrode pad formed at the back surface of the semiconductor chip CHP1 is in contact with the chip mounting portion TAB via the conductive adhesive ADH1. As a result, the cathode electrode pad of the semiconductor chip CHP2 and the collector electrode pad of the semiconductor chip CHP1 are electrically coupled with each other via the chip mounting portion TAB.

Further, the emitter electrode pad EP formed at the surface of the semiconductor chip CHP2, and the gate electrode pad GP, the temperature detecting electrode pad TCP, the temperature detecting electrode pad TAP, the current detecting electrode pad SEP, and the Kelvin detecting electrode pad KP which are a plurality of electrode pads point upward. Then, the semiconductor chip CHP1 including an IGBT formed therein is mounted over the chip mounting portion TAB so that the emitter electrode pad EP is arranged on the lead LD1 side, and so that a plurality of electrode pads are arranged on the lead LD2 side.

Incidentally, for the order of mounting of the semiconductor chip CHP1 including an IGBT formed therein and the semiconductor chip CHP2 including a diode formed therein, both of the following cases are acceptable: the semiconductor chip CHP1 is in front, and the semiconductor chip CHP2 is behind; and the semiconductor chip CHP2 is in front, and the semiconductor chip CHP1 is behind.

3. Electric Coupling Step

Then, as shown in FIG. 25A and FIG. 25B, over the anode electrode pad ADP of the semiconductor chip CHP2, there is formed the conductive adhesive ADH2 formed of, for example, a high melting point solder. Then, over the emitter electrode pad EP of the semiconductor chip CHP1, there is formed the conductive adhesive ADH2 formed of, for example, a high melting point solder. Further, as shown in FIGS. 25A and 25B, also over a partial region of each lead LD1, there is formed the conductive adhesive ADH2 formed of, for example, a high melting point solder.

Specifically, for example, by using a coating method, over the semiconductor chip CHP1, over the semiconductor chip CHP2, and also over a partial region of each lead LD1, there is coated the conductive adhesive ADH2 formed of, for example, high melting point solder. The conductive adhesive ADH2 formed at this step may be the same material component as, or may be a different material component from that for the conductive adhesive ADH1.

Then, as shown in FIGS. 25A and 25B, the clip CLP is mounted across over the leads LD1, over the semiconductor chip CHP2, and over the semiconductor chip CHP1.

As a result, the leads LD1, the anode electrode pad ADP formed at the semiconductor chip CHP2, and the emitter electrode pad EP formed at the semiconductor chip CHP1 are electrically coupled by the clip CLP.

Subsequently, for example, reflow is performed on the conductive adhesive ADH1 formed of a high melting point solder and the conductive adhesive ADH2 formed of a high melting point solder. Specifically, the lead frame LF including the conductive adhesive ADH1 and the conductive adhesive ADH2 is heated at a temperature of, for example, about 350° C. This can melt the conductive adhesive ADH1 formed of a high melting point solder and the conductive adhesive ADH2 formed of a high melting point solder.

Then, in order to remove the flux included in the high melting point solder, flux cleaning is carried out. Then, from the viewpoint of improving the bonding characteristic of the wire in the wire bonding step to be performed in a later step, a plasma treatment is carried out on the surface of the lead frame LF1. As a result, the surface of the lead frame LF is cleaned.

Subsequently, as shown in FIGS. 26A and 26B, the wire bonding step is carried out. For example, as shown in FIG. 26A, the lead LD2 and the gate electrode pad GP are electrically coupled by the wire W, and the lead LD2 and the temperature detecting electrode pad TCP are electrically coupled by the wire W. Further, the lead LD2 and the temperature detecting electrode pad TAP are electrically coupled by the wire W, and the lead LD2 and the current detecting electrode pad SEP are electrically coupled by the wire W. Further, the lead LD2 and the Kelvin detecting electrode pad KP are electrically coupled by the wire W. At this step, in the present First Embodiment, the leads LD2 are arranged on the opposite side to the leads LD1 coupled with the clip CLP. For this reason, the wire bonding step can be carried out without giving a consideration to the interference due to the clip CLP.

4. Sealing (Molding) Step

Then, as shown in FIGS. 27A and 27B, the semiconductor chip CHP1, the semiconductor chip CHP2, a portion of the chip mounting portion TAB, portions of the leads LD1, respective portions of a plurality of leads LD2, the clip CLP, and the wire W2 are sealed to form a sealing body MR.

At this step, the sealing body MR has a top surface, a bottom surface opposite the top surface, a first side surface situated between the top surface and the bottom surface in the thickness direction, and a second side surface opposite the first side surface. In FIG. 27A, there are shown a side S1 of the first side surface, and a side S2 of the second side surface. Further, at the sealing body MR, the leads LD1 protrude from the first side surface (side S1) of the sealing body MR, and a plurality of leads LD2 protrude from the second side surface (side S2) of the sealing body MR.

Incidentally, although not shown in FIGS. 27A and 27B, from the bottom surface of the sealing body MR, there is exposed the second surface (back surface) of the chip mounting portion TAB. Further, as shown in FIG. 25A, the plane area of the chip mounting portion TAB is larger than the total plane area of the semiconductor chip CHP1 and the semiconductor chip CHP2. In plan view, in the portion of the chip mounting portion TAB in which the semiconductor chip CHP1 and the semiconductor chip CHP2 do not overlap, there are formed through holes TH penetrating from the first surface (front surface) to the second surface (back surface). Then, a part of the sealing body MR is filled in the through hole TH. As a result, in accordance with the present First Embodiment, the anchor effect by the resin filled in the through hole TH improves the adhesion strength between the sealing body MR and the chip mounting portion TAB.

Further, in the sealing step in the present First Embodiment, a part of the chip mounting portion TAB does not protrude from the side surface of the sealing body MR. However, not limited to this, the sealing body MR can be formed so that, for example, a part of the chip mounting portion TAB protrudes from the side surface of the sealing body MR. Namely, in this case, the sealing body MR has, as shown in FIG. 27A, a third side surface (side S3) crossing with the first side surface (side S1) and the second side surface (side S2), and a fourth side surface (side S4) crossing with the first side surface and the second side surface, and opposite the third side surface. The sealing body MR may be formed so that portions of the chip mounting portion TAB protrude from the third side surface and the fourth side surface of the sealing body MR, respectively.

5. Outer Plating Step

Figure 28A:
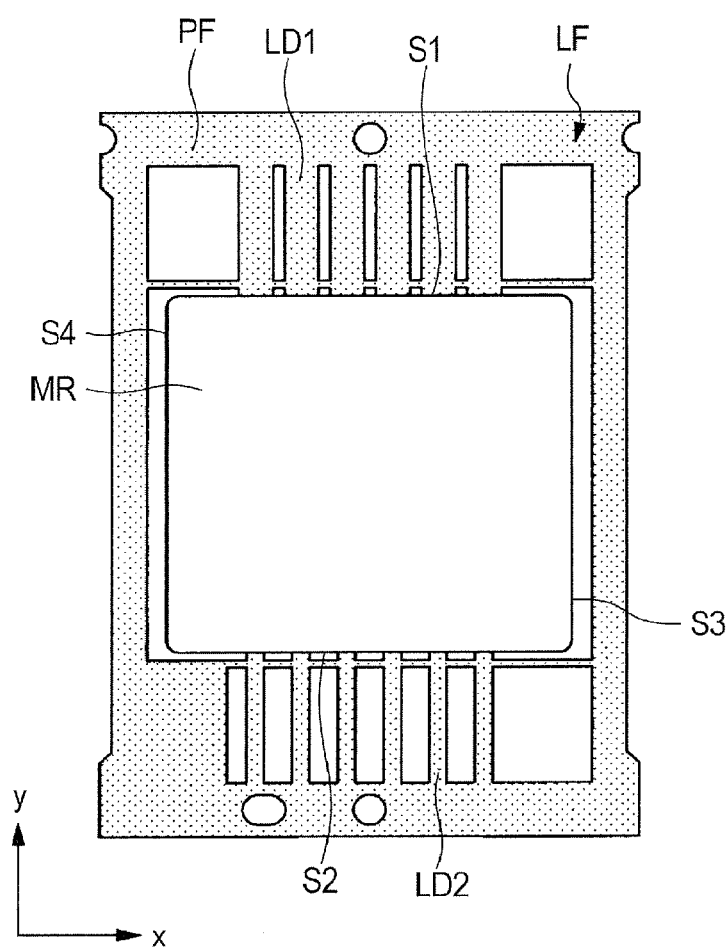
Figure 28B:
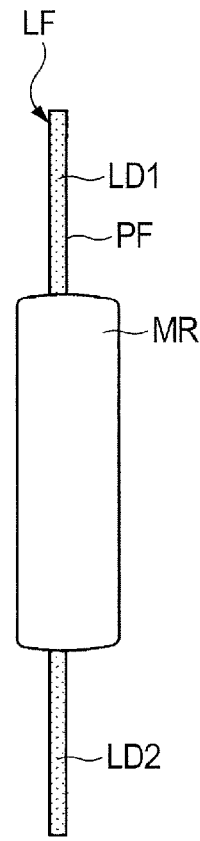

Then, as shown in FIGS. 28A and 28B, at the chip mounting portion TAB exposed from the back surface of the sealing body MR, the surface of a portion of each lead LD1, and the surface of a portion of each lead LD2, there is formed a plating layer PF (tin film) which is a conductor film. Namely, the plating layer PF is formed at the portions of the leads LD1 exposed from the sealing body MR, the portions of a plurality of leads LD exposed from the sealing body MR, and the second surface (back surface) of the chip mounting portion TAB.

6. Marking Step

Then, on the surface of the sealing body MR formed of a resin, there is formed information (mark) such as a product name or model number. Incidentally, as the mark forming method, there can be used a printing method by a print process, and a method of marking by irradiation of the surface of the sealing body with a laser.

7. Singulation Step

Subsequently, respective portions of a plurality of leads LD1 and respective portions of a plurality of leads LD2 are cut. Accordingly, a plurality of leads LD1 and a plurality of leads LD2 are separated from the lead frame LF. As a result, as shown in FIG. 29, the semiconductor device PAC1 in the present First Embodiment can be manufactured. Then, each of a plurality of leads LD1 and each of a plurality of second leads LD2 are formed. Then, for example, after carrying out the test step of testing the electric characteristics, the semiconductor devices PAC1 determined as non-defective products are shipped.

Modified Example

In the present First Embodiment, a description has been given to the example in which a high melting point solder is used as the conductive adhesive ADH1 and the conductive adhesive ADH2. However, not limited to this, for example, a silver paste including a silver filler (Ag filler) using a material such as epoxy resin as a binder may be used as the conductive adhesive ADH1 and the conductive adhesive ADH2.

Below, a method for manufacturing a semiconductor device using a silver paste as the conductive adhesive ADH1 and the conductive adhesive ADH2 will be described by reference to the accompanying drawings.

Figure 30A:
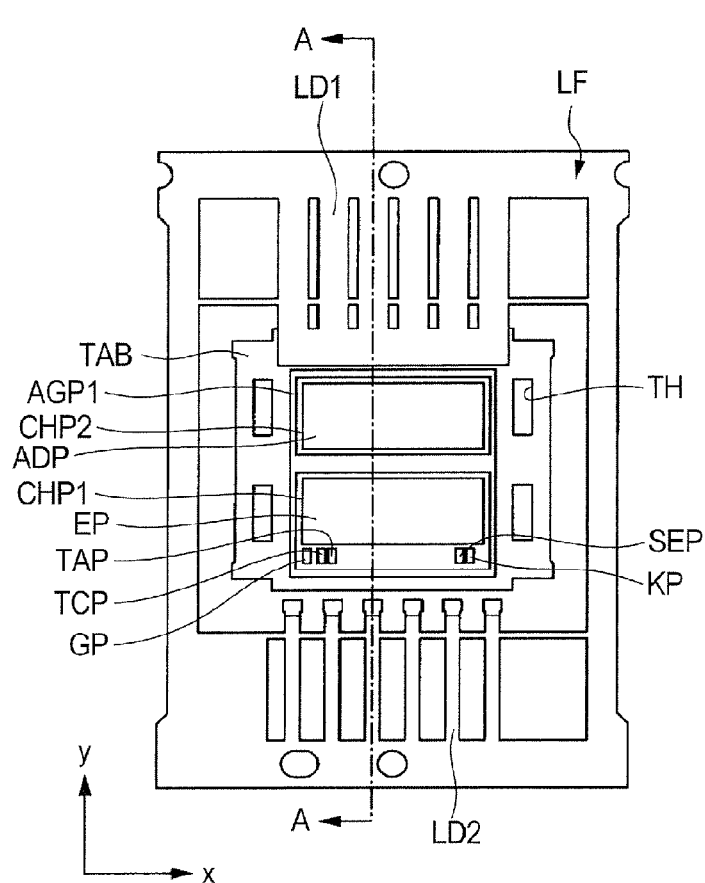
Figure 30B:
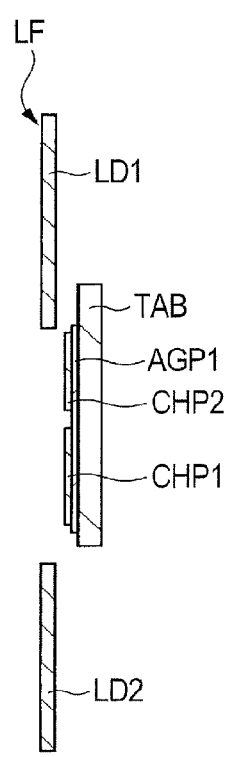

First, as with First Embodiment, the lead frame LF and the chip mounting portion TAB are provided. Then, as shown in FIGS. 30A and 30B, over the chip mounting portion TAB, for example, a silver paste AGP1 is formed. Subsequently, over the chip mounting portion TAB, there are mounted the semiconductor chip CHP1 including an IGBT formed therein and the semiconductor chip CHP2 including a diode formed therein.

Then, as shown in FIGS. 31A and 31B, over the anode electrode pad ADP of the semiconductor chip CHP2, there is formed, for example, a silver paste AGP2. Then, over the emitter electrode pad EP of the semiconductor chip CHP1, there is formed, for example, the silver paste AGP2. Further, also over a partial region of each lead LD1, there is formed, for example, the silver paste AGP2.

Then, as shown in FIGS. 31A and 31B, across over the leads LD1, over the semiconductor chip CHP2, and over the semiconductor chip CHP1, there is mounted the clip CLP. Then, the silver paste AGP1 and the silver paste AGP2 are subjected to a bake treatment.

As a result, the leads LD1, the anode electrode pad ADP formed at the semiconductor chip CHP2, and the emitter electrode pad EP formed at the semiconductor chip CHP1 are electrically coupled by the clip CLP.

The subsequent steps are the same as those of the method for manufacturing a semiconductor device in First Embodiment. In the manner described up to this point, the semiconductor device in the present Modified Example can be manufactured.

Second Embodiment

In the present Second Embodiment, a description will be given to a configuration example in which the lead frame and the chip mounting portion are mechanically fastened to each other. Namely, the present Second Embodiment has features in that the lead frame has suspending leads, and in that the chip mounting portion and the suspending leads are mechanically fastened to each other. Incidentally, the suspending leads provided at the lead frame are cut when the lead frame is cut to obtain semiconductor devices. Thus, in the semiconductor device, the remains of the suspending leads after cutting are left. In the present specification, the remains of the suspending leads after cutting left in the semiconductor device are also referred to as "suspending leads" for convenience of expression.

Figure 32:
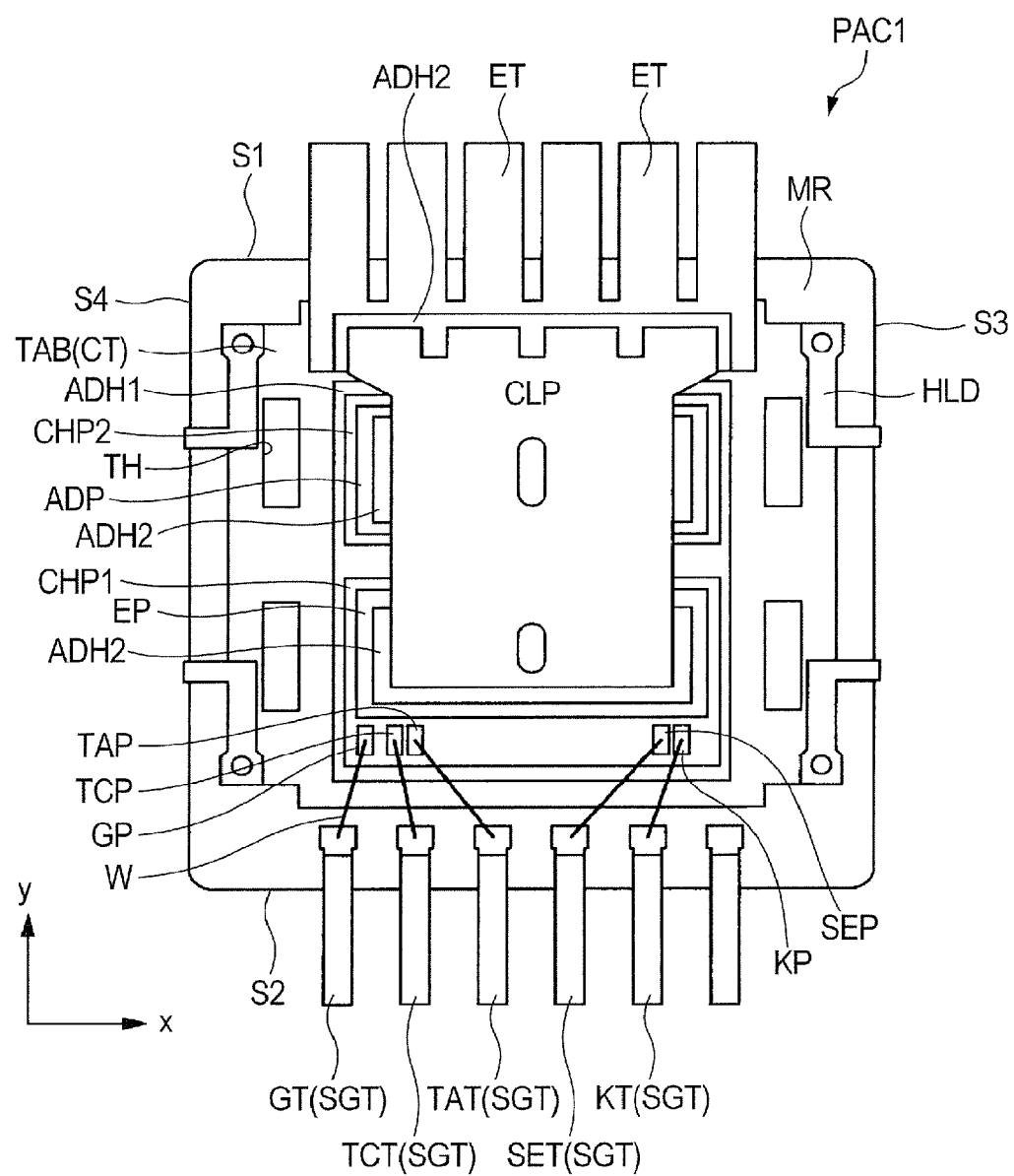
FIG. 32 is a view showing the internal configuration of a sealing body of a semiconductor device in Second Embodiment.

FIG. 32 is a view showing the internal structure of the sealing body MR of the semiconductor device PAC1 in the present Second Embodiment. The semiconductor device PAC1 in the present Second Embodiment shown in FIG. 32 has almost the same configuration as that of the semiconductor device PAC1 in the First Embodiment shown in FIG. 13A. For this reason, description will be given mainly to the different points.

As shown in FIG. 32, in the semiconductor device PAC1 in present Second Embodiment, the suspending leads HLD mechanically fastened to the chip mounting portion TAB remain in the inside of the sealing body MR. Then, the tip parts (cut parts) of the suspending leads HLD are exposed from the side surfaces of the sealing body MR.

Below, a method for manufacturing the semiconductor device PAC1 in the present Second Embodiment thus configured will be described by reference to the accompanying drawings.

1. Base Material (Lead Frame) Provision Step

Figure 33:
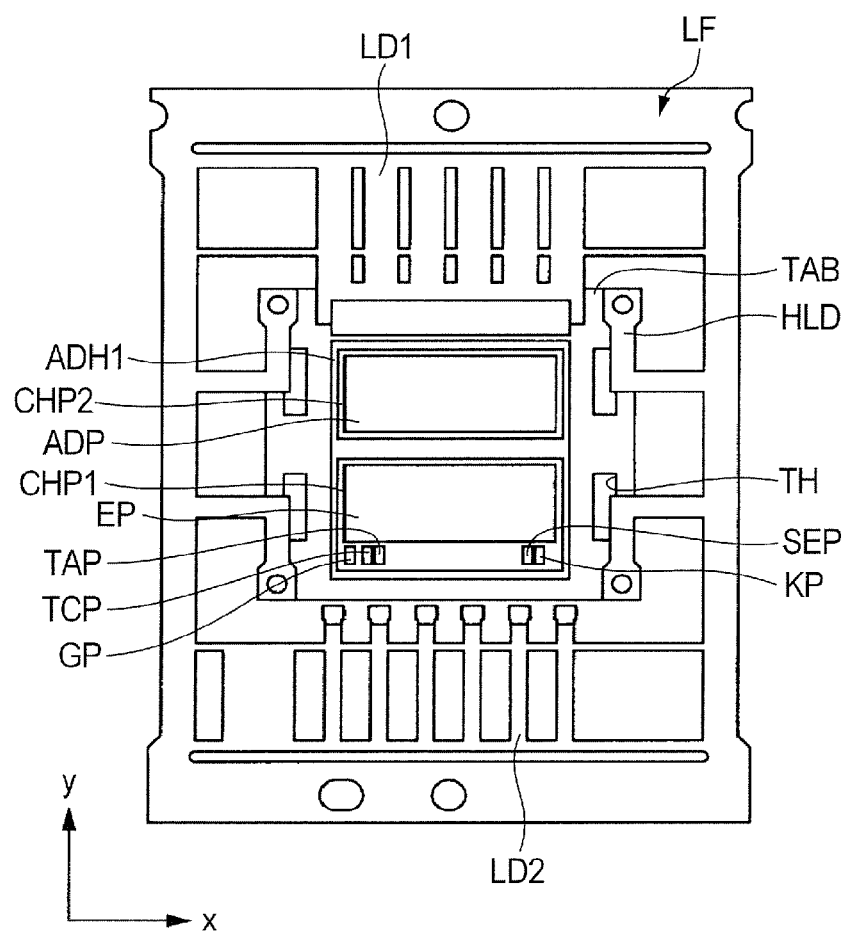
FIG. 33 is a view showing the semiconductor device during a manufacturing step in Second Embodiment.

First, as shown in FIG. 33, the lead frame LF and the chip mounting portion TAB are provided. At this step, in the present Second Embodiment, the lead frame LF and the chip mounting portion TAB are mechanically fastened by the suspending leads HLD. This eliminates the necessity of using a jig for positioning between the lead frame LF and the chip mounting portion TAB in the present Second Embodiment. This advantageously eliminates the necessity of positioning between the lead frame LF and the chip mounting portion TAB. Incidentally, although not shown, the thickness of the chip mounting portion TAB is larger than the thickness of the lead frame LF. In other words, in the present Second Embodiment, the thickness of the lead frame LF and the thickness of the chip mounting portion TAB are different from each other. Accordingly, the chip mounting portion TAB and the lead frame LF are not formed integrally, and hence are separate bodies. However, in the present Second Embodiment, the lead frame LF and the chip mounting portion TAB formed as separate bodies are mechanically fastened with each other by the suspending leads HLD. This facilitates handling thereof in a manufacturing step.

2. Chip Mounting Step

Then, as shown in FIG. 33, over the chip mounting portion TAB, there is formed a conductive adhesive ADH1 formed of, for example, a high melting point solder. Subsequently, over the chip mounting portion TAB, there are mounted the semiconductor chip CHP1 including an IGBT formed therein and the semiconductor chip CHP2 including a diode formed therein. At this step, the semiconductor chip CHP1 including an IGBT formed therein is arranged at such a position as to be closer to the leads LD2. The semiconductor chip CHP2 including a diode formed therein is arranged at such a position as to be closer to the leads LD1. In other words, in plan view, the semiconductor chip CHP2 is mounted in such a manner as to be interposed between the leads LD1 and the semiconductor chip CHP1, and the semiconductor chip CHP1 is arranged in such a manner as to be interposed between the leads LD2 and the semiconductor chip CHP2.

3. Electric Coupling Step

Figure 34:
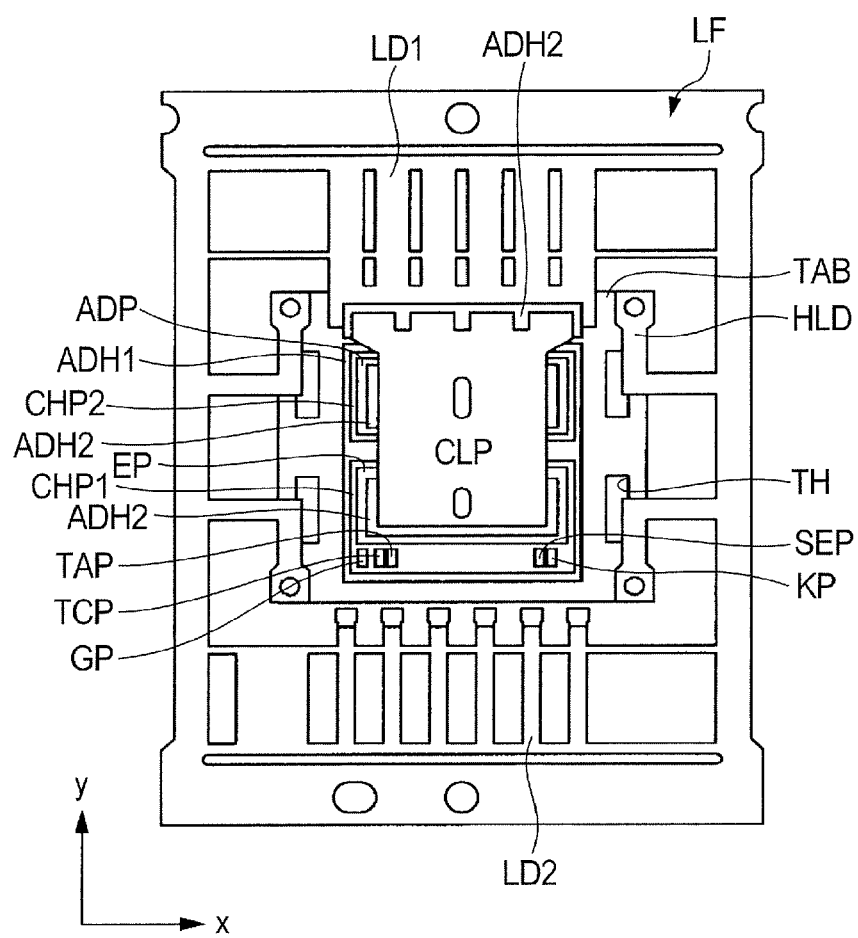
FIG. 34 is a view showing the semiconductor device during a manufacturing step following FIG. 33.

Then, as shown in FIG. 34, over the anode electrode pad ADP of the semiconductor chip CHP2, there is formed a conductive adhesive ADH2 formed of, for example, a high melting point solder. Then, over the emitter electrode pad EP of the semiconductor chip CHP1, there is formed the conductive adhesive ADH2 formed of, for example, a high melting point solder. Further, as shown in FIG. 34, also over a partial region of each lead LD1, there is formed the conductive adhesive ADH2 formed of, for example, a high melting point solder.

Then, as shown in FIG. 34, the clip CLP is mounted across over the leads LD1, over the semiconductor chip CHP2, and over the semiconductor chip CHP1.

As a result, the leads LD1, the anode electrode pad ADP formed at the semiconductor chip CHP2, and the emitter electrode pad EP formed at the semiconductor chip CHP1 are electrically coupled by the clip CLP.

Subsequently, for example, reflow is performed on the conductive adhesive ADH1 formed of a high melting point solder and the conductive adhesive ADH2 formed of a high melting point solder. Then, in order to remove the flux included in the high melting point solder, flux cleaning is carried out. Then, from the viewpoint of improving the bonding characteristic of the wire in the wire bonding step to be performed in a later step, a plasma treatment is carried out on the surface of the lead frame LF1. As a result, the surface of the lead frame LF is cleaned.

Figure 35:
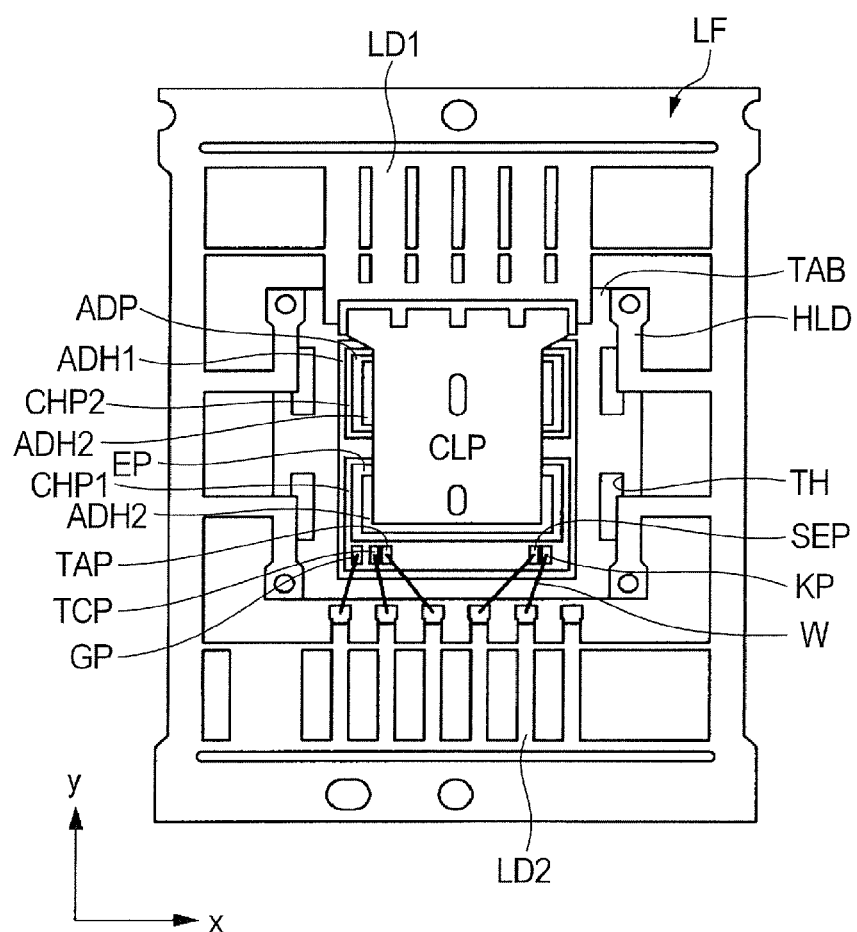
FIG. 35 is a view showing the semiconductor device during a manufacturing step following FIG. 34.

Subsequently, as shown in FIG. 35, the wire bonding step is carried out. For example, as shown in FIG. 35, the lead LD2 and the gate electrode pad GP are electrically coupled by the wire W, and the lead LD2 and the temperature detecting electrode pad TCP are electrically coupled by the wire W. Further, the lead LD2 and the temperature detecting electrode pad TAP are electrically coupled by the wire W, and the lead LD2 and the current detecting electrode pad SEP are electrically coupled by the wire W. Further, the lead LD2 and the Kelvin detecting electrode pad KP are electrically coupled by the wire W.

4. Sealing (Molding) Step

Figure 36:
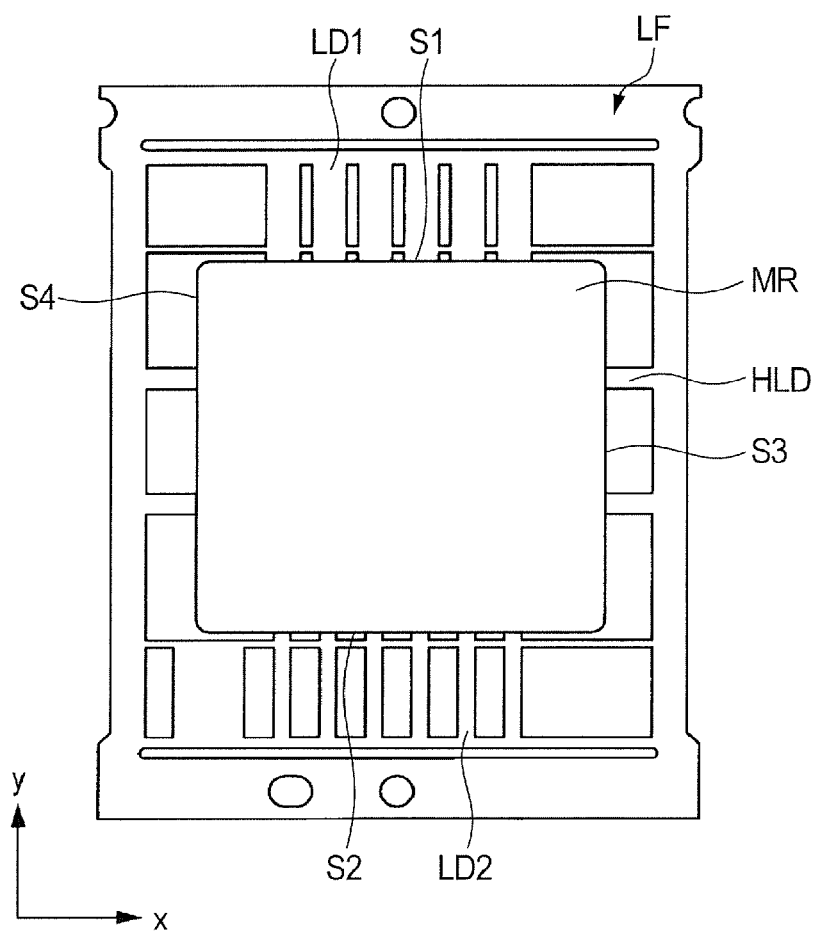
FIG. 36 is a view showing the semiconductor device during a manufacturing step following FIG. 35.

Then, as shown in FIG. 36, the semiconductor chip CHP1, the semiconductor chip CHP2, a portion of the chip mounting portion TAB, portions of the leads LD1, respective portions of a plurality of leads LD2, the clip CLP, and the wires W2 are sealed to form a sealing body MR.

5. Outer Plating Step

Figure 37:
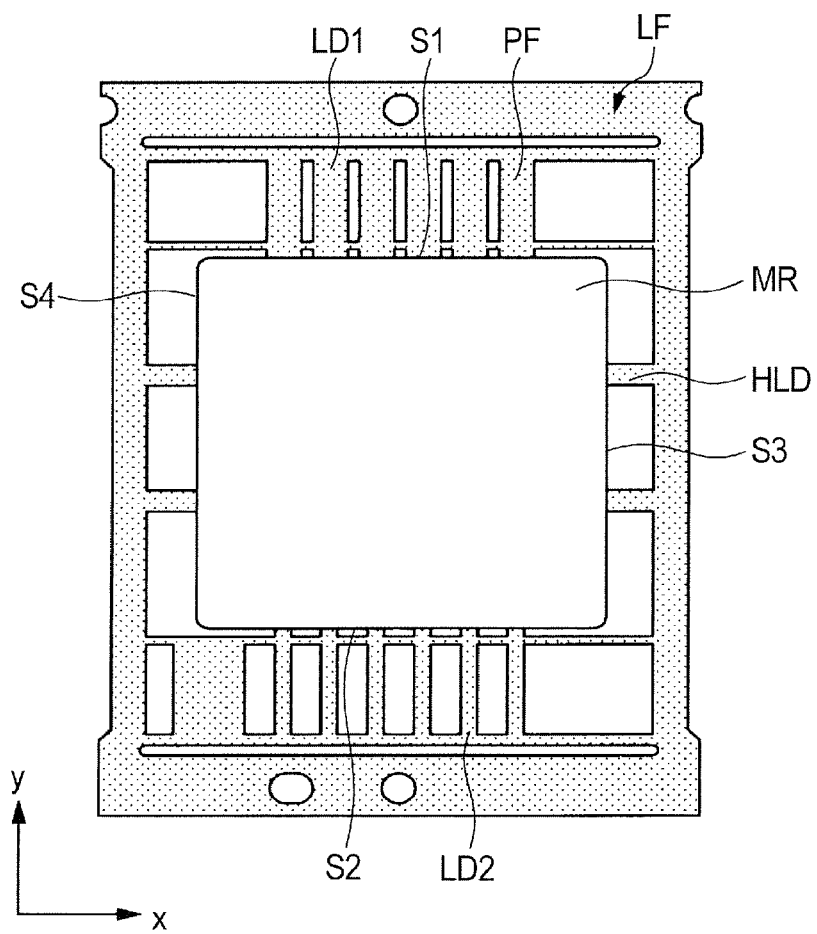
FIG. 37 is a view showing the semiconductor device during a manufacturing step following FIG. 36.

Then, as shown in FIG. 37, at the chip mounting portion TAB exposed from the back surface of the sealing body MR, the surface of a portion of each lead LD1, and the surface of a portion of each lead LD2, there is formed a plating layer PF (tin film) which is a conductor film. Namely, the plating layer PF is formed at the portions of the leads LD1 exposed from the sealing body MR, the portions of a plurality of leads LD exposed from the sealing body MR, and the second surface (back surface) of the chip mounting portion TAB.

6. Marking Step

Then, on the surface of the sealing body MR formed of a resin, there is formed information (mark) such as a product name or model number. Incidentally, as the mark forming method, there can be used a printing method by a print process, and a method of marking by irradiation of the surface of the sealing body with a laser.

7. Singulation Step

Subsequently, respective portions of a plurality of leads LD1 and respective portions of a plurality of leads LD2 are cut. Accordingly, a plurality of leads LD1 and a plurality of leads LD2 are separated from the lead frame LF. At this step, the suspending leads coupling the lead frame LF and the chip mounting portion TAB is also cut. As a result, as shown in FIG. 38, the semiconductor device PAC1 in the present Second Embodiment can be manufactured.

Figure 38:
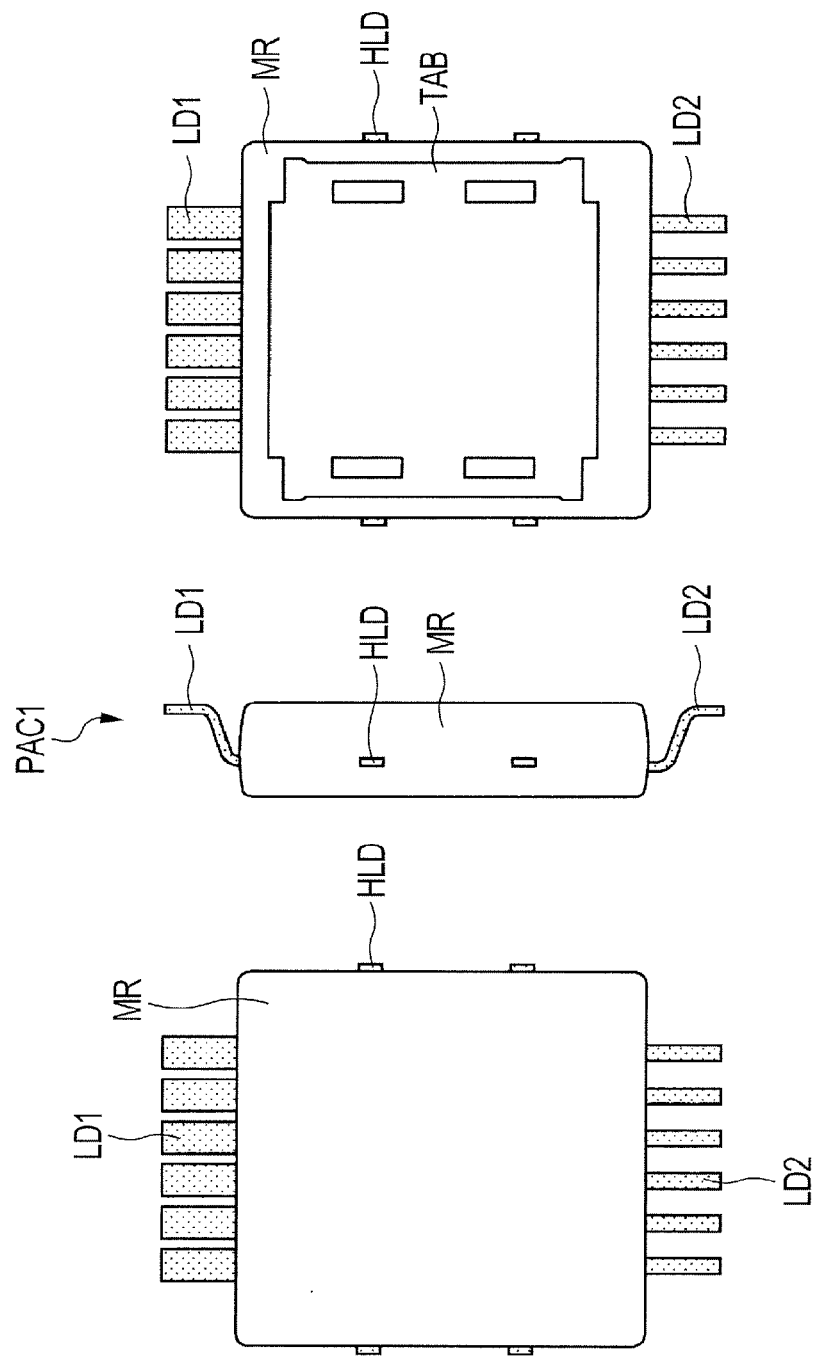
FIG. 38 is a view showing the outside configuration of the semiconductor device in Second Embodiment.

At this step, as shown in FIG. 38, the cut surfaces of the suspending leads HLD are exposed from the side surfaces of the sealing body MR. This indicates as follows: in the method for manufacturing a semiconductor device in the present Second Embodiment, the lead frame LF and the chip mounting portion TAB are fastened with each other by the suspending leads HLD. Of course, a glance at the inside of the sealing body MR indicates that, as shown in FIG. 32, the four corners of the chip mounting portion TAB bear the marks of mechanical fastening between the suspending leads HLD and the chip mounting portion TAB. Then, each of the plurality of leads LD1 and each of the plurality of second leads LD2 are formed. Then, for example, after carrying out the test step of testing the electric characteristics, the semiconductor devices PAC1 determined as non-defective products are shipped.

Up to this point, the invention completed by the present inventors was specifically described by way of embodiments thereof. However, it is naturally understood that the present invention is not limited to the embodiments, and may be variously changed within the scope not departing from the gist thereof.

The embodiments include the following forms.

(Additional Statement 1)

A method for manufacturing a semiconductor device, including the steps of:

(a) providing a lead frame including a first lead and a plurality of second leads, (b) mounting a first semiconductor chip including an insulated gate bipolar transistor, and having a first front surface including an emitter electrode pad and a gate electrode pad formed thereover, and a first back surface including a collector electrode formed thereover, and opposite the first front surface, and a second semiconductor chip including a diode, and having a second front surface including an anode electrode pad formed thereover, and a second back surface including a cathode electrode formed thereover, and opposite the second front surface over a first surface of a chip mounting portion, (c) arranging a first conductive member over the first front surface of the first semiconductor chip and the second front surface of the second semiconductor chip, (d) electrically coupling the collector electrode of the first semiconductor chip and the cathode electrode of the second semiconductor chip via the chip mounting portion, and electrically coupling the emitter electrode pad of the first semiconductor chip, the anode electrode pad of the second semiconductor chip, and the first lead via the first conductive member, (e) after the step (d), electrically coupling the gate electrode pad formed over the first front surface of the first semiconductor chip and one lead of the second leads via a second conductive member, and (f) forming a sealing body for sealing the first semiconductor chip, the second semiconductor chip, a portion of the chip mounting portion, a portion of the first lead, respective portions of the second leads, the first conductive member, and the second conductive member, wherein, in the step (b), the first semiconductor chip and the second semiconductor chip are mounted over the first surface of the chip mounting portion such that, in plan view, the second semiconductor chip is situated between the first lead and the first semiconductor chip, and such that the first semiconductor chip is situated between the second leads and the second semiconductor chip.

(Additional Statement 2)

The method for manufacturing a semiconductor device according to Additional Statement 1, wherein the step (f) is performed such that the sealing body has a top surface, a bottom surface opposite the top surface, a first side surface situated between the top surface and the bottom surface in the thickness direction, and a second side surface opposite the first side surface, and such that the first lead protrudes from the first side surface of the sealing body, and the second leads protrude from the second side surface of the sealing body.

(Additional Statement 3)

The method for manufacturing a semiconductor device according to Additional Statement 2, wherein in the step (f), the sealing body is formed such that a second surface of the chip mounting portion opposite the first surface is exposed.

(Additional Statement 4)

The method for manufacturing a semiconductor device according to Additional Statement 1, wherein in the step (b), the first semiconductor chip and the second semiconductor chip are mounted over the first surface of the chip mounting portion via a conductive adhesive, wherein in the step (c), the first conductive member is arranged over the first front surface of the first semiconductor chip and the second front surface of the second semiconductor chip via the conductive adhesive, and wherein the step, (d) is performed by heating the conductive adhesive.

(Additional Statement 5)

The method for manufacturing a semiconductor device according to Additional Statement 4, wherein the conductive adhesive is a solder.

(Additional Statement 6)

The method for manufacturing a semiconductor device according to Additional Statement 1, wherein, in cross sectional view of the sealing body, the thickness of the chip mounting portion is larger than the thickness of the first lead.

(Additional Statement 7)

The method for manufacturing a semiconductor device according to Additional Statement 6, wherein the lead frame has suspending leads, and wherein the chip mounting portion and the suspending leads are mechanically fastened with each other.

(Additional Statement 8)

The method for manufacturing a semiconductor device according to Additional Statement 1, wherein the plane area of the chip mounting portion is larger than the total plane area of the first semiconductor chip and the second semiconductor chip, wherein a through hole penetrating from the first surface through the second surface is formed in a portion of the chip mounting portion in which the first semiconductor chip and the second semiconductor chip do not overlap each other in plan view, and wherein the step (f) is performed such that a portion of the sealing body is filled in the through hole.

(Additional Statement 9)

The method for manufacturing a semiconductor device according to Additional Statement 3, wherein the sealing body has a third side surface crossing with the first side surface and the second side surface, and a fourth side surface crossing with the first side surface and the second side surface, and opposite the third side surface, and wherein the step (f) is performed such that portions of the chip mounting portion protrude from the third side surface and the fourth side surface of the sealing body, respectively.

(Additional Statement 10)

The method for manufacturing a semiconductor device according to Additional Statement 3, including the steps of:

(g) after the step (f), forming a plating layer at the portion of the first lead exposed from the sealing body, the portions the second leads exposed from the sealing body, and the second surface of the chip mounting portion, (h) after the step (g), cutting a portion of the first lead and respective portions of the second leads, and thereby separating the first lead and the second leads from the lead frame, and (i) after the step (h), forming each of the first lead and the second leads.

What is claimed is:

1. A semiconductor device, comprising:
    a first semiconductor chip including a first insulated gate bipolar transistor, and having a first front surface and a first back surface opposite to the first front surface, the first front surface including an emitter electrode pad and a gate electrode pad formed thereover, the first back surface including a collector electrode formed thereover;
    a second semiconductor chip including a diode, and having a second front surface and a second back surface opposite to the second front surface, the second front surface including an anode electrode pad formed thereover, the second back surface including a cathode electrode formed thereover;
    a chip mounting portion having a first surface over which the first semiconductor chip and the second semiconductor chip are mounted, and a second surface opposite to the first surface;
    a first lead;
    a second lead;
    a first conductive member electrically coupled with the first lead;
    a second conductive member electrically coupled with the second lead; and
    a sealing body sealing the first semiconductor chip, the second semiconductor chip, a first portion of the first lead, a first portion of the second lead, the first conductive member and the second conductive member, the sealing body having an upper surface located on the same side as the first surface of the chip mounting portion, a lower surface opposite to the upper surface, a first side surface located between the upper surface and the lower surface in a thickness direction of the sealing body, and a second side surface located between the upper surface and the lower surface in the thickness direction of the sealing body, the second side surface being opposite to the first side surface,
    wherein the first semiconductor chip is mounted over the first surface of the chip mounting portion such that the first back surface of the first semiconductor chip faces the first surface the chip mounting portion and such that the first semiconductor chip is arranged between the second semiconductor chip and the second lead in plan view,
    wherein the second semiconductor chip is mounted over the first surface of the chip mounting portion such that the second back surface of the second semiconductor chip faces the first surface the chip mounting portion and such that the second semiconductor chip is arranged between the first semiconductor chip and the first lead in plan view,
    wherein the emitter electrode pad of the first semiconductor chip and the anode electrode pad of the second semiconductor chip are electrically coupled with the first lead via the first conductive member,
    wherein the gate electrode pad of the first semiconductor chip is electrically coupled with the second lead via the second conductive member,
    wherein the collector electrode of the first semiconductor chip and the cathode electrode of the second semiconductor chip are electrically coupled with each other via the chip mounting portion,
    wherein the first lead passes through the first side surface of the sealing body such that the first portion of the first lead is embedded within the sealing body,
    wherein the second lead passes through the second side surface of the sealing body such that the first portion of the second lead is embedded within the sealing body,
    wherein the second surface of the chip mounting portion is exposed from the sealing body such that the second surface of the chip mounting portion is not located between the upper surface of the sealing body and the lower surface of the sealing body in cross-sectional view, and
    wherein the chip mounting portion is a single piece of conductive material.

2. The semiconductor device according to claim 1, wherein the second surface of the chip mounting portion is exposed from the lower surface of the sealing body.

3. The semiconductor device according to claim 2, wherein the first semiconductor chip is mounted over the first surface of the chip mounting portion such that the gate electrode pad is closer to the second lead than the emitter electrode pad in plan view.

4. The semiconductor device according to claim 3,
    wherein the first semiconductor chip has additional electrode pads formed over the first front surface,
    wherein a plurality of third leads passes through the second side surface of the sealing body such that a portion of each of the plurality of third leads is embedded within the sealing body,
    wherein the additional electrode pads are electrically coupled with the plurality of third leads via a plurality of third conductive members, respectively, and
    wherein the first semiconductor chip is mounted over the first surface of the chip mounting portion such that the additional electrode pads are closer to the plurality of third leads than the emitter electrode pad in plan view.

5. The semiconductor device according to claim 4, wherein the gate electrode pad and the additional electrode pads of the first semiconductor chip are arranged along a side of the first semiconductor chip closest to the plurality of third leads in plan view.

6. The semiconductor device according to claim 5, wherein, in plan view, the first conductive member does not overlap any of the gate electrode pad, the additional electrode pads, the second conductive member, and the plurality of third conductive members.

7. The semiconductor device according to claim 5,
wherein the first conductive member is a plate-like member including copper as a main component, and
wherein each of the second conductive member and the plurality of third conductive members is a metal wire including gold, copper, or aluminum as a main component.

8. The semiconductor device according to claim 4,
wherein a first one of the additional electrode pads is electrically coupled with a temperature detecting diode for detecting a temperature of the first semiconductor chip,
wherein a second one of the additional electrode pads is electrically coupled with a second insulated gate bipolar transistor for detecting excess current of the first insulated gate bipolar transistor, and
wherein a third one of the additional electrode pads is electrically coupled with an emitter electrode of the first insulated gate bipolar transistor.

9. The semiconductor device according to claim 2,
wherein the sealing body has:
  a third side surface located between the upper surface and the lower surface in the thickness direction of the sealing body, and located between the first side surface and the second side surface; and
  a fourth side surface located between the upper surface and the lower surface in the thickness direction of the sealing body, and located between the first side surface and the second side surface, and opposite to the third side surface, and
wherein the chip mounting portion passes through each of the third and fourth side surfaces of the sealing body.

10. The semiconductor device according to claim 2,
wherein a planar area of the chip mounting portion is larger than a total planar area of the first semiconductor chip and the second semiconductor chip,
wherein a through hole extending from the first surface to the second surface is formed in a region of the chip mounting portion that is spaced from both the first semiconductor chip and the second semiconductor chip in plan view, and
wherein a portion of the sealing body is filled in the through hole.

11. The semiconductor device according to claim 2, wherein a width of the first lead is larger than a width of the second lead.

12. The semiconductor device according to claim 2, wherein the lower surface of the chip mounting portion is a surface capable of being soldered with a wiring pattern of a wiring board when the semiconductor device is mounted over the wiring board.

13. The semiconductor device according to claim 2, further comprising a plating layer formed on the exposed second surface of the chip mounting portion.

14. The semiconductor device according to claim 2, wherein the second surface of the chip mounting portion is located at a same height as the lower surface of the sealing body in cross-sectional view.

15. The semiconductor device according to claim 14,
wherein the first lead has a second portion exposed from the sealing body, and located at a same height as the second surface of the chip mounting portion in cross-sectional view, and
wherein the second lead has a second portion exposed from the sealing body, and located at the same height as the second surface of the chip mounting portion in cross-sectional view.

16. The semiconductor device according to claim 1, wherein the second surface of the chip mounting portion is electrically coupled to both the first and second semiconductor chips via the first surface of the chip mounting portion.

* * * * *